(12) United States Patent
Hoenk

(10) Patent No.: US 9,024,344 B2
(45) Date of Patent: May 5, 2015

(54) SURFACE PASSIVATION BY QUANTUM EXCLUSION USING MULTIPLE LAYERS

(71) Applicant: Michael E. Hoenk, Valencia, CA (US)

(72) Inventor: Michael E. Hoenk, Valencia, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 13/791,671

(22) Filed: Mar. 8, 2013

(65) Prior Publication Data

US 2013/0181312 A1    Jul. 18, 2013

Related U.S. Application Data

(63) Continuation-in-part of application No. 13/160,354, filed on Jun. 14, 2011.

(60) Provisional application No. 61/355,049, filed on Jun. 15, 2010.

(51) Int. Cl.
*H01L 23/58* (2006.01)
*H01L 31/0216* (2014.01)
*H01L 31/041* (2014.01)

(52) U.S. Cl.
CPC ...... *H01L 31/0216* (2013.01); *H01L 31/02167* (2013.01); *H01L 31/041* (2013.01)

(58) Field of Classification Search
CPC ............... H01L 33/24; H01L 33/44; H01L 2924/10253; H01L 2924/3025
USPC ............ 257/98, 428, 432; 438/64, 46, 45, 47
See application file for complete search history.

(56) References Cited

U.S. PATENT DOCUMENTS

| | | | | |
|---|---|---|---|---|
| 4,811,289 A | * | 3/1989 | Sadjian | 365/119 |
| 7,160,748 B2 | * | 1/2007 | Ishibashi et al. | 438/45 |
| 8,395,243 B2 | * | 3/2013 | Hoenk | 257/629 |
| 2011/0101482 A1 | * | 5/2011 | Meynants | 257/432 |
| 2011/0304022 A1 | * | 12/2011 | Hoenk | 257/618 |
| 2014/0054661 A1 | * | 2/2014 | Yu et al. | 257/290 |

* cited by examiner

*Primary Examiner* — Zandra Smith
*Assistant Examiner* — Jaehwan Oh
(74) *Attorney, Agent, or Firm* — Milstein Zhang & Wu LLC; Joseph B. Milstein

(57) ABSTRACT

A semiconductor device has a multilayer doping to provide improved passivation by quantum exclusion. The multilayer doping includes at least two doped layers fabricated using MBE methods. The dopant sheet densities in the doped layers need not be the same, but in principle can be selected to be the same sheet densities or to be different sheet densities. The electrically active dopant sheet densities are quite high, reaching more than $1\times10^{14}$ cm$^{-2}$, and locally exceeding $10^{22}$ per cubic centimeter. It has been found that silicon detector devices that have two or more such dopant layers exhibit improved resistance to degradation by UV radiation, at least at wavelengths of 193 nm, as compared to conventional silicon p-on-n devices.

15 Claims, 38 Drawing Sheets

(Arp, et al., 2005)

SURFACE PASSIVATION BY QUANTUM EXCLUSION USING MULTIPLE LAYERS

CROSS-REFERENCE TO RELATED APPLICATIONS

This application is a continuation-in-part of U.S. patent application Ser. No. 13/160,354 filed Jun. 15, 2011, now U.S. Pat. No. 8,395,243, which application itself claimed priority to and the benefit of then U.S. provisional patent application Ser. No. 61/355,049, filed Jun. 15, 2010, each of which applications is incorporated herein by reference in its entirety. This application is also related to U.S. patent application Ser. No. 12/965,790, filed Dec. 12, 2010, which is assigned to the same assignee as the present application.

STATEMENT REGARDING FEDERALLY FUNDED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The invention relates to semiconductor devices in general and particularly to silicon devices that rely on surface passivation for their operation.

BACKGROUND OF THE INVENTION

Statement of the Problem

Surface Passivation, Quantum Efficiency, and Stability of Back-illuminated Imaging Detectors Surfaces and interfaces have long been known to be critical to the performance of virtually all solid-state devices, and imaging devices in particular. Surface passivation technologies were critical to both the invention of the transistor and to the development of reliable processes for planar integrated circuits, which launched the semiconductor revolution. The revolution in solid-state imaging devices began in 1969, with the invention of charge-coupled devices (CCDs). Surfaces and interfaces posed problems from the beginning, and many of the later improvements in CCD design were directed toward achieving control over the quality of interfaces near the device's front surface. Texas Instruments demonstrated the first back-illuminated CCDs as early as 1974.

NASA quickly realized the potential for solid-state imaging devices for astronomical imaging in space, and began developing CCDs and cameras for space instruments, including the Hubble Space Telescope. The Jet Propulsion Laboratory (JPL) played a key role in this development. JPL was responsible for developing the Wide Field/Planetary Camera (WF/PC), an important instrument for the Hubble Space Telescope (HST) which would later produce the iconic images associated with NASA and the HST. One of the most important science requirements for WF/PC detectors was the achievement of high quantum efficiency (QE) over a wide spectral range with photometric stability better than 1%. In particular, the HST detectors were required to detect UV light down to the Lyman-α line of atomic hydrogen, situated in the far ultraviolet region of the spectrum, at a wavelength of 121.6 nm. As evidenced by the history of WF/PC II, between quantum efficiency and stability, stability is the more important detector performance specification.

In order to meet these requirements, back illumination was considered essential, because absorption in the front-surface gate electronics of CCDs rendered conventional, front-illuminated CCDs virtually blind in the ultraviolet. Unfortunately, back illumination led to instabilities in the response, as the substrate removal process necessary to expose the light-sensitive volume of the detector was found to create an unstable back surface of the CCD. Because of the low doping levels and high density of unpassivated defects in the surface, changes in the environment affected the response of thinned detectors. In particular, the back surface potential at the $Si$—$SiO_2$ interface, which is critical for high efficiency collection of photogenerated charge, depends on both the physical environment and the illumination history of the device. Early efforts to control the back surface potential were based on optimizing the thinning process to leave a thin p+ layer on the back surface of the CCD. This approach proved inadequate, as poor uniformity of thinning, low surface dopant concentrations, and lack of control over the dopant profile presented insurmountable barriers to achieving the required stability. This problem came to a head when the WF/PC instrument was undergoing thermal-vacuum testing in advance of the originally planned December 1984 launch date. The WF/PC detectors exhibited quantum efficiency hysteresis (QEH) over an order of magnitude worse than the 1% stability specification set by HST's science requirements. To better address this problem for HST and future instruments, JPL began a concerted effort to solve the back-surface passivation problem, which would encompass the development of a UV-flood process, the deposition of high work function metals to act as Schottky barriers, and the use of a biased back-surface contact. While none of these approaches succeeded in time for WF/PC (launched in 1990) and WF/PC II (launched in 1992), these technologies evolved into the modern state-of-the-art technologies of chemisorption passivation (Lesser et al.) and shallow ion-implantation followed by a laser anneal. Nevertheless, even in their modern incarnations, state-of-the-art surface passivation technologies have not solved all of the problems raised by HST detector development in the 1980's.

A discussion of some of the prior art methods is given hereinbelow. In particular, one of the best methods of passivating surfaces in silicon devices known in the prior art is referred to as delta doping.

Known in the prior art is Hoenk et al., U.S. Pat. No. 5,376,810, issued Dec. 27, 1994, which is said to disclose a backside surface potential well of a backside-illuminated CCD that is confined to within about half a nanometer of the surface by using molecular beam epitaxy (MBE) to grow a delta-doped silicon layer on the back surface. Delta-doping in an MBE process is achieved by temporarily interrupting the evaporated silicon source during MBE growth without interrupting the evaporated p+ dopant source (e.g., boron). This produces an extremely sharp dopant profile in which the dopant is confined to only a few atomic layers, creating an electric field high enough to confine the backside surface potential well to within half a nanometer of the surface. Because the probability of UV-generated electrons being trapped by such a narrow potential well is low, the internal quantum efficiency of the CCD is nearly 100% throughout the UV wavelength range. Furthermore, the quantum efficiency is quite stable.

Also known in the prior art is Cunningham et al., U.S. Pat. No. 6,107,619, issued Aug. 22, 2000, and Cunningham et al., U.S. Pat. No. 6,346,700, issued Feb. 12, 2002, both of which are said to disclose a delta-doped hybrid advanced detector (HAD) is provided which combines at least four types of technologies to create a detector for energetic particles ranging in energy from hundreds of electron volts (eV) to beyond several million eV. The detector is sensitive to photons from visible light to X-rays. The detector is highly energy-sensitive from approximately 10 keV down to hundreds of eV. The detector operates with milliwatt power dissipation, and allows non-sequential readout of the array, enabling various advanced readout schemes.

Also known in the prior art is Nikzad et al., U.S. Pat. No. 7,786,421, issued Aug. 31, 2010, which is said to disclose a system and method for making solid-state curved focal plane arrays from standard and high-purity devices that may be matched to a given optical system. There are two ways to make a curved focal plane arrays starting with the fully fabricated device. One way, is to thin the device and conform it to a curvature. A second way is to back-illuminate a thick device without making a thinned membrane. The thick device is a special class of devices; for example devices fabricated with high purity silicon. One surface of the device (the non VLSI fabricated surface, also referred to as the back surface) can be polished to form a curved surface.

Also known in the prior art is Blacksberg et al., U.S. Pat. No. 7,800,040, issued Sep. 21, 2010, which is said to disclose a method for growing a back surface contact on an imaging detector used in conjunction with back illumination. In operation, an imaging detector is provided. Additionally, a back surface contact (e.g. a delta-doped layer, etc.) is grown on the imaging detector utilizing a process that is performed at a temperature less than 450 degrees Celsius.

There is a need for systems and methods that provide improved passivation of semiconductor devices.

SUMMARY OF THE INVENTION

According to one aspect, the invention features a silicon device. The silicon device comprises a silicon wafer bounded by a first surface and a second surface opposite the first surface, the silicon wafer having a device fabricated on one of the first surface and the second surface; the silicon wafer having a doping profile situated adjacent at least one of the first surface and the second surface, the doping profile having at least two doped layers, each of the at least two doped layers having a thickness of less than 4 nm, each of the at least two doped layers having an electrically active dopant sheet density at least $10^{14}$ cm$^{-2}$; the silicon wafer having at least one of the first surface and the second surface electronically passivated irrespective of a density of defects present on the respective one of the first surface and the second surface.

In a preferred embodiment, the electronically passivated surface is configured to exhibit less degradation as a result of exposure to electromagnetic radiation having a wavelength shorter than visible electromagnetic radiation than is exhibited as a result of exposure to the same electromagnetic radiation on an equivalent device provided in a wafer lacking the doping profile having at least two doped layers.

In one embodiment, the electromagnetic radiation having a wavelength shorter than visible electromagnetic radiation has a wavelength of 263 nm.

In another embodiment, the electromagnetic radiation having a wavelength shorter than visible electromagnetic radiation has a wavelength of less than 263 nm.

In one embodiment, the electromagnetic radiation having a wavelength shorter than visible electromagnetic radiation has a wavelength of 193 nm.

In another embodiment, the electromagnetic radiation having a wavelength shorter than visible electromagnetic radiation has a wavelength of less than 193 nm.

In yet another embodiment, at least one of the at least two doped layers has a thickness of less than 1 nm.

In still another embodiment, the at least two doped layers comprise four doped layers.

In a further embodiment, successive ones of the four doped layers are spaced apart by equal thicknesses.

In a further embodiment, successive ones of the four doped layers are spaced apart by unequal thicknesses.

In an additional embodiment, a dopant gradient of at least one decade per nm exists between one of the at least two doped layers and an adjacent layer of silicon.

In another embodiment, the at least two doped layers are configured to have higher surface conductivity than an equivalent device provided in a wafer lacking the doping profile having at least two doped layers.

In yet another embodiment, the silicon device further comprises a chemical passivation layer situated on the surface having the doping profile adjacent thereto, the chemical passivation layer configured to prevent degradation of at least one of the at least two doped layers of the doping profile.

In still another embodiment, the chemical passivation layer comprises an $Al_2O_3$ layer.

In a further embodiment, the silicon device further comprises an antireflection coating.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

Prior Art Surface Passivation Technologies
Chemisorption Charging

Figure 1:
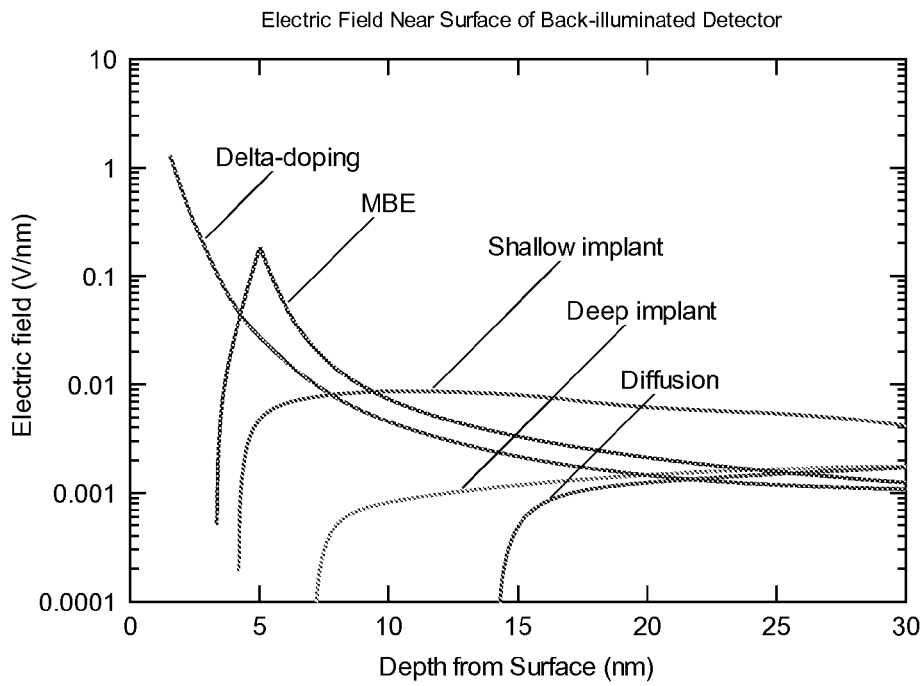
FIG. 1 is a diagram that illustrates calculated electric fields comparing delta-doped surfaces to other methods of surface doping in the prior art.

The principle behind chemisorption charging is to form a charged passivation layer on the silicon surface, in order to induce an electric field within the silicon. Chemisorption passivation represents one approach to surface charging that is known in the art. Chemisorption passivation in its modern form evolved from early efforts at JPL to use high work function metals to form a Schottky barrier on the back surface of thinned CCDs. A Schottky barrier exists due to charge transfer across an interface between dissimilar materials, such that electrons are transferred from the material with the lower work function to material with the higher work function. The rationale behind using Platinum to form the Schottky barrier was that the Platinum would acquire a negative charge relative to the silicon, thus creating a near surface electric field of the right polarity to drive photogenerated electrons away from the interface and toward the front-surface detector electronics. As shown in FIG. 1, the creation of such an electric field is a general requirement that applies to all of the various surface passivation technologies for imaging detectors. In the course of JPL's development of sensors for WF/PC II, it was discovered that the back surface charging mechanism responsible for improving the detector quantum efficiency with the Pt "flash gate" technology was not (as originally intended and expected) the formation of a Schottky barrier at the surface, but instead involved the accumulation of negatively charged O$_2^-$ ions on the oxide surface through a process of chemisorption. Thus a similar charging mechanism underlay both the earlier UV flood process and the Pt "flash gate"; unfortunately, neither of these processes provided adequate stability, nor did subsequent improvements and refinements successfully resolve the surface passivation problem. A key part of the difficulty lay with the oxide. The stability of chemisorbed charge was found to be critically dependent on the quality and thickness of the oxide. The formation of a high quality thermal oxide required temperatures that exceeded the tolerance of imaging detectors, so a low temperature "flash oxide" process was developed based on exposing the surface to steam at moderate temperatures. Unfortunately, the "flash oxide" failed to stabilize the device, as changing environmental conditions (especially with respect to exposure to hydrogen) could reverse the polarity of the chemisorbed charge with a catastrophic effect on detector quantum efficiency and spectral response. As a result of these limitations, development of the Pt "flash gate" was abandoned, and was not used in detectors flown on WF/PC II.

Subsequent development efforts at the University of Arizona led to several innovations and refinements of the chemisorption process, including the use of thicker, higher quality oxide layers, switching to metals that aren't sensitive to poisoning by hydrogen exposure, and coating the metal layer with thermally deposited HfO$_2$ dielectric layer to stabilize the chemisorbed charge against environmental variations. Chemisorption devices have been used in both ground and space-based observatories. Despite these advances, surface passivation by chemisorption charging is limited to visible and near ultraviolet wavelengths by absorption in the dielectric layers required to hold and stabilize chemisorbed charge. Chemisorption charging is also subject to irreversible damage by ionizing radiation. In particular, chemisorption charging is unstable with respect to the ionizing effects of deep ultraviolet light, which is well known to liberate H+ ions and create traps in SiO$_2$ and other dielectric layers used as insulating layers in the semiconductor industry. Finally, the conductivity of chemisorption-charged surfaces is limited by the surface density of chemisorbed charge (with a maximum density$\approx 10^{13}$ cm$^{-2}$), less the densities of charge occupying traps in the oxide and its interface with silicon. Thus the conductivity of chemisorption-charged surfaces is significantly lower than the conductivities that can be achieved by surface doping methods. The requirement for a conductive back surface has been found to be important in applications requiring fully-depleted imaging devices, and surface conductivity is important to the suppression of noise and imaging artifacts in applications that require exposure to high intensity light sources, such as deep ultraviolet lasers.

In summary, chemisorption-charging is capable of surface passivation of semiconductor devices, enabling high quantum efficiency in back illuminated detectors; however, the conductivity of chemisorption-passivated surfaces is relatively low, and chemisorption-passivation is also sensitive to charge trapped in damage-induced oxide and interface traps.

Ion Implantation and Laser Anneal

Figure 2:
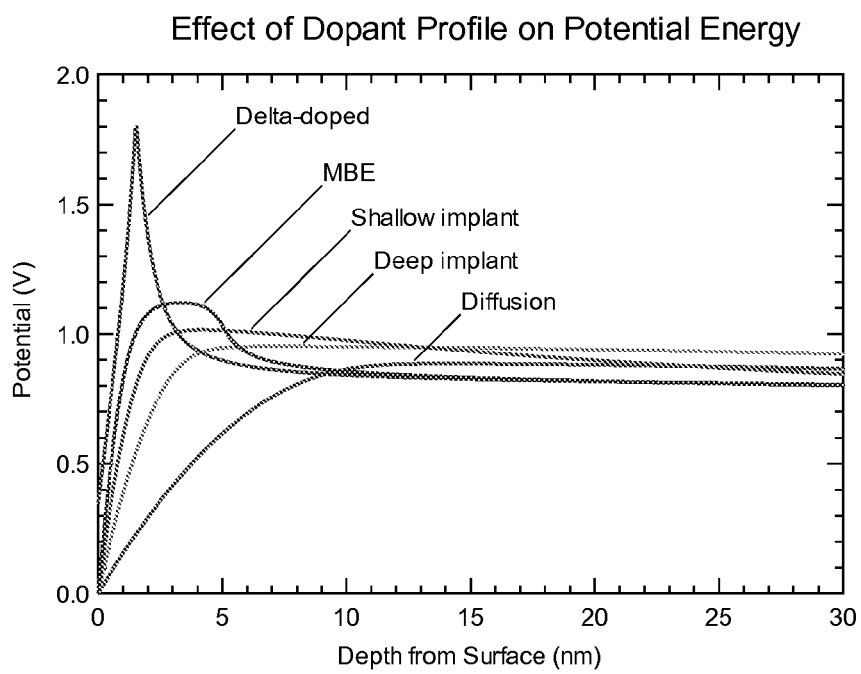
FIG. 2 is a diagram that illustrates calculated near surface conduction bands (i.e., electronic potentials), comparing delta-doped surfaces to other methods of surface doping in the prior art.

Surface doping is another approach to surface passivation that is known in the art. Surface doping also produces an electric field internal to the silicon, but unlike chemisorption, the electric field does not extend all the way to the surface (see FIG. 1). As shown in FIG. 2, surface doping methods necessarily produce a back surface potential well, in which minority carriers may be trapped and lost due to recombination. The most commonly used methods of surface doping in the prior art are diffusion and implantation. Ion implantation is a standard process used in the semiconductor industry to selectively dope semiconductor surfaces for device applications. The ion implantation process is based on directing energetic dopant atoms toward a semiconductor surface in order to introduce a desired dose of dopant atoms into the crystal lattice. Most of the implanted atoms are not located on electrically active lattice sites of the crystal, and the implantation process creates a high density of defects that degrade the quality of the semiconductor. Implantation therefore requires a high temperature thermal annealing process in order to repair many of the crystal defects and electrically "activate" the implanted atoms by allowing a fraction of the atoms to move from interstitial sites into crystal lattice sites. However, the annealing temperature required for dopant activation is incompatible with the thermal constraints of device processing (note that there are isolated exceptions, in which refractory metals are used in the front-surface electronics in order to enable high-temperature furnace anneals of ion-implanted layers; however, refractory metals require specialized processes and impose constraints on metal conductivity that are not compatible with all imaging device technologies and applications). Therefore, in order to adapt ion implantation to the requirements and constraints of imaging detectors, several specialized process modifications are important. First, very low energy implantation is desired in order to create shallow dopant profiles suitable for detection into the UV range. Second, a laser annealing process is used to activate the dopant atoms while avoiding thermal damage to the detector. This process is based on raster-illumination of the surface with pulsed lasers, such that the near-surface region is selectively heated. In some applications, the laser anneal process melts the surface. Third, detectors are sensitive to variations in surface doping, so that ion implantation and laser annealing processes applied to back-illuminated imaging detectors require optimization to achieve uniform quantum efficiency over the entire detector surface. This is particularly challenging for laser annealing, which tends to create "brick wall" artifacts in imaging detectors. This optimization often requires additional processing steps after ion implantation and anneal, including etching the surface to optimize the near-surface dopant profile, growing a low-defect density oxide, and using a hydrogen annealing process to passivate interface traps.

Ion implantation provides higher dopant concentrations and more control over the incorporated dopant profile than the diffusion-related profiles that were originally used in the optimal thinning process for WF/PC detectors. However, this is only a relative advantage, as the physics of ion implantation and the necessity of maintaining process compatibility with imaging detectors provide only limited flexibility in designing the shape, depth, peak position, amplitude, and uniformity of the dopant profile. These constraints in turn place limits on the ability to use ion implantation for optimization of detector performance, especially with regard to UV quantum efficiency, defect-related dark current generation, and "deep depletion" for improved spatial resolution. In particular, ion implantation cannot create abrupt dopant profiles, which are extremely important for surface passivation.

FIG. 1 and FIG. 2 illustrate this inability to provide abrupt dopant profiles, as the electric fields and surface potential barriers formed by ion implantation are significantly weaker than other forms of surface doping, such as MBE growth. The inability of ion implantation/anneal processes to create abrupt dopant profiles is a limitation that extends beyond the field of imaging detector technologies. Achieving abrupt dopant profiles is one of the major challenges faced by the semiconductor industry in its ongoing efforts to fabricate integrated circuits with higher densities. The goal of creating sharper ion-implanted dopant profiles is the subject of an extensive literature in semiconductor processing journals. One of the limitations lies with broadening of implanted dopant distributions during the annealing process. The phenomenon of transient enhanced diffusion (TED) refers to the anomalously high diffusion rates observed during the annealing of implanted dopant distributions. The observed high rates of diffusion are related to defects inevitably created by the implantation process.

Despite these limitations, ion-implanted imaging devices are currently being used in a wide variety of imaging applications, including scientific imaging detectors deployed in space. State-of-the-art ion-implanted devices are at the heart of the Wide-Field Camera 3 (WFC3) instrument, which recently replaced the Wide Field/Planetary Camera 2 instrument on the Hubble Space Telescope. However, despite significant advances in the two decades following the development of WF/PC 2 detectors, the state-of-the-art ion-implanted devices in WFC3 still exhibit quantum efficiency hysteresis (QEH) that is outside the HST specifications. Based on extensive characterization of these devices, the observed QEH appears to be related to charge traps in the silicon, which are probably an artifact inherent in the ion implantation/anneal process used for back surface passivation. The temporary solution that is currently in use for WFC3 is a periodic exposure of the device to intense light, in order to fill these traps; maintaining the detector at a low operating temperature stabilizes the trapped charge sufficiently to collect scientific data. This solution is limited to imaging applications in which the detector is cooled to cryogenic temperatures, which is impractical for many commercial applications, nor does this solution provide adequate stability for detectors illuminated by UV lasers.

Delta Doping

At the same time that detector development for WF/PC 2 was underway, JPL scientists began developing a unique surface passivation technology based on the epitaxial growth of highly-doped silicon. Whereas conventional crystal growth technologies require temperatures that exceed the tolerance of CCDs, JPL had conducted pioneering work in the 1980's on a low temperature molecular beam epitaxy process that could achieve epitaxial growth of silicon at CCD-compatible temperatures (below 450° C.). These efforts led to the development and demonstration of delta-doped CCDs in 1992, in which low temperature MBE growth was used to form an ultrathin, delta-doped silicon layer on a fully-functional, thinned CCD.

The delta-doping process derives its name from a dopant profile that resembles the mathematical delta function. Delta-doping achieves an exceptionally abrupt dopant profile by interrupting the flux of silicon atoms, depositing dopant atoms at a density of about one third of a monolayer (approximately $2 \times 10^{14}$ dopant atoms/cm$^2$), and encapsulating the dopant atoms by growing a 1-2 nm silicon "cap" layer. Because the dopants are incorporated in a growth process, MBE-grown layers do not suffer from the defects created by lattice damage during ion implantation, nor do they require a high temperature annealing process that would limit the ability to generate abrupt dopant profiles. The process of interrupting and then restarting the silicon flux during growth concentrates the dopant atoms in a layer that is only a few atomic layers thick, which can be precisely located within a few atomic layers of the surface. This precision is the ultimate in abrupt doping profiles and cannot be achieved by ion implantation or any other conventional doping process (e.g., ion implantation and diffusion).

Delta-doping achieves nearly 100% internal quantum efficiency through the far and extreme ultraviolet spectral range, with no apparent degradation in performance from exposure to ionizing radiation, no measurable quantum efficiency hysteresis and no apparent sensitivity to environmental conditions even after several years of storage at room temperature in the presence of oxygen and water vapor. Whereas delta-doping was initially demonstrated using elemental boron as a dopant material for surface passivation of thin, n-channel CCDs, subsequent development efforts have shown that delta-doping works equally well for surface passivation of back-illuminated photodiode arrays, CMOS imaging arrays, fully-depleted p-channel CCDs (requiring n-type delta-doping using antimony as the dopant material), and electron-multiplied CCDs (which use a high-gain output register for photon-counting applications).

MBE Doping Using a Uniform Dopant Profile

MIT Lincoln Labs (MIT-LL) has recently developed a surface passivation process that uses an MBE-grown silicon layer that is 5 nm in thickness and contains a uniform distribution of boron (B) at a concentration of $2\times10^{20}$ cm$^{-3}$ (corresponding to a sheet density of $1\times10^{14}$ cm$^{-2}$). MIT-LL claims the achievement of near 100% internal quantum efficiency and no measurable hysteresis. Studies done by MIT-LL on exposure of back-illuminated CCDs to extreme ultraviolet radiation prove that the MBE-grown layer is more radiation hard than either chemisorption charging or ion implantation. The improved hardness to radiation of MBE-passivated devices is attributed to the total amount of charge incorporated into the passivation layers and the relative thickness of the oxide layers on the surfaces. Citing greater mobility of electrons than holes injected into oxides by ionizing radiation, the authors of the study assert that exposure to radiation produces positive charge in the oxide layer that compensates dopants in the surface passivation layer. Of the devices compared in the MIT-LL study (which did not include a delta-doped device), the uniform, MBE-grown passivation layer contains the greatest charge density ($1\times10^{14}$ cm$^{-2}$), and the thinnest oxide (1-2 nm). Compared to uniformly doped layers grown by MIT-LL, JPL's delta-doping process achieves higher charge densities with thinner MBE-grown layers, and the multilayer passivation layer described here achieves the highest possible charge densities in silicon surfaces.

In a related study, researchers at MIT-LL found that the MBE-grown layer is responsible for excess surface-generated dark current. They were able to mitigate this problem with a 400° C. anneal in hydrogen, which passivates surface states in the native oxide and thereby reduces the surface-generated dark current. Even with the incorporation of hydrogen passivation, the observed dark current is still an order of magnitude higher than an equivalent front-illuminated device, indicating that back-surface defects are not fully passivated. JPL's delta-doping process does not require hydrogen passivation to achieve low dark current.

Limitations of Delta-Doping and the Need for a New Technology

FIGS. 1 and 2 compare delta-doping with other surface doping technologies according to calculated near-surface electric fields and electronic potentials. The slowly varying dopant profiles created by diffusion and ion implantation produce weak, slowly varying electric fields and potentials, which provides poor isolation of surface from bulk and leads to instabilities in the response (as seen in the WFC3 detector performance data from the Hubble Space Telescope). In comparison, the plots show that delta-doping creates the strongest electric fields and the highest energy barriers of any surface passivation technology in the prior art. This is consistent with quantum efficiency and stability measurements that show how effective a passivation layer delta-doping provides. Nevertheless, recent measurements suggest that the surface density of mobile holes is two orders of magnitude lower than the surface density of dopant atoms in the delta-doped layer. This discrepancy is significant, both for its consequences for device performance, and for its implication that an improved surface passivation technology is necessary. The inventive technology addresses this need, as described below.

FIG. 1 is a diagram that illustrates calculated electric fields comparing delta-doped surfaces to other methods of surface doping in the prior art.

FIG. 2 is a diagram that illustrates calculated electric potentials comparing delta-doped surfaces to other methods of surface doping in the prior art.

FIG. 1 and FIG. 2 present results of calculations that were done to compare delta-doping with state-of-the-art surface passivation technologies in the prior art in the presence of high surface defect densities. The plots show that delta-doping creates the strongest electric field and the highest energy barrier of any prior art. The key to achieving this is the creation of abrupt dopant profiles by MBE. Whereas the principles illustrated by these models are correct, recent results from surface conductivity and dark current measurements comparing delta-doped surfaces to multilayer doped surfaces suggest the existence of chemical and/or physical mechanisms that partially compensate the delta-doped surface, and cause the behavior of real delta-doped surfaces to deviate from the models. The inventive technology of multilayer doping provides greater stability, higher conductivity, and improved passivation of interface defects and traps.

Surface Passivation by Quantum Exclusion

Multilayer Doping: Introduction and General Description

Various methods of surface passivation technologies are well known in the art that predate the technologies specifically developed for back-illuminated detectors (as well as solar cells, which have very similar requirements as detectors). These well-known technologies include the growth of thermal oxides, annealing in hydrogen, and the growth or deposition of high performance insulators (e.g., high-k oxides that are the subject of a large literature in semiconductor technology). These technologies are directed toward eliminating or mitigating the influence of electrically active defects, as opposed to charging the surface to create favorable fields and potentials. With the exception of delta-doping, all of the surface charging methods described in the previous section also rely on such methods—especially hydrogen passivation—to help improve stability and efficiency of surface passivation. This reliance on low defect densities presents a problem for stability, because ionizing radiation is well known to degrade devices by forming surface defects, which are electrically active defects (also known as traps) that exist in both the oxide and at the silicon-oxide interface. In particular, detectors for deep ultraviolet, far ultraviolet, extreme ultraviolet, and x-rays are subject to ionizing radiation damage, because high energy photons are well known to damage Si—SiO$_2$ interfaces by creating high densities of interface traps. One of the advantages of the inventive technology is the improvement of stability irrespective of surface defects.

Stability is an important performance metric, as charging and discharging of surfaces and interfaces can play havoc with devices. Time-varying charging and discharging of back-surface interface traps causes imaging artifacts which vary with time and illumination history (e.g., quantum efficiency hysteresis and image persistence). The Hubble Space Telescope required detectors with stability better than 1% in order to meet scientific requirements for photometric accuracy. In order to meet this requirement, the problems created by interface traps have to be resolved by improved methods of surface passivation. As illustrated by the history of detector development for the Hubble Space Telescope, back-illuminated optical detectors require surface passivation in order to achieve high quantum efficiency, low dark current and stable response. Passivation requires a process to create a passivation layer which is thin enough to be transparent at all detected wavelengths. For optimal efficiency, the passivation layer must create a strong electric field in the silicon near the detector surface in order to prevent minority carriers from recombining or becoming trapped at the surface. To suppress surface-generated dark current, the passivation process must either reduce the density of surface/interface traps or suppress the injection of thermally-generated charge from the surface into the bulk silicon. In order to mitigate quantum efficiency hysteresis, the fields created by the passivation layer must be stable against perturbations of the surface potential, which may be caused by trapping and detrapping of electrons and holes at the surface. Surface passivation technologies are also distinguished by robustness, or the ability to reduce or delay degradation of detector performance in a harsh environment (e.g., mitigating or preventing permanent changes to the detector performance that may accompany chemical or physical damage to the surface due to contaminants and/or ionizing radiation). Recent data from the Wide Field Camera 3 instrument on the Hubble Space Telescope, as well the need for improved lifetime in DUV, FUV and EUV detectors, demonstrates that there is a need for surface passivation technologies with improved stability and robustness.

The inventive technology achieves improved stability and robustness compared to the prior art by using multilayer doping to embed an exceptionally high density of electrically-active dopant atoms in a thin passivation layer, thus isolating the detector from the surface irrespective of the density of surface defects. The design and implementation of the inventive technology requires nanometer-scale control over the semiconductor composition. On this length scale, electron and hole interactions with the surface are governed by quantum mechanics, and the isolation of surface from bulk is achieved through control of the quantum behavior of electrons and holes—hence the terminology, surface passivation by quantum exclusion.

The multilayer doping technology improves the performance of solid-state detectors compared to the prior art in the following ways:

It improves stability and signal-to-noise performance by providing a barrier that suppresses tunnel-assisted generation and transport of minority carriers from surface to bulk, thereby reducing the sensitivity to surface/interface states.

It enables high quantum efficiency and improves stability by providing a potential barrier that suppresses transport of low-energy ("thermal") minority carriers from the bulk silicon to the surface, and reduces the probability of such carriers from interacting with traps at the surface/interface through tunnel assisted generation-recombination processes.

It enables high quantum efficiency and improves stability by suppressing trapping and recombination of high-energy ("hot") minority carriers at the surface/interface and within the passivation layer, and (conversely) promotes the transport of such carriers away from the surface and into the bulk silicon.

It improves stability and reduces noise by providing high surface conductivity that facilitates lateral transport of excess majority carriers, thus mitigating local accumulation of majority carriers and helping to maintain the detector surface at a constant potential under all illumination conditions.

It mitigates radiation damage, hot carrier injection, and other damaging effects of the environment by isolating the fields and potentials in the bulk silicon from influence by temporary or permanent changes in the surface potential, thus mitigating any effects on detector performance caused by chemical and physical changes to the surface and oxide/antireflection-coating.

The principles, methods, and structures for achieving surface passivation by quantum exclusion using multilayer doping are described below.

Multilayer doping interposes a thin crystal between the surface/interface and silicon detector that is transparent to high-energy ("hot") carriers and opaque to low energy (thermal) carriers. Effectively, multilayer doping creates an electronic surface that is isolated from and independent of the physical surface. The layer itself is designed according to the principles of quantum mechanics to isolate and decouple surface states/defects from minority carrier states in the detector (semiconductor "bulk"), while minimizing the probability that hot carriers will be captured within the layer or at the surface. This decoupling and exclusion of minority carriers from the surface is termed quantum exclusion, and is extremely important in imaging detectors, because of the requirement to prevent environmental conditions (chemical or physical changes to surface coatings, adsorbed or chemisorbed molecules, and external fields) from affecting the performance of the imaging detector (especially sensitivity, stability, and noise).

Whereas the context of this invention is the field of imaging detectors, virtually all semiconductor devices are affected by defects in surfaces and interfaces. It is stipulated that the concept of surface passivation by quantum exclusion is more general both in method and application; that other methods of creating the required near-surface electronic potential required for passivation can be developed based on these concepts; and that passivation by quantum exclusion may find useful application in a larger class of semiconductor devices and applications than the above-cited examples of solar cells, photodetectors, and back-illuminated solid-state imaging devices.

While the preferred implementation is passivation of silicon surfaces using MBE growth of doped silicon layers, it is further stipulated that various engineered materials may be designed and fabricated to implement surface passivation by quantum exclusion in various materials systems, including silicon, alloys containing silicon germanium, and a variety of III-V and II-VI semiconductor materials, all of which can be grown and doped with nanometer-scale precision using the methods of molecular beam epitaxy. Other materials systems and fabrication technologies (such as organic semiconductors) may also be amenable to the methods and concepts applied here.

The ideas and methods presented here can be generalized to encompass many more device structures and technologies. Epitaxial growth technology, together with the theory and concepts of surface passivation by quantum exclusion, are readily extendable to more complicated structures and functions, especially with respect to two and three dimensional patterned structures. The ability to fabricate semiconductor dopant profiles with nearly atomic-scale precision enables the manipulation of quantum mechanical states and quantum transport of electrons and holes. These technologies can thus be applied in the design, modification, and development of many conceivable device structures, seeking either optimal performance or reduced dimensions of existing devices (such as the transistors used as building blocks of integrated circuits) or in developing novel devices and structures that require improved surfaces for their practical realization.

The remainder of this disclosure focuses on multilayer passivation of silicon, which is a particular instantiation of surface passivation by quantum exclusion that is illustrative of the principles, methods, and advantages of the inventive technology.

Nature of Delta-Doping as Taught by JPL

To introduce multilayer passivation of silicon, and to provide a basis for comparison with the prior art, we begin with a description of the nature of surface passivation by delta-doping as taught by JPL, as well as the problems recently identified with this technology. As applied to optical detectors, the essential principle of delta-doping is to replace the thick p+ substrate of a front-illuminated detector with an ultrathin p+ layer that reproduces (in essence) the electric field and potential barrier formed by the p$^+$p junction of the original substrate/epilayer interface. Because the ultrathin delta-doped layer is essentially transparent (in a qualified sense), back-illuminated, delta-doped detectors exhibit extremely high quantum efficiency over the entire electromagnetic spectrum accessible to silicon (from soft x-rays through the near infrared). The essence of the problem of back illumination lies with problem of surface passivation and stability; in particular, it is essential that chemical and physical changes to the passivated surface do not affect detector performance.

As described hereinabove, JPL's delta-doping technology is the best surface passivation technology of any in the prior art. JPL's patents and publications teach that the delta-doped layer should be situated approximately 1-2 nm from the Si—SiO$_2$ interface in order to achieve the best performance of back-illuminated silicon detectors. Even though the delta-doped layer taught by JPL is only 2.5 nm thick (equivalent to about 20 atomic monolayers in the silicon crystal), the sheet density of dopant atoms in JPL's delta-doped layers is approximately $2\times10^{14}$ cm$^{-2}$. A dopant density this high should create a highly conductive surface, because the sheet density of dopants is almost two orders of magnitude larger than the surface charge densities normally present in native oxides of silicon.

Low Sheet Densities of Holes in Delta-Doped Surfaces

Recent measurements of surface sheet density (a measure of conductivity) of delta-doped surfaces at JPL show that a near-surface delta-doped layer exhibits sheet densities two orders of magnitude lower than expected, whereas the sheet density of deep delta-doped layers is within the expected range (see Table 1). Profiles of the surface by secondary ion mass spectrometry (SIMS) indicate the delta-doped surface contains a sheet density of dopant atoms close to the design value of $2\times10^{14}$ cm$^{-2}$. This presents a problem for at least two reasons: first, because conductivity is an essential function of the substrate that should be reproduced by the surface passivation layer; and second, the low surface conductivity indicates that the delta-doped surface is less robust than previously thought. The low sheet density of delta-doped surfaces therefore demonstrates a need for an improved surface passivation technology and provides a basis for evaluating the inventive technology.

Table 1 provides a comparison of delta-doped vs. multilayer-doped surfaces based on sheet number (a measure of surface conductivity). This represents data from MBE-grown layers on ultrahigh purity silicon substrates, in order to ensure that the conductivity measurements accurately reflect the mobile charge created by doping in the surface passivation layer.

TABLE 1

| Technology | Structure | Sheet number ($\times 10^{14}$ cm$^{-2}$) |
|---|---|---|
| Delta-doped surface | Shallow delta-layer | 0.05 |
|  | Deep delta-layer* | 0.9 |
| Multilayer doped surface | Two layer multilayer | 1.0 |
|  | Four layer multilayer | 4.0 |

*Note that data for the deep delta-layer are presented for comparison purposes only. Delta-layers buried deep under the surface are not suitable for surface passivation of imaging detectors, because too much signal is lost in the surface region.

Dopant Compensation, Chemical Mechanisms, and Models: an Approach to Evaluate Multilayer Doping for Surface Passivation The discrepancy between the sheet densities of holes and dopant atoms described above indicates that proximity to the surface is somehow compensating the delta-doped layer. There are at least two possible reasons for this discrepancy. Either the great majority of dopant atoms in the layer nearest the surface are electrically inactive, or the great majority of holes are being immobilized by the surface. Chemical mechanisms exist that would account for either or both of these possibilities; furthermore, these mechanisms involve hydrogen, which is well-known to be ubiquitous in silicon oxides. Deactivation of surface dopant atoms such as Boron by sub-surface hydrogen is well-known in the art. Injection and trapping of holes in surface oxides is also well-known, and is the subject of a relatively large literature. It has recently been determined that immobilization of holes in oxides can be an ionic rather than an electrical process, as the injection of holes into the oxide causes the release of hydrogen from oxygen vacancies, creating both a type of defect known as an E center and also causing the hydrogen to enter into a stable bond with a bridging oxygen atom, thus creating a fixed, positive charge in the oxide. Both mechanisms—dopant deactivation vs. charge carrier trapping/immobilization—are therefore associated with hydrogen on or near the surface. Thus the conductivity data show that improvements over delta-doping are necessary and provide a quantitative basis for comparison with models, while the chemical mechanisms offer a meaningful starting point for modeling the surfaces of delta-doped and multilayer doped silicon. Together, models and data provide a means for comparing the inventive technology with the prior art, and show that multilayer doping provides significant advantages over the prior art.

Modeling the Quantum Mechanical Behavior of Surfaces

Quantum mechanical models of the surface, together with new MBE growths and characterization data, provide new insights into surface passivation by delta-doping, and illuminate some problems with delta-doping and other state-of-the-art passivation technologies. Calculations and experiments on improved MBE-grown structures demonstrate the practical application and advantages achieved by using the concepts of surface passivation by quantum exclusion to design new device structures and methods.

The principles of quantum mechanics and semiconductor band theory are necessary to model the behavior of majority and minority carriers in mesoscale semiconductor structures, thus providing the essential connection between composition, structure, and electrical behavior.

Calculations of near-surface properties of MBE-grown layers are essential to illustrate the concepts and applications of surface passivation by quantum exclusion. In order to connect theory with experiment, several approximations are required. These approximations are essential to making the problem tractable, so that the results of model calculations should be taken as descriptive rather than quantitative predictions. An effort has been made to make use of accepted models and to incorporate as much detail and knowledge of materials as is practical; nevertheless, devices and methods described here are to be evaluated based on characterization and performance data, and do not stand or fall based on accuracy of the models.

Because of the relationship between nanometer-scale doping profiles, the electronic potential of doped semiconductors, and wave properties of electrons and holes at nanometer length scales, a theoretical analysis of MBE-grown passivation layers requires quantum mechanical models to describe the behavior of both electrons and holes near the Si—SiO$_2$ interface. Here we use self-consistent solutions of the Schrödinger and Poisson equations to model the near-surface band structure; the conduction bands, including the X-point (including the splitting of transverse and longitudinal modes), L-point, and Gamma-point minima, are modeled using the effective mass approximation; for the valence bands, a six-band k·p model is used to incorporate band-coupling effects.

The Limits of Bulk (3D) Doping

Most of the surface doping methods used in the prior art produce three dimensional dopant distributions, in which dopant atoms are distributed (more or less) randomly in the silicon lattice. Such 3D doping methods include dopant diffusion, ion implantation, and uniform MBE doping (as implemented by MIT-LL). The solid solubility of Boron in silicon (i.e., the 3D doping limit) is approximately $2.5 \times 10^{20}$ cm$^{-3}$. Using 3D doping methods, researchers have found that the fraction of electrically active dopant atoms is markedly reduced for concentrations of dopant atoms that exceed this maximum doping concentration. Bulk (3D) doping at concentrations exceeding this maximum doping concentration results in high concentrations of electrically inactive dopants, including for example precipitates and interstitial dopant atoms. In addition, 3D doping at ultrahigh concentrations results in local distortions of the silicon crystal lattice due to strain, which causes the formation of electrical states in the bandgap that act as traps and recombination centers. In other words, bulk (3D) doping reaches a limit, wherein attempting to increase the dopant concentration beyond the limit is not effective for surface passivation.

Two Dimensional (2D) Doping

In two dimensional (2D) doping methods, also known as delta doping, dopant atoms are deposited on a clean silicon surface in ultrahigh vacuum conditions at elevated temperatures. Under the right conditions of temperature and pressure, dopant atoms deposited on the silicon surface spontaneously form a self-organized 2D phase. In the case of Boron on <100> silicon, this 2D surface phase comprises a stable configuration at surface coverages of up to 0.5 monolayer with full electrical activation of dopant atoms. As a result of self-organization in this surface phase, electrically active dopant concentrations in a 2D doped layer can locally exceed concentrations of $10^{22}$ cm$^{-3}$.

The 3D limit of $2.5 \times 10^{20}$ cm$^{-3}$ corresponds to the same average dopant concentration as a 4 nm thick silicon layer containing a 2D dopant layer with a sheet concentration of $1 \times 10^{14}$ cm$^{-2}$. By increasing the sheet density and decreasing the layer thickness, 2D doping methods can achieve electrically-active dopant densities that locally exceed $10^{22}$ cm$^{-3}$. As we shall see, this capability has significant implications for improving surface passivation in silicon devices.

Multilayer Two Dimensional (2D) Doping for Passivation of Silicon Surfaces

Multilayer doping is based on multiple delta-doped layers (which has previously been described in terms of M doped layers and M−1 interlayers). Multilayer doping is implemented by growing multiple delta-doped layers on a silicon surface, in which the separation between adjacent layers is small enough to allow quantum mechanical coupling between layers. Quantum mechanical coupling maintains the high quantum efficiency of delta-doping, while multilayer doping increases the surface conductivity by two orders of magnitude compared to delta-doping and provides greater isolation between the surface and bulk regions. Conductivity measurements of MBE-grown layers demonstrate methods and devices by which the surface conductivity can be increased by two orders of magnitude while achieving, and possibly improving, the isolation of surface from bulk silicon that is necessary for effective surface passivation.

Division into Regions

In considering the electrical passivation of silicon surfaces by multilayer 2D doping, it is useful to consider the passivated silicon surface in terms of three regions, comprising the surface region that contains the chemical interface between silicon and its oxide, the multilayer 2D doping region, and the physical interface comprising the boundary between the multilayer and the silicon device. The plots show electric field and potential energy (FIG. 3, FIG. 4, FIG. 5 and FIG. 6), hole concentration (FIG. 7 and FIG. 8), electron states (FIG. 9 through FIG. 14), and robustness (FIG. 15 through FIG. 20).

The plots illustrate the principles of the inventive technology by separating the multilayer-doped surface into three regions, as follows:

Chemical Interface

A surface region is bounded by the Si—SiO$_2$ interface on one side, and the first delta-doped layer on the other. The chemistry of the Si—SiO$_2$ interface dominates this region. The first doped layer should be close to the Si—SiO$_2$ interface in order that this region be subject to quantum confinement effects in calculated energy states of minority carriers. Quantum confinement in this region helps to minimize trapping of minority carriers. Trapping of holes in the oxide creates fixed positive charge and a surface dipole region between the Si—SiO$_2$ interface and the first doped layer. Charge separation in the dipole region creates a strong surface field. Hydrogen generated in the surface can deactivate dopants in the doped layer nearest the surface.

Multilayer

The multilayer region is a new region. Whereas delta-doping represents an abrupt boundary between the chemical and physical interfaces, the multilayer region interposes a region of finite width, with properties that can be controlled by design. In one embodiment, by growing several delta-layers instead of one, a "multilayer" of coupled quantum wells is created. The separation between layers preferably is narrow, so that the quantum wells are coupled. If the separation between layers is too large carriers could get trapped in the individual wells, and the quantum efficiency would be low. The dopant sheet densities preferably are high in order to get good isolation between the bulk and the wafer surface. A high barrier provides better suppression of tunneling, and is more robust against dynamic surface charging, damage and other environmental effects. High dopant sheet densities also provide high electrical conductivity, which is lacking in delta-doped surfaces.

Physical Interface

This interface defines the electronic surface of the detector; it is the beginning of the original detector material that existed prior to MBE growth, and is comprised of high purity silicon. This is where photogenerated minority carriers need to go in order to be detected, and once they are there, the multilayer region needs to provide an excellent tunnel barrier to prevent their coming back. The electric field extending into this region from the multilayer region and the height and width of the potential barrier created by the multilayer region are key parameters in determining the effectiveness of surface passivation. The electric field and potential barrier created by delta-doping are much lower than expected, based on inferences from the conductivity data. Multilayer doping is far superior to delta-doping and to any other prior art by the various criteria illustrated by the models and confirmed by the data.

Fabrication Methods to Implement Multilayer Passivation

Because multilayer doping requires the growth of a plurality of doped layers on the back surface of a silicon detector, the methods previously developed for thinning and delta-doping silicon detectors can be used to prepare the surface and grow the first doped layer. Subsequent doped layers are formed by an iterative growth process, in order to form the desired number of doped layers in the multilayer region. While the multilayers formed by this method are generally taken to be periodic, the inventive technology of multilayer doping for detector passivation does not require that all layers be formed identically.

In one preferred embodiment, the preferred method for multilayer doping includes the following process steps. Note that some steps may be added, altered, eliminated, or performed in a different sequence, depending on specific requirements for different detector designs.

1. Supporting the detector prior to thinning the wafer by a frame-thinning process in which thinning leaves a thick frame to support the thinned region, or by bonding the detector to a mechanical support prior to thinning in order to thin the entire device.
2. Cleaning the surface to be thinned, for example, using a standard cleaning process for silicon wafers, such as the RCA cleaning process.
3. Thinning the detector, for example, by a series of steps including chemical-mechanical polishing, chemical etching with a heated KOH solution, chemical etching with a mixture of hydrofluoric and acetic acids, and etching with a solution of $KMnO_4$.
4. Cleaning the back surface of the thinned detector, for example, by another RCA cleaning step, followed by a UV ozone cleaning process.
5. Hydrogen passivation of the surface, for example, by placing the detector on a spinner in a nitrogen environment, and exposing the surface to a sequence of chemicals while spinning including ethanol, an HF:ethanol mixture, and ethanol again.
6. Loading the device into a vacuum chamber and pumping to ultrahigh vacuum pressures.
7. Transferring the device under vacuum into the MBE growth chamber.
8. Annealing the device at low temperature to remove volatile chemicals from the surface, for example, by heating to 150° C. for at least 10 minutes.
9. Heating to a temperature of at least 380° C. and not more than 450° C.
10. Growth of a silicon layer as a buffer layer to produce an atomically clean silicon surface.
11. Stop silicon growth.
12. Optionally cool the device to a lower temperature, for example, to a temperature between 250° C. and 300° C. for growth of n-type multilayers.
13. Perform iterative growth of a plurality of delta-layers: For each delta-layer in the multilayer, deposit dopant atoms until the desired dopant density is reached, stop the flux of dopant atoms, and grow a desired thickness of silicon over the delta-layer. For example, a dopant density of $2 \times 10^{14}$ $cm^{-2}$ and a silicon layer thickness between 0.5 and 2 nm may be used for each delta-layer. It is not required that each layer be identical to the previous layer.
14. Cool the device gradually, and remove from the MBE chamber.
15. Optional steps for oxide formation and antireflection coating, as necessary for specific applications.
16. At this point the passivation by multilayer doping is complete, and additional steps for packaging may be performed as needed.

Modeling Multilayer Doping and Comparing with Delta-Doping

For the purposes of modeling, immobilization of holes at the surface will create a surface dipole layer, as charged dopant atoms are physically separated from charge at the surface by the thickness of the silicon cap layer. The dipole layer creates an electric field that tends to confine holes in the semiconductor and electrons at the surface; however, the dipole layer is so narrow that quantum confinement greatly increases the ground state energy of electrons confined at the surface, to the point that most of the states are coupled to conduction band states in the bulk of the detector. In contrast, deactivation of dopant atoms will effectively neutralize them, thus removing them from the model as far as calculations of potential are concerned. Therefore, to span these possibilities, two cases are considered: First, immobilization of charge and the creation of a strong surface dipole, and second, neutralization of dopants and a reduction of the dopant density in the layer closest to the surface.

FIG. 1 is a diagram that illustrates calculated electric fields comparing delta-doped surfaces to other methods of surface doping in the prior art. The electric fields are plotted on a log scale in order to provide a better comparison for the different length scales represented by the dopant profiles shown in FIG. 1. Delta-doping provides better surface passivation than all other methods of surface doping in the prior art, as illustrated in FIG. 1 by the observation that delta doping achieves both the highest electric field strength in the bulk region (i.e., detector silicon where photogenerated electrons are measured).

FIG. 2 is a diagram that illustrates calculated near surface conduction bands (i.e., electronic potentials), comparing delta-doped surfaces to other methods of surface doping in the prior art. The conduction bands shown in FIG. 2 correspond to the electric fields shown in FIG. 1. Delta-doping provides better surface passivation than all other methods of surface doping in the prior art, as illustrated in FIG. 2 by the observation that delta doping achieves both the highest potential barrier isolating the surface from the detector regions (i.e., preventing photogenerated electrons from interacting with traps at the surface), and the narrowest possible surface region (where photogenerated electrons are subject to trapping and recombination). Note however that whereas delta-doping provides the highest potential barrier of all other methods in the prior art, delta-doping is potentially subject to increased tunnel-assisted dark current generation due to the thin barrier separating the Si—$SiO_2$ interface from the bulk silicon. Thus, there is a need for a wider potential barrier to provide improved isolation of surface from bulk regions.

Figure 3:
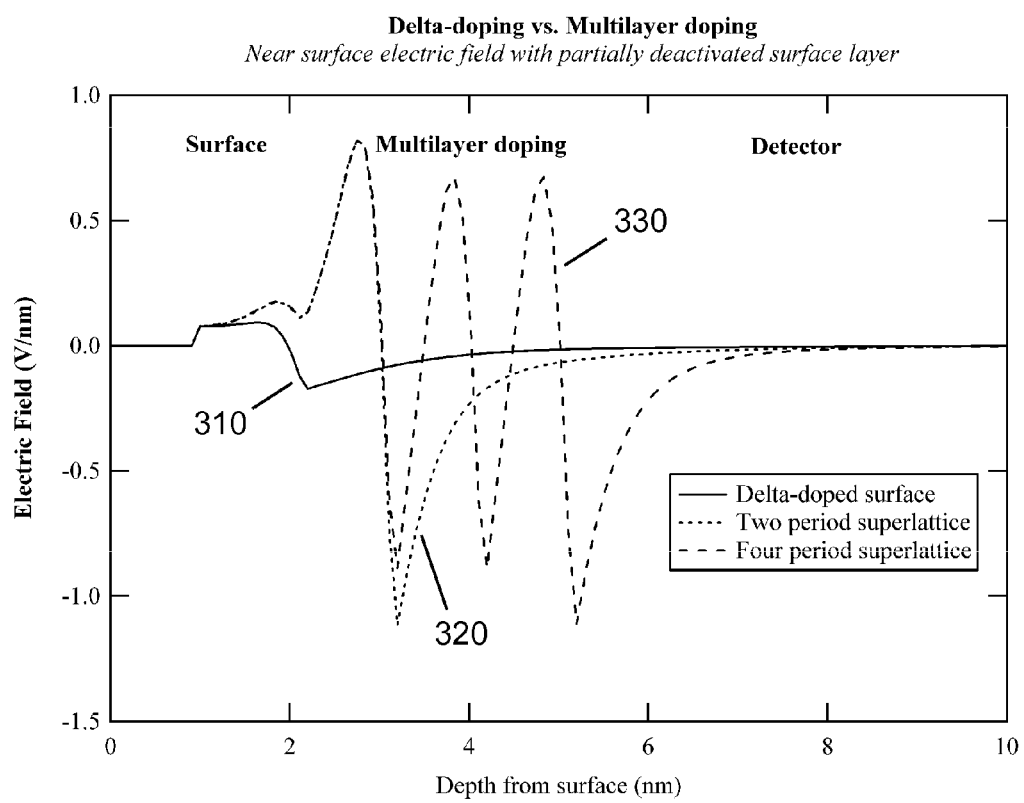
FIG. 3 is a diagram that illustrates the near surface electric field for surfaces in which the dopant layer nearest the surface has been nearly completely deactivated (e.g., by hydrogen passivation).
Figure 4:
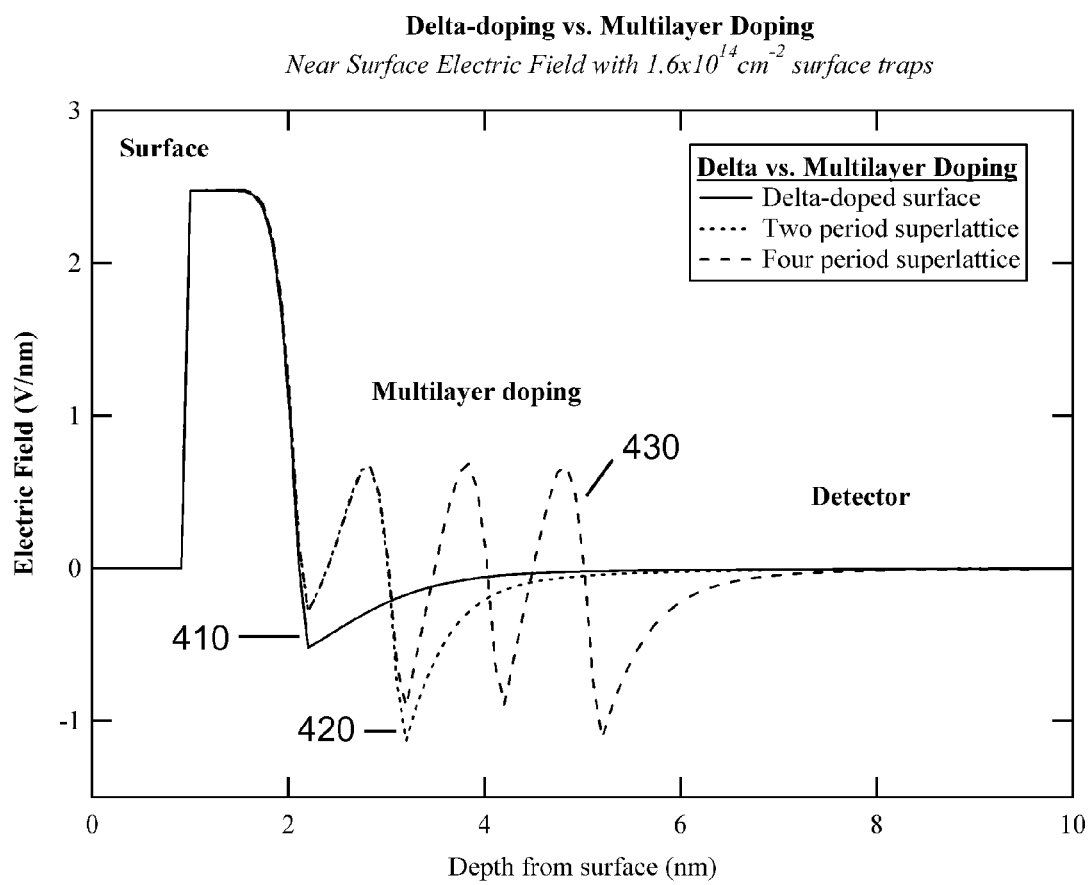
FIG. 4 is a diagram that illustrates the near surface electric field, comparing delta-doping with multilayer doping for surfaces with a high density of trapped charge (i.e., calculations assume a surface density of $1.6 \times 10^{14}$ cm$^{-2}$).

FIG. 3 is a diagram that illustrates the near surface electric field, comparing delta-doping with multilayer doping for surfaces with a high density of trapped charge (i.e., calculations assume a surface density of $1.6 \times 10^{14}$ $cm^{-2}$). The electric fields are shown on a linear scale in FIG. 3 and FIG. 4, in order to show the sign reversals in the electric field strength for different regions of the surface. All MBE layers represented in the figure contain a surface dipole region and a silicon bulk region, where electric fields are very high. Multilayer (also referred to as "multiple layer") doping creates a third region in the surface which is absent in the delta-doped surface. In this region, the electric fields are also very high, but the average field is relatively low. Compared with delta-doping, multilayer doping achieves an electric field strength that is as strong as delta-doping in FIG. 1, while at the same time multilayer doping exhibits much greater immunity from deactivation of near surface dopants. This improved immunity from deactivation of near-surface dopants is illustrated in FIG. 4 by the observation that the electric field in the detector region is unaffected by partial deactivation of dopant in the surface layer for multilayer doped surfaces. Curve 310 represents calculated data for a single delta doped layer, curve 320 represents calculated data for a multilayer having two doped layers, and curve 330 represents calculated data for a multilayer having four doped layers.

FIG. 3 is a diagram that illustrates the near surface electric field for surfaces in which the dopant layer nearest the surface has been nearly completely deactivated (e.g., by hydrogen passivation). FIG. 4 is provided for comparison with FIG. 3, to illustrate the stability of multilayer doping against surface effects, such as degradation caused either by the introduction of high surface trap densities (FIG. 4) or by deactivation of near surface dopants (FIG. 3). Compared with delta-doping, multilayer doping has much greater immunity from surface traps, as illustrated in the FIG. 4 by the observation that the electric field in the detector region is unaffected by surface traps for multilayer doped surfaces, whereas the electric field in a delta-doped surface is diminished by the presence of surface traps. Curve 410 represents calculated data for a single delta doped layer, curve 420 represents calculated data for a multilayer having two doped layers, and curve 430 represents calculated data for a multilayer having four doped layers.

Figure 5:
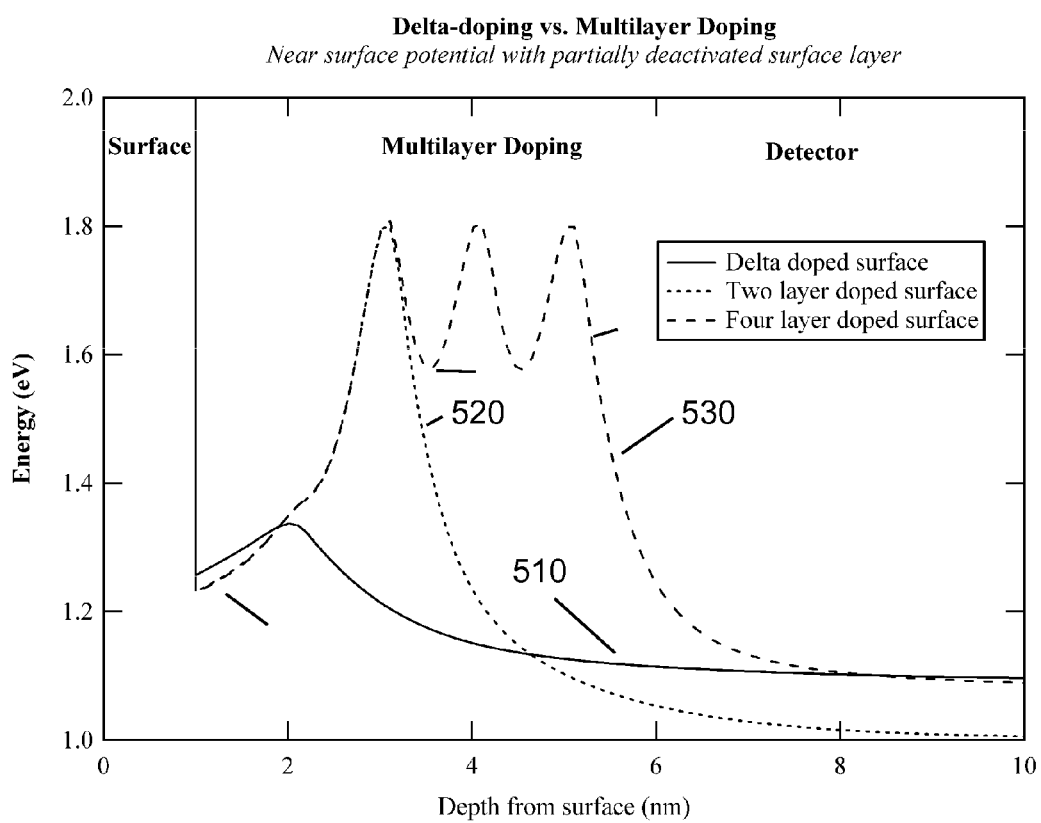
FIG. 5 is a diagram that illustrates the near-surface conduction band, comparing delta-doping and multilayer doping for surfaces in which the doped layer nearest the surface has been nearly completely deactivated (e.g., by hydrogen passivation).

FIG. 5 is a diagram that illustrates the near-surface conduction band, comparing delta-doping and multilayer doping for surfaces in which the doped layer nearest the surface has been nearly completely deactivated (e.g., by hydrogen passivation). The conduction bands (or electronic potentials) illustrated in this figure correspond to the electric fields represented in FIG. 4. Compared with delta-doping, multilayer doping has much greater immunity from deactivation of near surface dopants, as illustrated in FIG. 5 by the observation that the conduction band (or electronic potential) in the detector region is unaffected by surface deactivation for multilayer doped surfaces. Multilayer doping also creates a wider potential barrier separating the surface from the bulk regions, which provides greater isolation of surface from bulk regions of the detector and greatly increases the surface conductivity. Curve 510 represents calculated data for a single delta doped layer, curve 520 represents calculated data for a multilayer having two doped layers, and curve 530 represents calculated data for a multilayer having four doped layers.

Figure 6:
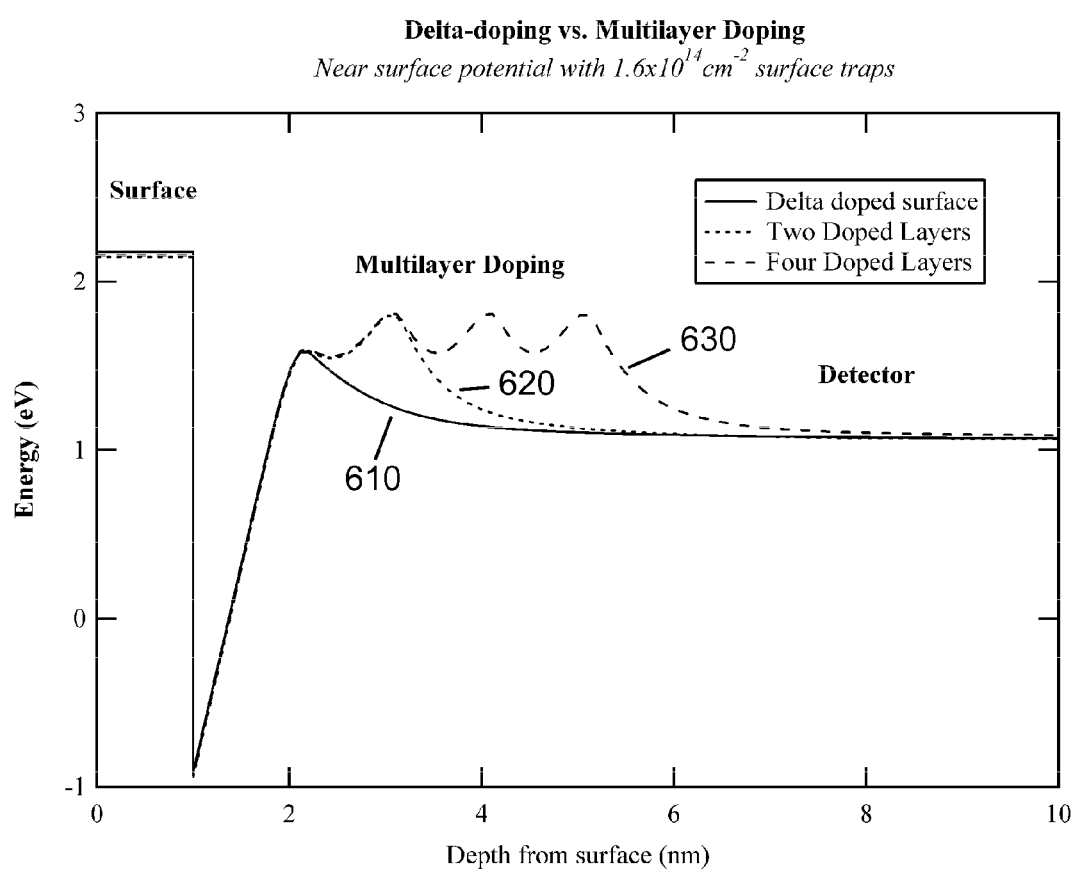
FIG. 6 is a diagram that illustrates near surface conduction bands, comparing delta-doping and multilayer doping for surfaces with a high density of trapped charge (i.e., calculations assume a surface density of $1.6 \times 10^{14}$ cm$^{-2}$).

FIG. 6 is a diagram that illustrates near surface conduction bands, comparing delta-doping and multilayer doping for surfaces with a high density of trapped charge (i.e., calculations assume a surface density of $1.6 \times 10^{14}$ cm$^{-2}$). The conduction bands (or electronic potentials) illustrated in this figure correspond to the electric fields represented in FIG. 3. FIG. 6 is provided for comparison with FIG. 5, to illustrate the stability of multilayer doping against surface effects, such as degradation caused either by the introduction of high surface trap densities (FIG. 6) or by deactivation of near surface dopants (FIG. 5). The surface dipole and silicon bulk potentials are very similar in delta-doped and multilayer doped surfaces for surfaces with trapped charge. Multilayer doping creates a wider potential barrier separating the surface from the bulk regions, which creates greater isolation of surface from bulk and greatly increases the surface conductivity. Curve 610 represents calculated data for a single delta doped layer, curve 620 represents calculated data for a multilayer having two doped layers, and curve 630 represents calculated data for a multilayer having four doped layers.

Figure 7:
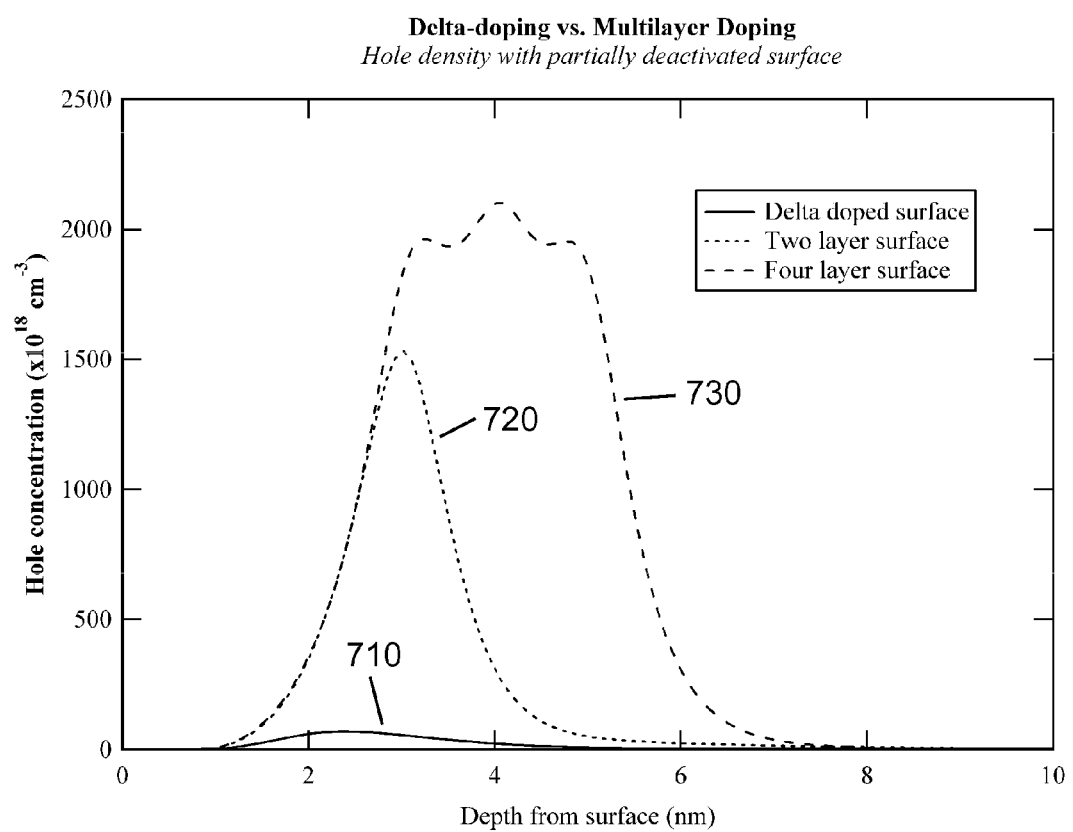
FIG. 7 is a diagram that illustrates near-surface densities of holes (i.e., majority carriers for p-type surface doping), comparing delta-doping and multilayer doping for surfaces in which the doped layer nearest the surface has been nearly completely deactivated (e.g., by hydrogen passivation).

FIG. 7 is a diagram that illustrates near-surface densities of holes (i.e., majority carriers for p-type surface doping), comparing delta-doping and multilayer doping for surfaces in which the doped layer nearest the surface has been nearly completely deactivated (e.g., by hydrogen passivation). Compared with delta-doping, multilayer doping has much greater immunity from deactivation of near surface dopants, as illustrated in FIG. 7 by the observation that the hole density is very low for a delta-doped surface when the surface dopants are deactivated (e.g., by hydrogen passivation). Consistent with the surface conductivity measurements, multilayer doping dramatically increases the concentration of majority carriers near the surface. The hole densities for multilayer doping are much less affected by surface deactivation, because the deeper layers, being farther from the surface, are relatively immune from this type of surface degradation. Thus the conductivity of multilayer doped surfaces can be more than an order of magnitude higher than a comparable delta-doped surface. Curve 710 represents calculated data for a single delta doped layer, curve 720 represents calculated data for a multilayer having two doped layers, and curve 730 represents calculated data for a multilayer having four doped layers.

Figure 8:
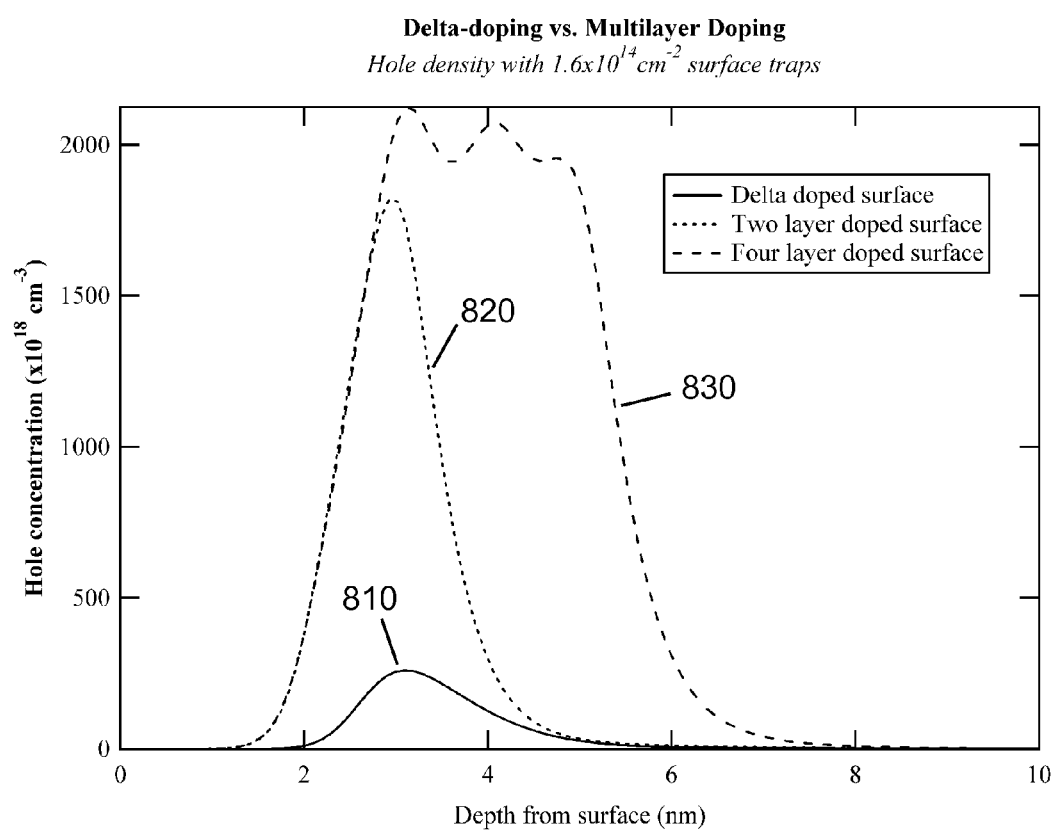
FIG. 8 is a diagram that illustrates near-surface densities of holes (i.e., majority carriers for p-type surface doping), comparing delta-doping and multilayer doping for surfaces with a high density of trapped charge (i.e., calculations assume a surface density of $1.6 \times 10^{14}$ cm$^{-2}$).

FIG. 8 is a diagram that illustrates near-surface densities of holes (i.e., majority carriers for p-type surface doping), comparing delta-doping and multilayer doping for surfaces with a high density of trapped charge (i.e., calculations assume a surface density of $1.6 \times 10^{14}$ cm$^{-2}$). Compared with delta-doping, multilayer doping has much greater immunity from surface trapping, as illustrated in FIG. 8 by the observation that the hole density is very low for a delta-doped surface when the holes are trapped at the surface. Consistent with the surface conductivity measurements, multilayer doping dramatically increases the concentration of majority carriers near the surface. The hole density for multilayer doping is much less affected by surface traps, because surface traps compensate dopants in the layer nearest the surface, forming a surface dipole region and leaving the hole densities associated with deeper layers relatively unaffected by this type of surface degradation. Thus the conductivity of multilayer doped surfaces can be more than an order of magnitude higher than a comparable delta-doped surface. Curve 810 represents calculated data for a single delta doped layer, curve 820 represents calculated data for a multilayer having two doped layers, and curve 830 represents calculated data for a multilayer having four doped layers.

Figure 9:
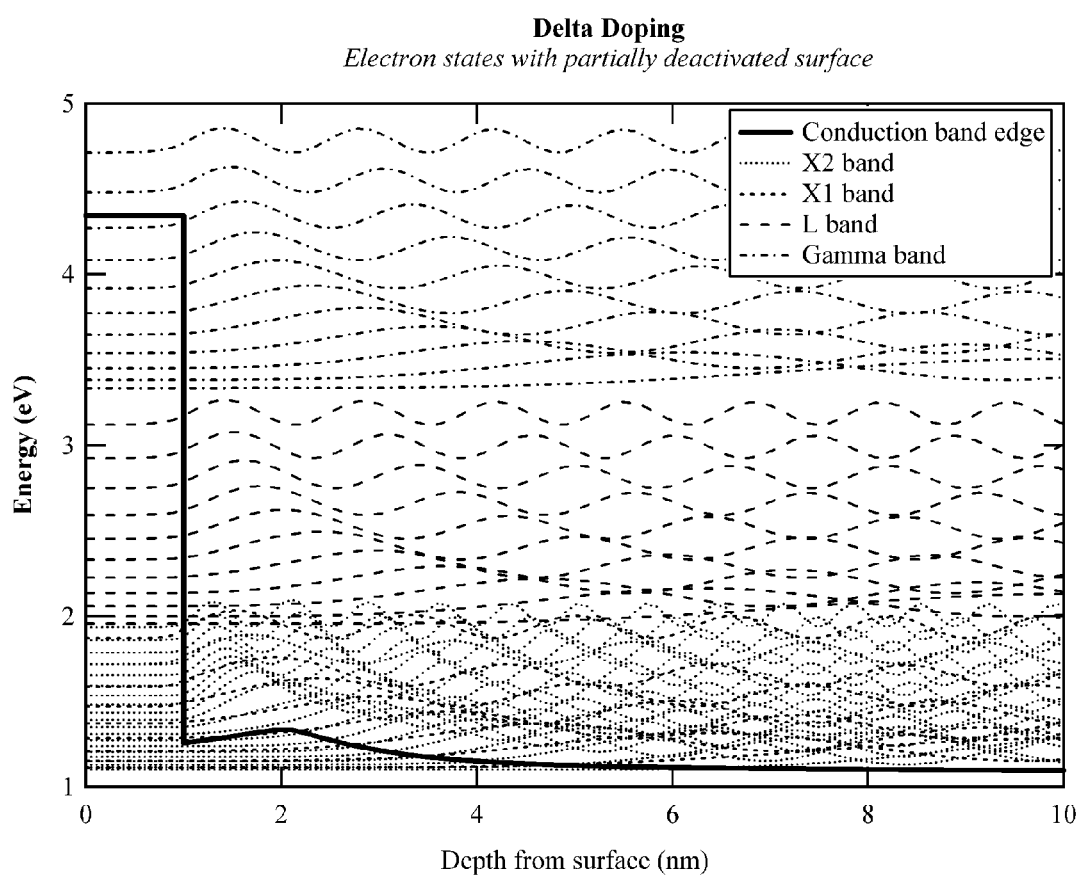
FIG. 9 is a diagram that illustrates the electron states near a surface that is passivated by delta-doping, for a surface in which the dopants have been nearly completely deactivated (e.g., by hydrogen passivation).

FIG. 9 is a diagram that illustrates the electron states near a surface that is passivated by delta-doping, for a surface in which the dopants have been nearly completely deactivated (e.g., by hydrogen passivation). This plot shows the quantized electron states calculated for the X2 (longitudinal), X1 (transverse), L, and Gamma conduction bands. Each state is represented by the probability density as a function of depth, shifted and scaled so that the vertical position reflects the energy of the state. The conduction band edge for the X2 band is also plotted for comparison. The notable feature of this plot is that none of the electron states comprise surface traps. This is a manifestation of quantum exclusion, as quantum confinement effects in the ultrathin surface region of a delta-doped detector effectively suppresses trapping and recombination of minority carriers by excluding electronic wave functions from interaction with the surface.

Figure 10:
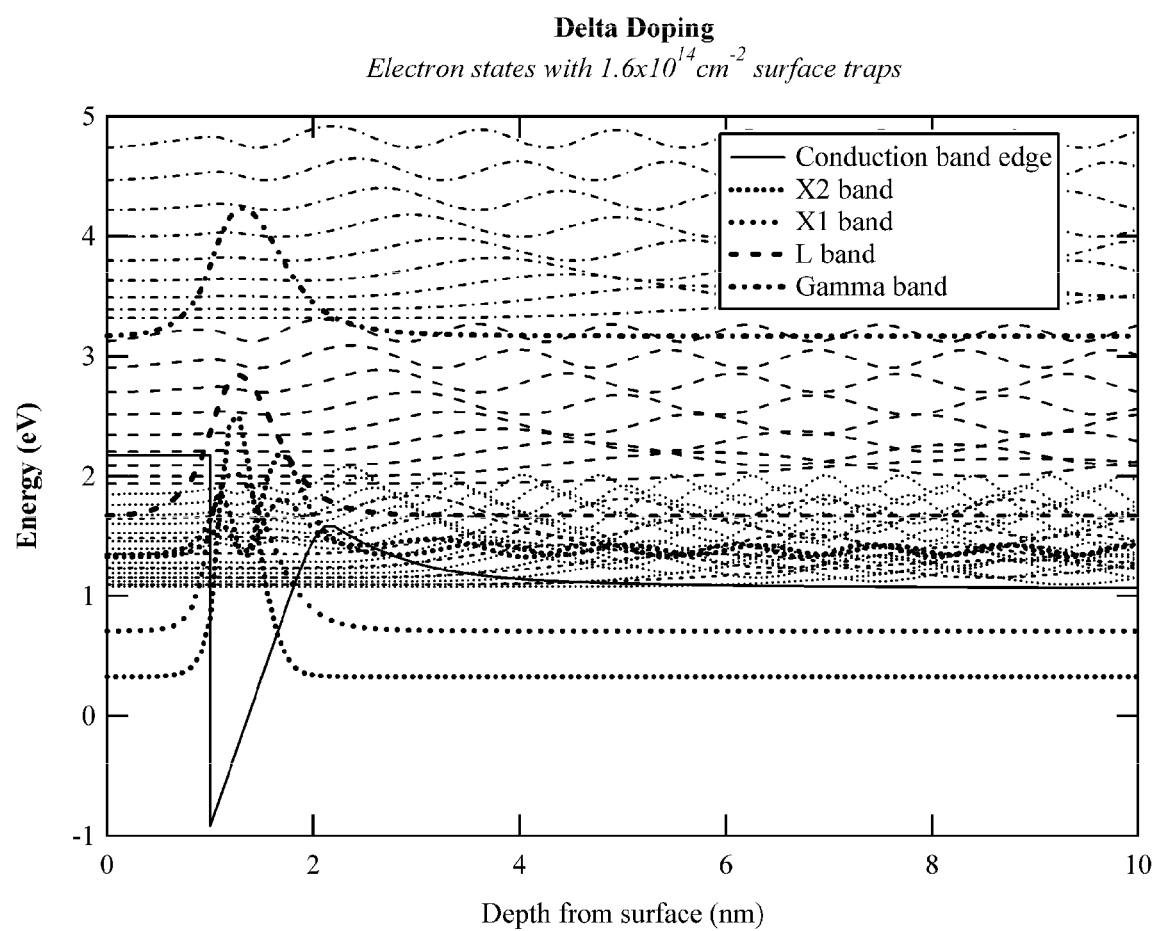
FIG. 10 is a diagram that illustrates the electron states near a surface that is passivated by delta-doping, for surfaces with a high density of trapped charge (i.e., calculations assume a surface density of $1.6 \times 10^{14}$ cm$^{-2}$).

FIG. 10 is a diagram that illustrates the electron states near a surface that is passivated by delta-doping, for surfaces with a high density of trapped charge (i.e., calculations assume a surface density of $1.6\times10^{14}$ cm$^{-2}$). This plot shows the quantized electron states calculated for the X2 (longitudinal), X1 (transverse), L, and Gamma conduction bands. Each state is represented by the probability density as a function of depth, shifted and scaled so that the vertical position reflects the energy of the state. The conduction band edge for the X2 band is also plotted for comparison. Unlike FIG. 9, there are a small number of electron states that are confined to the near surface region. These states have the ability to trap photogenerated electrons at the surface, where they are subject either to loss due to recombination, or to re-emission giving rise to imaging artifacts. Thus, in order to provide completely effective surface passivation in the presence of exceptionally high surface trap densities, the delta-doped layer must be positioned to within less than a nanometer from the surface. As described in the caption for FIG. 2, delta-doped layers this close to the surface are subject to enhanced tunnel-assisted dark current generation. There is therefore a need for a wider potential barrier to isolate the surface from the bulk.

Figure 11:
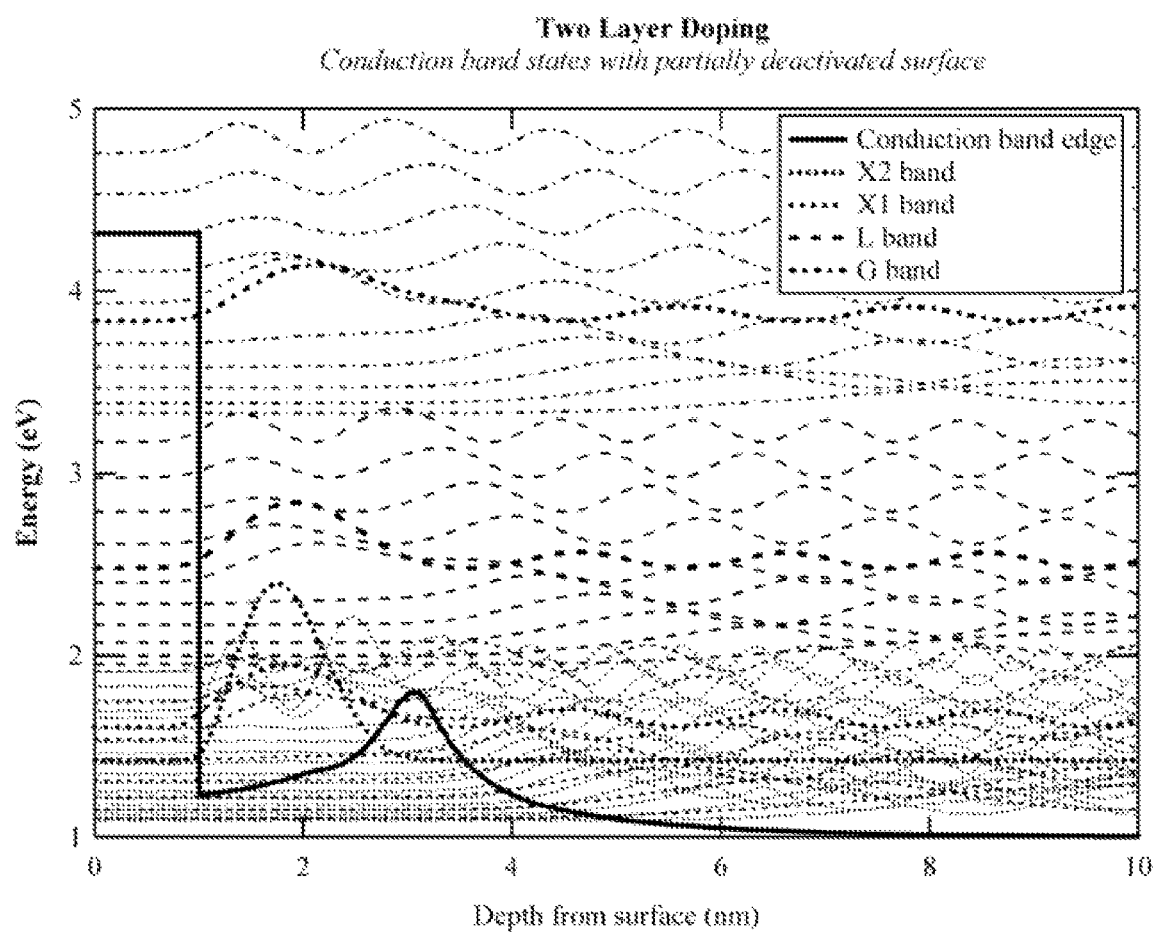
FIG. 11 is a diagram that illustrates the electron states for multilayer doping with two doped layers, assuming that the dopants in the layer nearest the surface have been nearly completely deactivated (e.g., by hydrogen passivation).

FIG. 11 is a diagram that illustrates the electron states for multilayer doping with two doped layers. The electron wave functions were calculated assuming that the dopants in the layer nearest the surface have been nearly completely deactivated (e.g., by hydrogen passivation). In comparison with delta-doped surface (FIG. 9), the increased barrier width provided by multilayer doping results in improved isolation of bulk silicon from the surface. However, deactivation of dopants in the layer nearest the surface has caused the formation of a wider surface layer, and there are a small number of states that could trap electrons and thereby lead to a reduction in quantum efficiency. Because experimental observations do not show such a reduction in detector efficiency, this figure indicates that deactivation of near-surface dopants is insignificant as a degradation mechanism in surface-doped detectors, and suggests that the widely accepted mechanism of surface trap creation is more likely to be the dominant effect of exposure to ionizing radiation.

Figure 12:
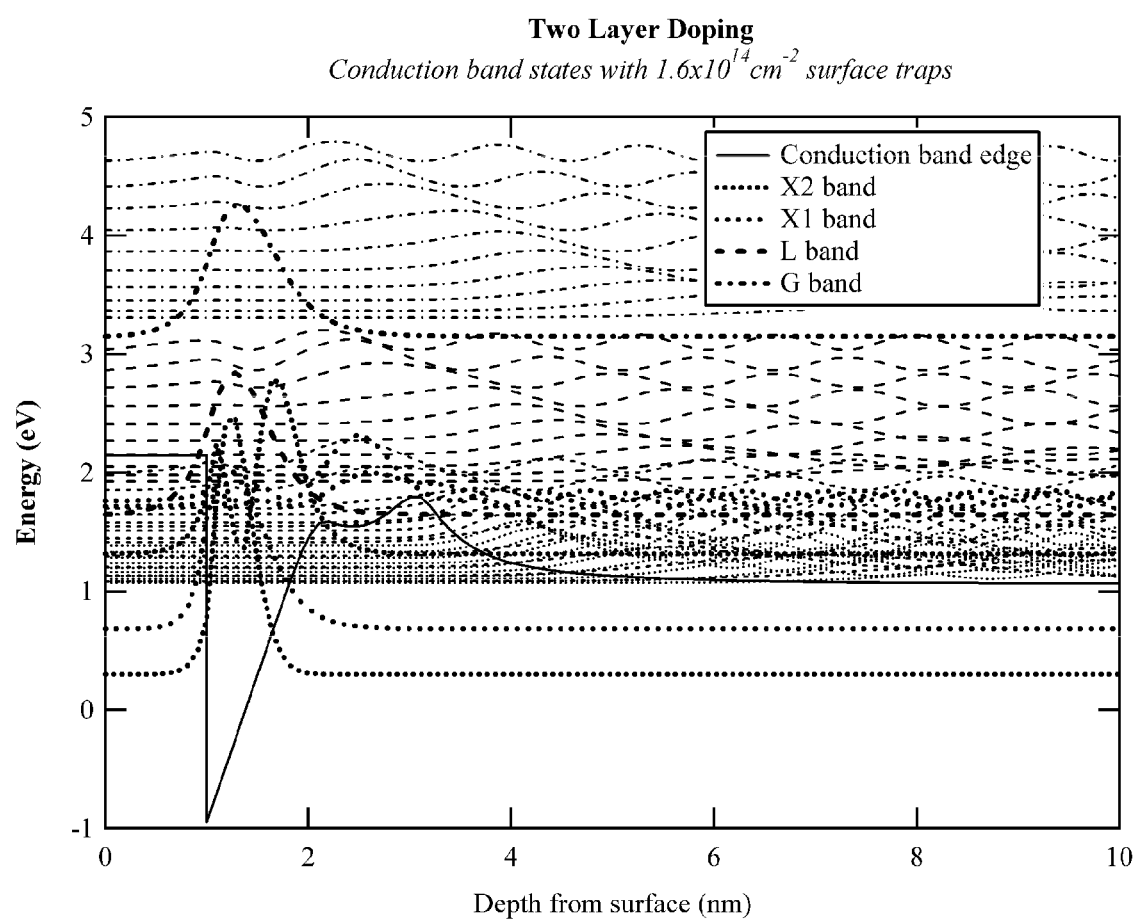
FIG. 12 is a diagram that illustrates the electron states for multilayer doping with two doped layers, assuming the presence of a high density of trapped charge at the surface (i.e., calculations assume a surface density of $1.6 \times 10^{14}$ cm$^{-2}$).

FIG. 12 is a diagram that illustrates the electron states for multilayer doping with two doped layers. The electron wave functions were calculated assuming the presence of a high density of trapped charge at the surface (i.e., calculations assume a surface density of $1.6\times10^{14}$ cm$^{-2}$). In comparison with delta-doped surface (FIG. 10), there are essentially the same number of surface traps, while the increased barrier width provided by multilayer doping results in improved isolation of bulk silicon from the surface. However, in both delta doping (FIG. 10) and multilayer doping (FIG. 12), high densities of interface traps cause the formation of a deep surface well, resulting in the existence of surface states that could trap electrons and thereby lead to a reduction in quantum efficiency. In order to effectively suppress this type of degradation, it is desirable that surface region be less than 1 nm in thickness.

Figure 13:
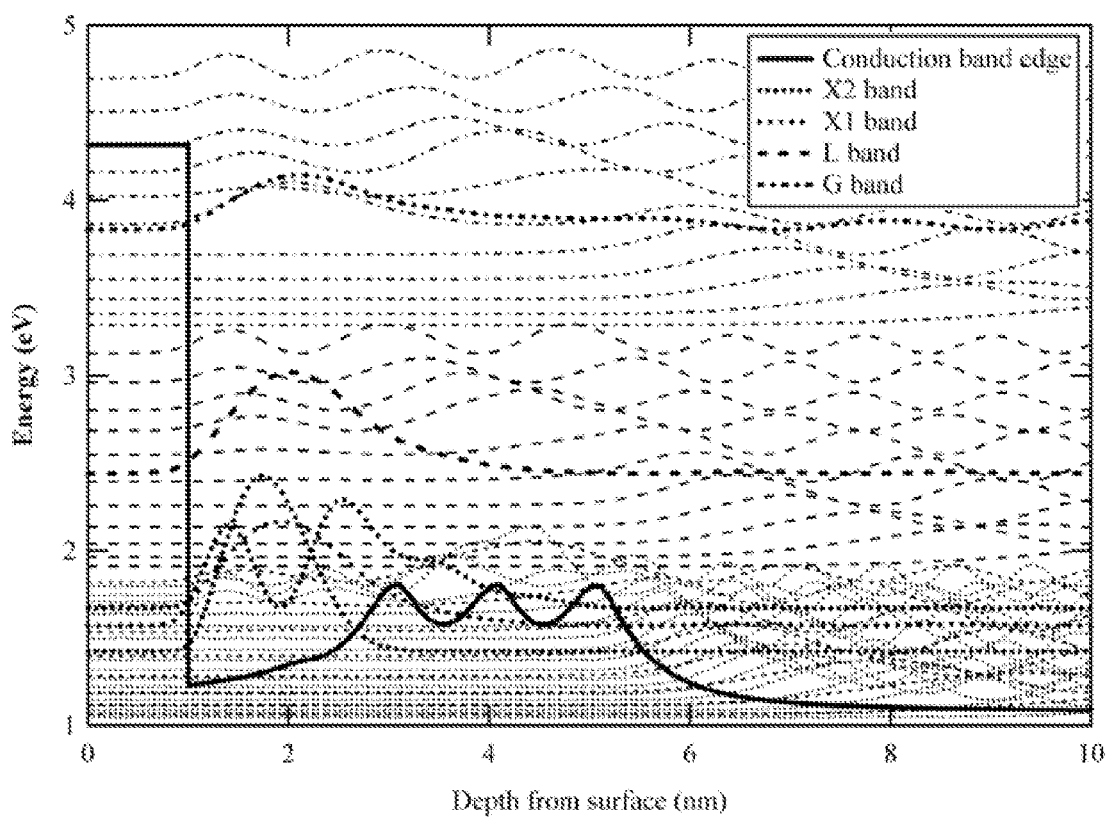
FIG. 13 is a diagram that illustrates the electron states for multilayer doping with four doped layers, assuming that the dopants in the layer nearest the surface have been nearly completely deactivated (e.g., by hydrogen passivation).

FIG. 13 is a diagram that illustrates the electron states for multilayer doping with four doped layers. The electron wave functions were calculated assuming that the dopants in the layer nearest the surface have been nearly completely deactivated (e.g., by hydrogen passivation). The strong similarities between two layer doping (FIG. 11) and four layer doping (FIG. 13) are representative of a general property of multilayer doping. By adding additional layers to multilayer doping, it is possible to both improve the isolation of the surface from the bulk (due to a wider potential barrier comprising the multilayer region), and increase the conductivity of the multilayer doped surface, without having a significant effect on either the surface or the bulk regions of the detector. In comparison with a delta-doped surface (FIG. 9) and two layer doping (FIG. 11), the multilayer having four doped layers provides a stronger tunnel barrier isolating surface from bulk; however, compared to two layer doping, the main advantage of multilayer doping with four layers lies in the two order of magnitude increase in hole sheet density near the surface (FIG. 15).

Figure 14:
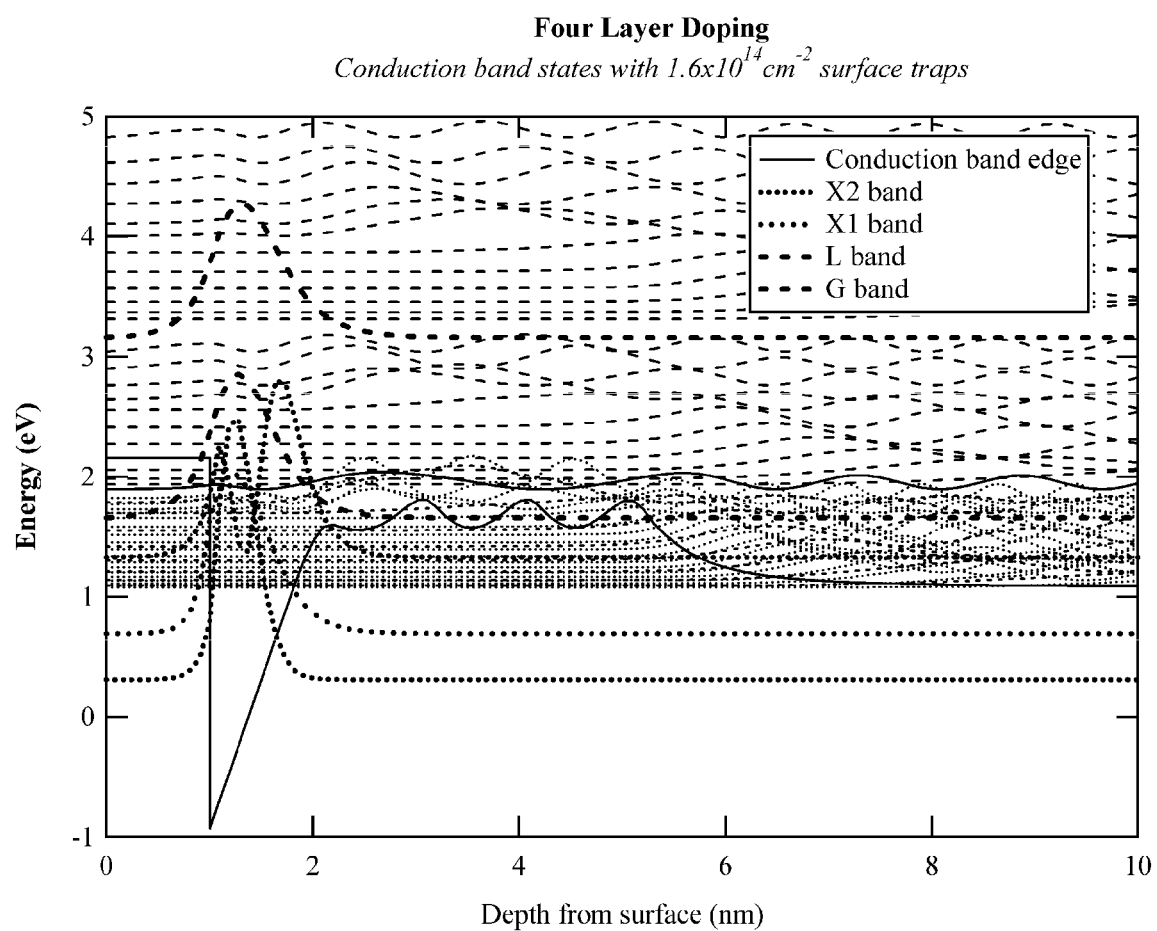
FIG. 14 is a diagram that illustrates the electron states for multilayer doping with four doped layers, assuming the presence of a high density of trapped charge at the surface (i.e., calculations assume a surface density of $1.6 \times 10^{14}$ cm$^{-2}$).

FIG. 14 is a diagram that illustrates the electron states for multilayer doping with four doped layers. The electron wave functions were calculated assuming the presence of a high density of trapped charge at the surface (i.e., calculations assume a surface density of $1.6\times10^{14}$ cm$^{-2}$). The strong similarities between two layer doping (FIG. 12) and four layer doping (FIG. 14) are representative of the same general property of multilayer doping described in the caption to FIG. 13. The number of layers in multilayer doping controls the width of the barrier isolating surface from bulk and the surface conductivity, but does not affect either the surface or bulk regions of the device. In comparison with a delta-doped surface (FIG. 10) and two layer doping (FIG. 12), the multilayer having four doped layers provides a stronger tunnel barrier isolating surface from bulk; however, compared to two layer doping, the main advantage of multilayer doping with four layers lies in the two order of magnitude increase in hole sheet density near the surface (FIG. 16).

Figure 15:
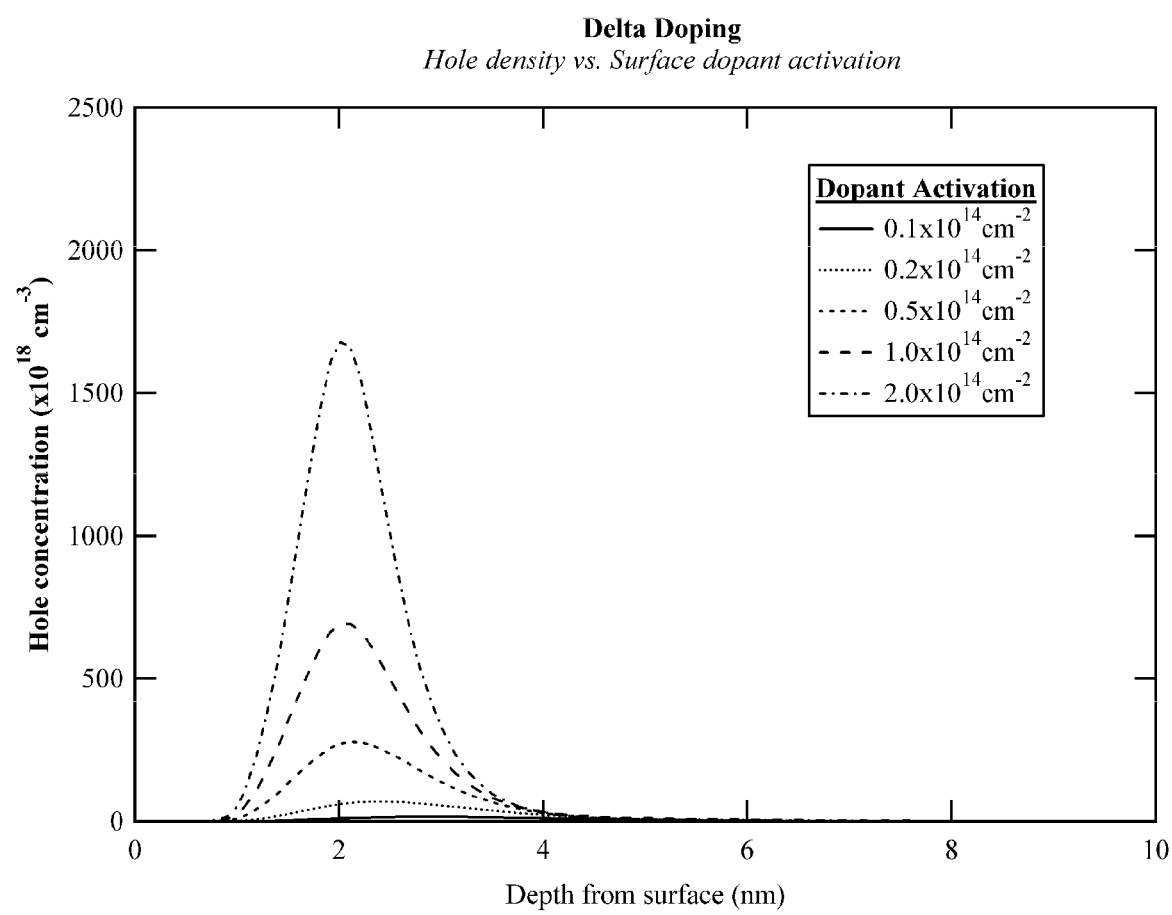
FIG. 15 is a diagram that illustrates the degradation of surface conductivity in a delta doped surface due to deactivation of surface dopants by plotting the hole density vs. depth assuming varying levels of surface dopant deactivation.
Figure 19:
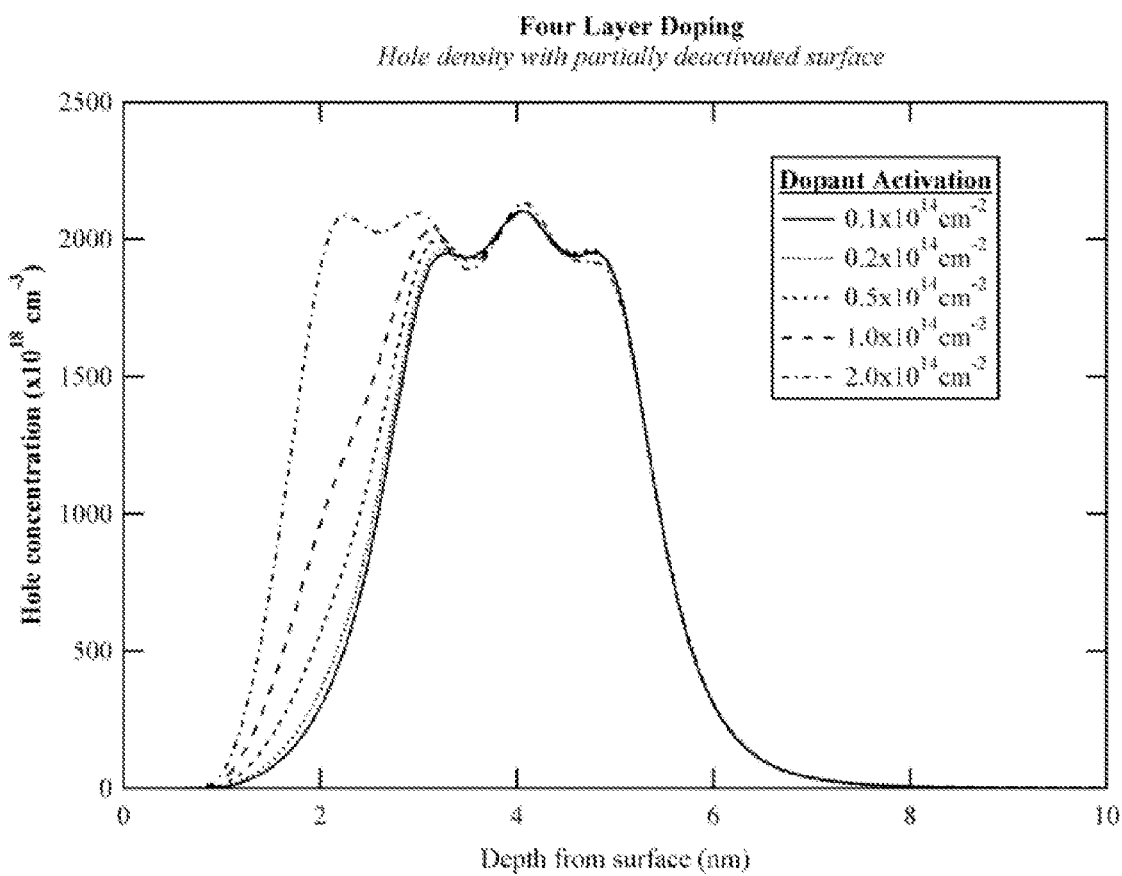
FIG. 19 is a diagram that illustrates the robustness of a multilayer with four doped layers against dopant deactivation by plotting hole density vs. depth with varying levels of deactivation.

FIG. 15 is a diagram that illustrates the degradation of surface conductivity in a delta doped surface due to deactivation of surface dopants by plotting the hole density vs. depth assuming varying levels of surface dopant deactivation. The calculation assumes a moderate density of surface traps of $5\times10^{12}$ cm$^{-2}$. As surface dopant deactivation becomes progressively worse, the hole density decreases dramatically (FIG. 15), and the height of the potential barrier is also dramatically reduced (FIG. 5). In contrast, multilayer doping significantly reduces the effects of surface dopant deactivation on both conductivity and barrier height (FIG. 5, FIG. 17 and FIG. 19).

Figure 16:
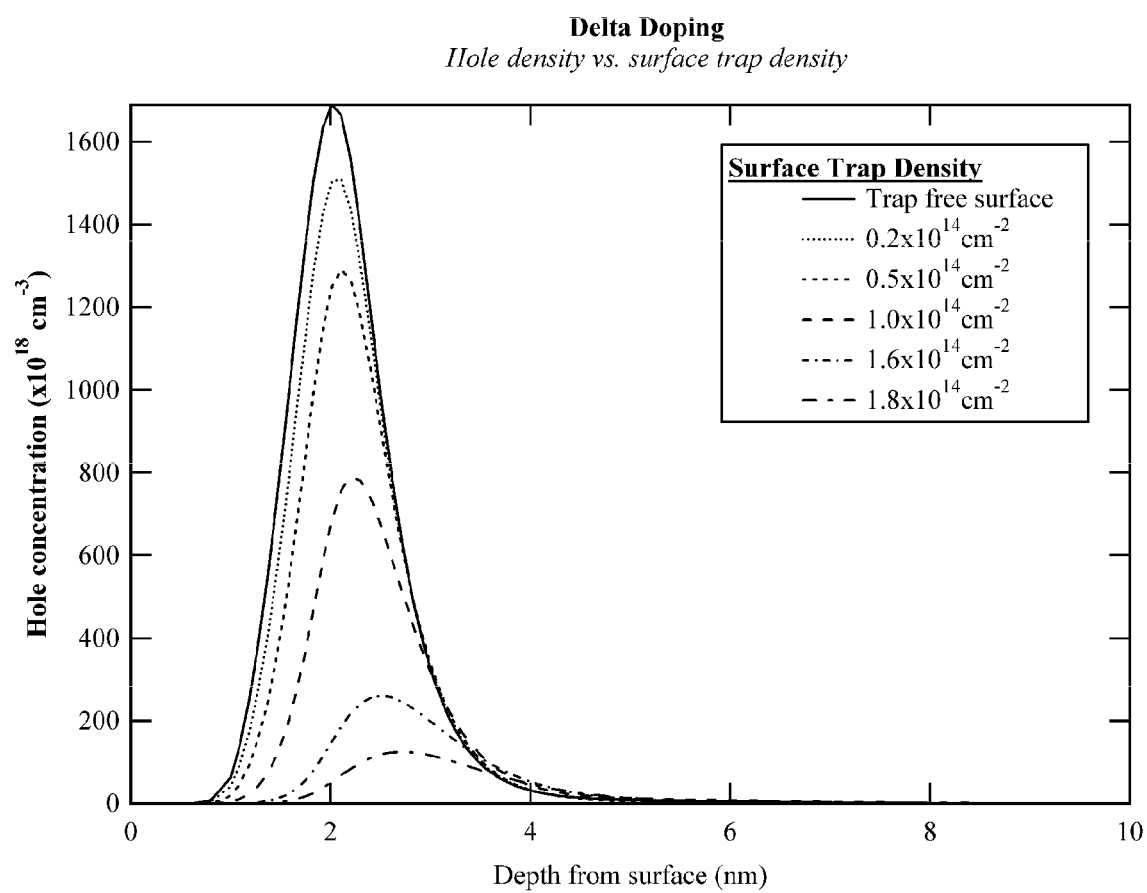
FIG. 16 is a diagram that illustrates the degradation of surface conductivity in a delta doped surface due to surface traps by plotting the hole density vs. depth with varying densities of charge trapped at the surface.
Figure 20:
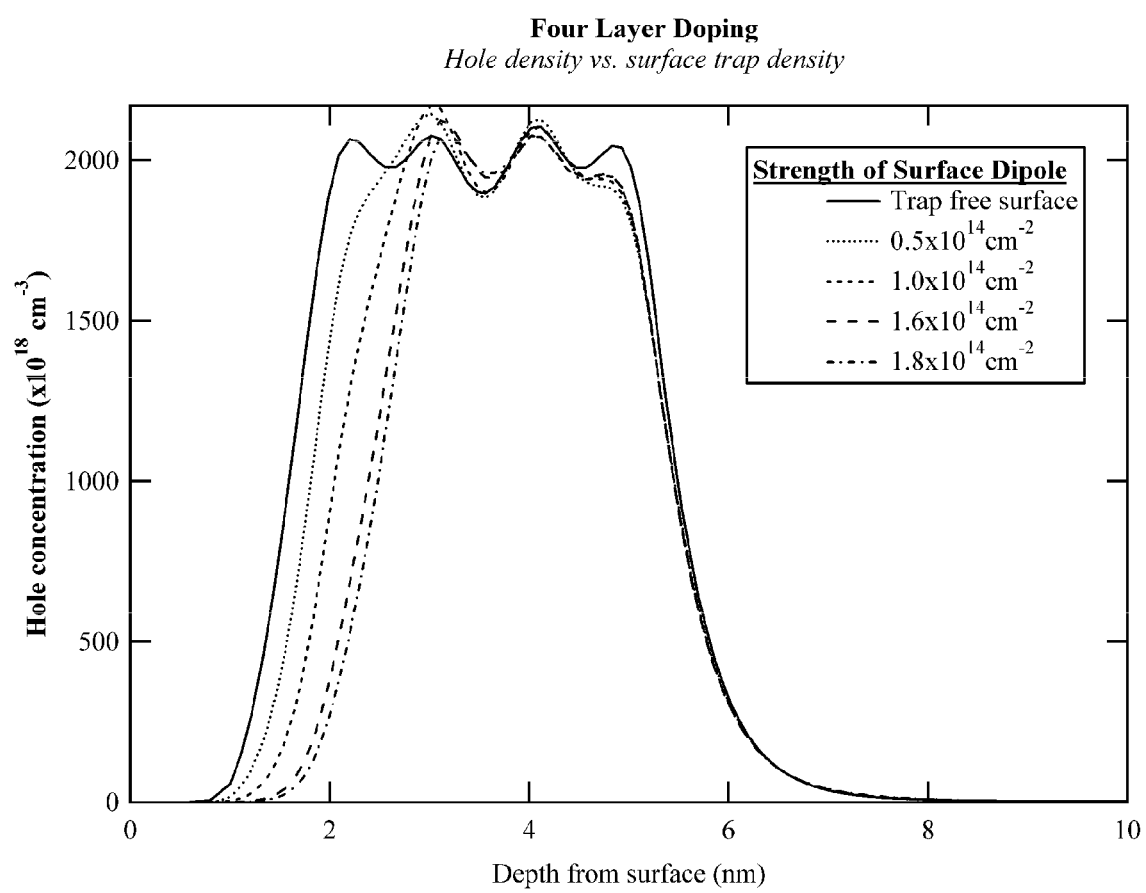
FIG. 20 is a diagram that illustrates the robustness of a multilayer with four doped layers against surface charge with full activation, but varying densities of surface traps.

FIG. 16 is a diagram that illustrates the degradation of surface conductivity in a delta doped surface due to surface traps by plotting the hole density vs. depth with varying densities of charge trapped at the surface. The near surface hole density for the heavy hole band is calculated based on trapping of holes at surfaces with several different trap densities. Hole trapping significantly reduces the density of holes for the delta-doped surface (and also reduces the potential barrier height between surface and detector for the delta-doped surface), but has a relatively minor effect on the hole density and barrier height created by multilayer doping. As surface trap densities become progressively worse, the hole density decreases dramatically (FIG. 16), and the height of the potential barrier is reduced (FIG. 6). In contrast, multilayer doping significantly reduces the effects of surface dopant deactivation on both conductivity and barrier height (FIG. 6, FIG. 18 and FIG. 20).

Figure 17:
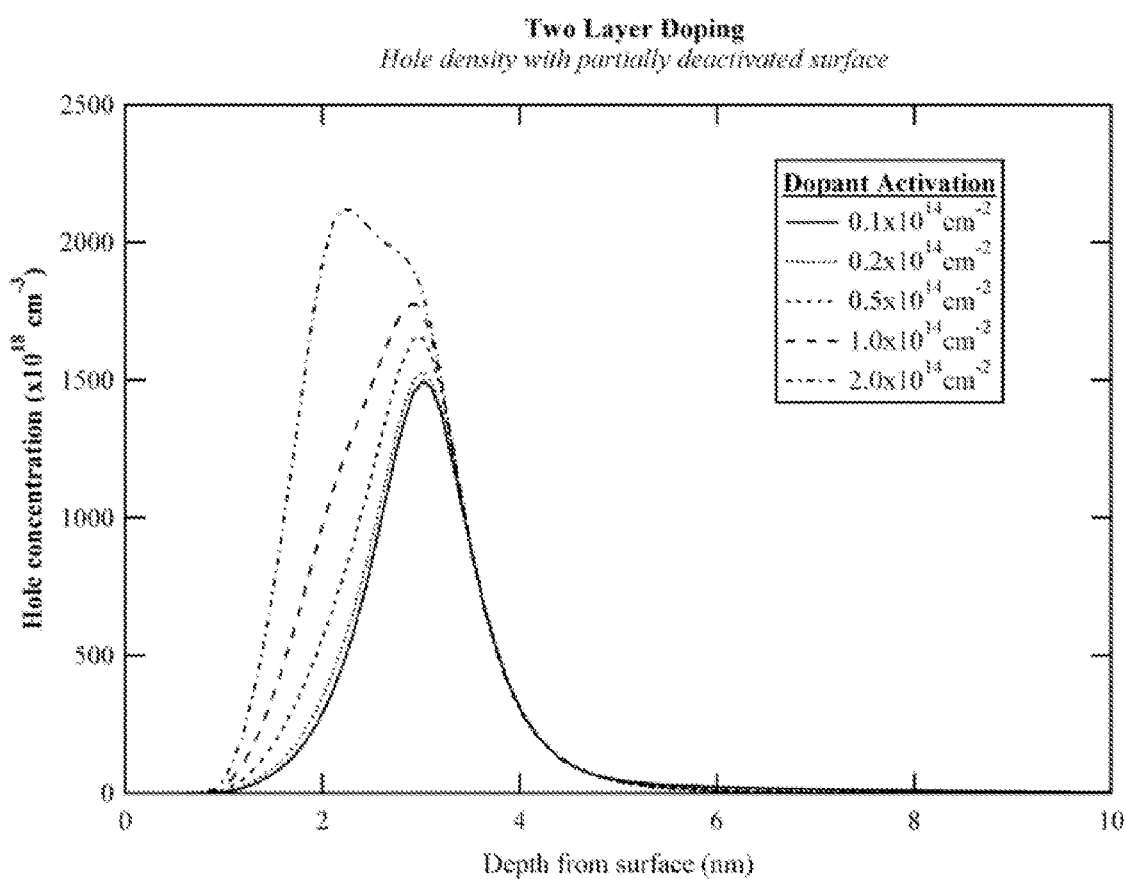
FIG. 17 is a diagram that illustrates the robustness of a multilayer with two doped layers against dopant deactivation by plotting the hole density vs. depth with varying levels of deactivation.

FIG. 17 is a diagram that illustrates the robustness of a multilayer with two doped layers against dopant deactivation with varying levels of deactivation. The calculation assumes a density of surface traps of $5\times10^{12}$ cm$^{-2}$. As surface dopant deactivation becomes progressively worse, the hole density decreases (FIG. 17), but the height of the potential barrier remains constant (FIG. 5). Thus, in contrast with the orders-of-magnitude reduction in conductivity for a delta-doped surface, the conductivity of multilayer doped surfaces with two layers decreases by at most a factor of two due to surface dopant deactivation.

Figure 18:
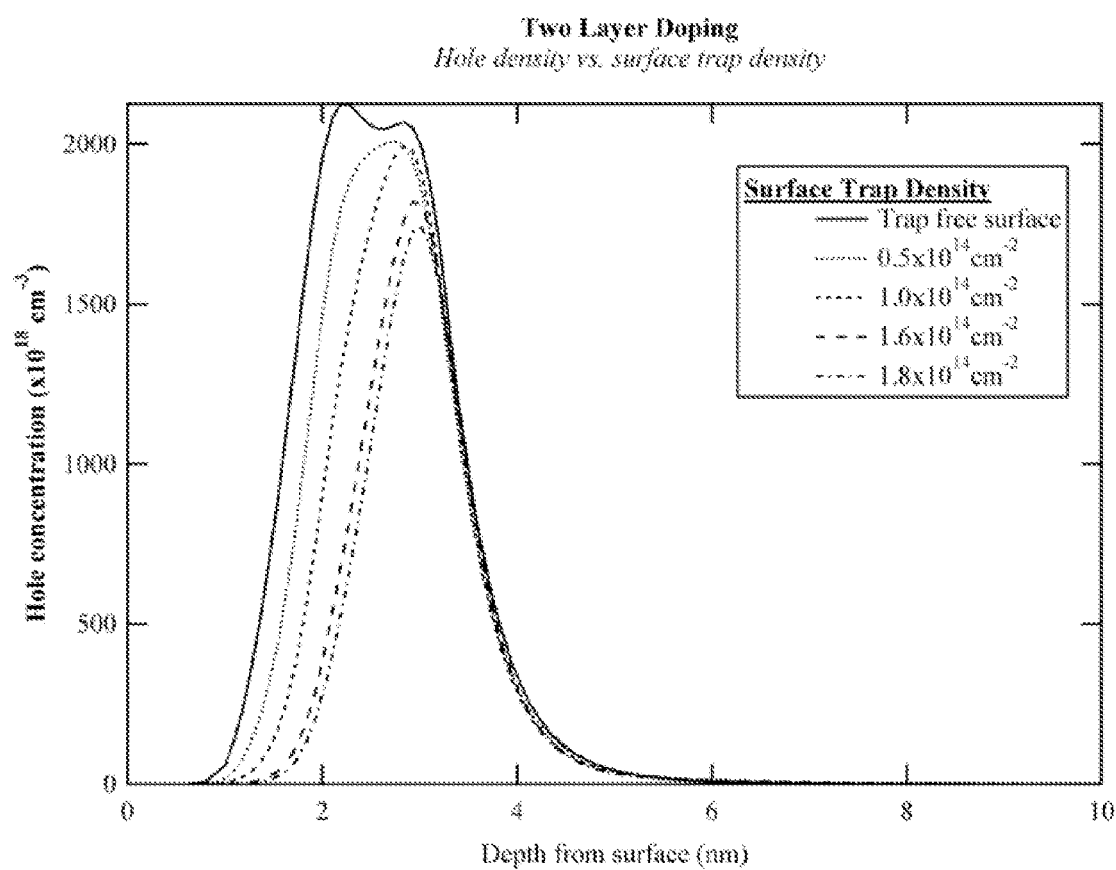
FIG. 18 is a diagram that illustrates the robustness of a multilayer with two doped layers against surface traps by plotting the hole density vs. depth for varying densities of surface traps.

FIG. 18 is a diagram that illustrates the robustness of a multilayer with two doped layers against surface traps by plotting the hole density vs. depth for varying densities of surface traps. As surface trap densities become progressively worse, the hole density decreases (FIG. 18), but the height of the potential barrier remains constant (FIG. 6). Thus, in contrast with the orders-of-magnitude reduction in conductivity for a delta-doped surface, the conductivity of multilayer doped surfaces with two layers decreases by at most a factor of two due to surface dopant deactivation.

FIG. 19 is a diagram that illustrates the robustness of a multilayer with four doped layers against dopant deactivation by plotting hole density vs. depth with varying levels of deactivation. The calculation assumes a density of surface traps of $5 \times 10^{12}$ cm$^{-2}$. As surface dopant deactivation becomes progressively worse, the hole density decreases (FIG. 19), but the height of the potential barrier remains constant (FIG. 5). Thus, in contrast with the orders-of-magnitude reduction in conductivity for a delta-doped surface, the conductivity of multilayer doped surfaces with four layers decreases by at most 25% due to surface dopant deactivation.

FIG. 20 is a diagram that illustrates the robustness of a multilayer with four doped layers against surface charge with full activation, but varying densities of surface traps. As surface trap densities become progressively worse, the hole density decreases (FIG. 20), but the height of the potential barrier remains constant (FIG. 6). Thus, in contrast with the orders-of-magnitude reduction in conductivity for a delta-doped surface, the conductivity of multilayer doped surfaces with four layers decreases by at most 25% due to surface dopant deactivation.

Figure 21:
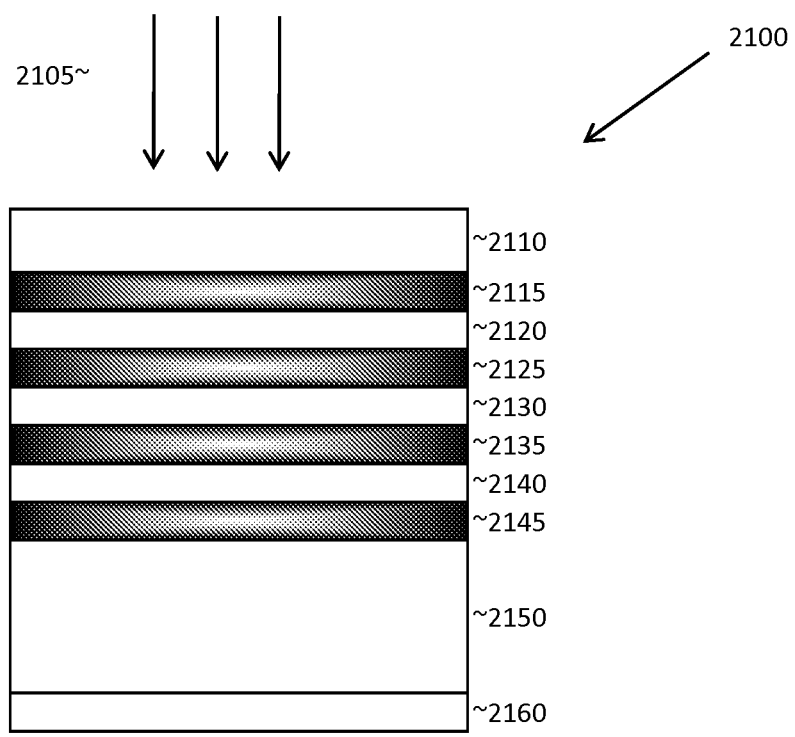
FIG. 21 is a schematic, not to scale, diagram that illustrates a cross section of a wafer having multilayer doping according to principles of the invention.

FIG. 21 is a schematic, not to scale, diagram that illustrates a cross section of a wafer 2100 having multilayer doping according to principles of the invention. In this example, a silicon semiconductor wafer is described, having deliberately provided semiconductor devices thereon. In FIG. 21, semiconductor devices (such as a CCD array in one embodiment) are provided on the free surface of the layer 2160 of the wafer shown at the bottom of FIG. 21. Illumination represented by arrows 2105 is expected to impinge on the wafer from the back surface side (opposite to the surface where the semiconductor devices are provided). Layer 2150 of the wafer represents the remaining bulk material with a surface present after an optional thinning process is applied to the back side of wafer 2100. Layers 2115, 2125, 2135, and 2145 and layers 2120, 2130 and 2140 are grown on the thinned wafer. In the example illustrated, layers 2115, 2125, 2135 and 2145, presented in partially darkened fill, represent four doped layers that include a density of a deliberately added dopant species (such as a p-type dopant such as boron, or an n-type dopant such as phosphorus or antimony). The wafer 2100 need not have exactly four doped layers, but in general a plurality M of doped layers, where M is an integer greater than 1. The dopant sheet densities in the M doped layers need not be the same, but in principle can be selected to be the same sheet densities or to be different sheet densities. Interleaved between layers 2115, 2125, 2135 and 2145 are M−1 (here with M=4, M−1=3) layers 2120, 2130 and 2140 that are not deliberately doped (also referred to as "undoped layers"), for example, layers that are substantially silicon having no deliberately added dopant. Structures with M=2, M=3 and M=4 have been demonstrated. Layer 2110 is a final semiconductor layer of the wafer provided by growth after all of layers 2115 through 2145 are grown, so that any necessary electrical contacts or optical antireflection layers can be provided on the back surface of wafer 2100. Layer 2100 may be doped as desired or as may be convenient. In general, the plurality of M doped layers 2115, 2125, 2135 and 2145 can be as thin as a single layer of silicon (approximately 0.135 nm) and can be doped at sheet densities up to approximately $2 \times 10^{14}$ cm$^{-2}$ dopant atoms. One way to measure dopant density is sheet density, which is measured in dopant atoms per square cm. The M−1 layers 2120, 2130 and 2140 that are not deliberately doped can have thicknesses in the range of 0.5 nm to 4 nm, and are preferably grown with thicknesses in the range of 1 nm to 3 nm.

Because some crystal growth methods are kinetically controlled and are not processes that attain a thermodynamic equilibrium, it is expected that it may be possible in a different (second) embodiment to grow the plurality M of doped layers without providing M−1 interleaved undoped layers between adjacent doped layers. This might be accomplished, for example, by allowing a first flux of dopant to impinge the growth surface for a first duration of time (thereby providing less than a complete monolayer of dopant), allowing a flux of silicon to impinge the growth surface for a second duration of time (thereby completing a crystalline monolayer), and then growing another monolayer by using a second dopant flux and a second silicon flux for additional durations of time, respectively. By changing the flux and the time of impingement, one may expect to grow a sequence of layers having a series of desired dopant sheet densities. Hereinbelow is presented a discussion of dopant layers which are described as multilayer 2D doping, which is an alternate description of the doping presented as M layers of dopant interleaved with M−1 layers that are not deliberately doped.

Modeling Multilayer 2D Doping with a Density of Interface States

Figure 22:
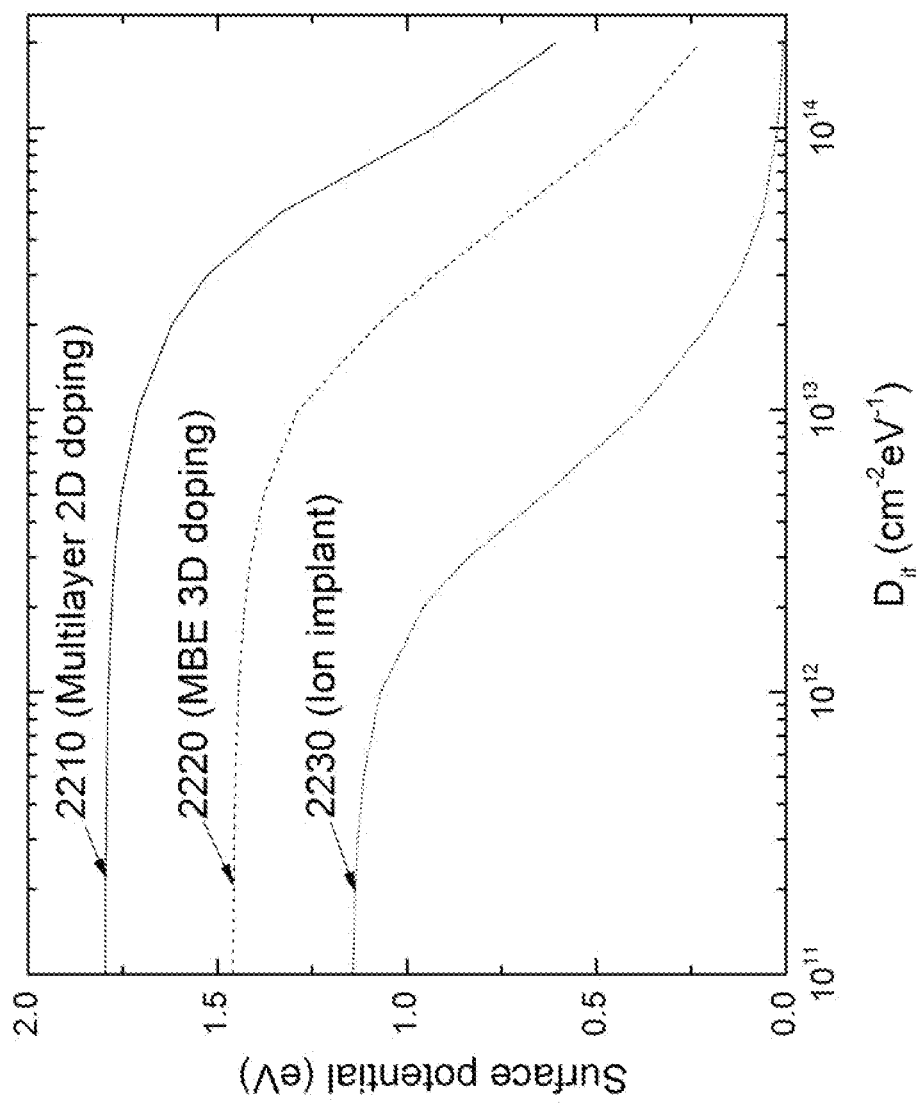
FIG. 22 is a diagram that illustrates three different surface dopant profiles (ion implant, MBE 3D doping, and multilayer 2D doping), in which the surface potentials are plotted as functions of the interface trap density ($D_{it}$).
Figure 23:
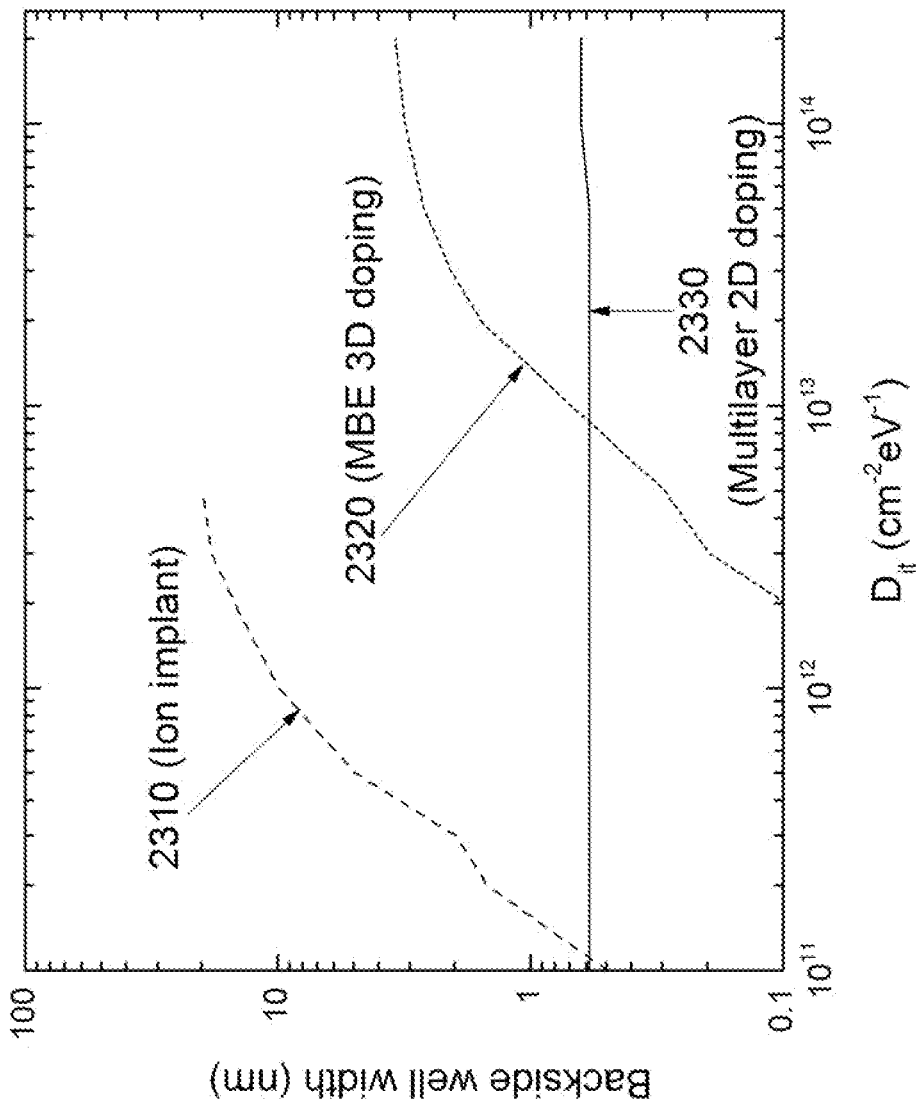
FIG. 23 is a diagram that illustrates three different surface dopant profiles (ion implant, MBE 3D doping, and multilayer 2D doping), in which the backside potential well widths are plotted as functions of the interface trap density ($D_{it}$).

As described above, in addition to creating electric fields and potentials that separate the Si—SiO$_2$ interface from the bulk silicon, surface doping methods also create a surface potential well (also known as a backside well) that can trap minority carriers. The depth and width of the surface potential well depend on both the dopant profile and the density of traps at the Si—SiO$_2$ interface (i.e., the density of interface traps, symbolized in subsequent text and figures by the symbol $D_{it}$, which has units of cm$^{-2}$ eV$^{-1}$). FIG. 22 and FIG. 23 present the problem from a classical perspective (even though they are calculated using the same quantum mechanical treatment as the other figures). Viewed classically, positive charge trapped at the interface creates a potential well at the surface that can trap electrons. FIG. 22 shows the surface potential, which is representative of the depth of the surface potential well, and FIG. 23 shows the width of the surface potential well (also known as the backside potential well). It is apparent from a classical perspective that higher doping levels make the potential well both shallower (FIG. 22) and thinner (FIG. 23), and so should improve stability. In FIG. 23, we begin to see something new. For 2D doping profiles (which include both delta doping and multilayer 2D doping), the dependence of the backside potential well width on interface trap density isn't just diminished, it disappears entirely! In the subsequent quantum mechanical treatment, it becomes clear that 2D doping virtually eliminates electron trapping at the back surface due to quantum confinement and quantum transport effects, leading to the important conclusion that multilayer 2D doping creates a surface that is virtually immune from interface traps. There are several associated features of the detector: (1) multilayer doping achieves ultrastable quantum efficiency at all wavelengths accessible to silicon, including UV response despite the fact that UV photons damage the interface and create interface traps; (2) multilayer doping achieves ultrastable response to particles despite the fact that particles also create interface traps; (3) multilayer doping achieves ultrastable response even for a native oxide surface, which is known to have a high interface trap density; and (4) multilayer doping achieves compatibility with a wide variety of AR coatings without the limitations usually associated with a requirement to achieve low interface trap densities. In some cases (notably coatings using materials that can be reactive, such as $HfO_2$ coatings), it is necessary to first grow/deposit a thin chemical passivation layer (such as ALD-grown $Al_2O_3$) in order to prevent chemical reaction of the AR coating with the silicon.

FIG. 22 is a diagram that illustrates three different surface dopant profiles, in which the surface potentials are plotted as functions of the interface trap density ($D_{it}$). Curve 2210 refers to the two-dimensional doping case (denoted Multilayer 2D doping), curve 2220 refers to a three dimensional doping case (denoted MBE 3D doping), and curve 2230 refers to doping by ion implantation. As interface traps accumulate charge, the surface potential decreases and a backside potential well forms. For each dopant profile represented in the diagram, the depth of the backside potential well increases with increasing interface trap density; however, surfaces with higher near-surface dopant densities are less affected by interface traps. FIG. 22 quantifies the relationship between the surface potential and the density of interface traps for three different levels of surface doping. Compared with 3D doping methods (which include ion implantation), 2D doping makes the surface potential far less sensitive to interface traps. This illustrates one aspect of the improved stability afforded by 2D doping methods; however, this only represents stability from a classical perspective. FIG. 23 begins to show that the differences between 2D doping and 3D doping are qualitative as well as quantitative.

FIG. 23 is a diagram that illustrates three different surface dopant profiles, in which the backside potential well widths are plotted as functions of the interface trap density ($D_{it}$). Curve 2310 refers to doping by ion implantation, curve 2320 refers to a three dimensional doping case (denoted MBE 3D doping), and curve 2330 refers to the two-dimensional doping case (denoted Multilayer 2D doping). Whereas the width of the backside potential well increases as the density of interface traps increases for 3D doping methods (curves 2310 and 2320), in the case of 2D doping (curve 2330) the width of the backside potential well is fixed according to the thickness of the 2D doped layer closest to the surface. This is another aspect of the stability afforded by 2D doping, still from the classical perspective. Although 3D doping appears to provide a narrower backside well at low interface trap densities, this is probably not physically accurate because of a well-known effect of deactivation of near-surface dopants by the infusion of hydrogen into the silicon. Moreover, the width of the backside potential well for 2D doping is everywhere less than a nanometer, which means that electrons do not behave classically in this regime. As described in more detail below, the quantum mechanical behavior of electrons provides another dimension to the stability of multilayer 2D doping, and helps to explain the experimental results indicating that the differences between 2D and 3D doping are qualitative as well as quantitative.

Viewed according to the theory of quantum mechanics, 2D dopant profiles formed near the Si—$SiO_2$ interface create quantum wells for both electrons and holes, and the electron and hole states associated with the near-surface potentials are quantized into discrete energy states. Quantization of the valence band results in confinement of holes in states localized to the vicinity of the multilayers, while quantization of the electron states in the backside well results in surface states that are most often not fully confined to the region of the interface. These surface states are analogous to metal-induced gap states, or MIGs, because they represent surface-confined states induced by charge at the interface. Here, such states are referred to as "surface states," or "surface-confined electron states." FIG. 24 through FIG. 27 show surface-confined electron and hole states as probability waves (e.g., the squares of the quantum mechanical wave functions) plotted as functions of depth from the surface. These waves represent the probability that the electrons/holes occupying these states will be found at a given depth from the surface, while the eigenenergies of these states are represented by the pedestal positions with respect to the left axis of the plot. The Si—$SiO_2$ interface is located at zero depth on the horizontal axis, and the Fermi level is located at zero energy on the vertical axis. The plot is oriented in space so that the region to the left of the interface (x<0) is comprised of $SiO_2$, and the region to the right of the interface (x>0) is comprised of doped silicon. The conduction and valence band edges are also plotted as solid lines in the graph, providing a reference for correlating the probability functions with the dopant profile, and also to show the position of the Fermi level in the silicon bandgap. Traps at the Si—$SiO_2$ interface (x=0) are distributed uniformly in the silicon bandgap; for illustrative purposes, the density of interface trap states used in generating these figures is taken to be $1 \times 10^{14}$ $cm^{-2}$ $eV^{-1}$. In FIG. 24 through FIG. 27, the Fermi level is located within the silicon bandgap at the interface, which is typical for silicon surfaces with high interface trap densities. The plots illustrate near-surface band-bending induced by trapping of charge in interface states. Trapped charge repels majority carriers from the surface, resulting in the formation of a near-surface depletion region, and a corresponding surface "potential well" wherein electrons can be trapped. In ion implanted silicon, electrons trapped at the surface behave "classically," with energies near the conduction band edge. However, the surface depletion region is exceptionally small in multilayer doped surfaces, typically 1 nm or less, which is well within the quantum region. Quantum confinement effects increase the ground state energy for electrons; in the limit of high doping/thin surface region, the electron ground state is driven high enough that electrons in these states are no longer confined to the surface. For lower doping levels/thicker surface layers, quantum confinement effects are diminished, and one or more of the electron states are trapped at the surface. This is the significance of FIG. 24 through FIG. 27: first, to illustrate the effects of quantum confinement on electron and hole states in multilayer doped structures, and second, to correlate these effects with physical values of the dopant structure and profile. Later, in FIG. 36 and FIG. 37, we will look at the number of surface states induced by interface traps, as functions of dopant profiles (2D vs. 3D doping) and interface trap density, in order to study the range of doping parameters corresponding to quantum exclusion, defined as the absence of induced surface states for a range of interface trap densities.

Figure 24:
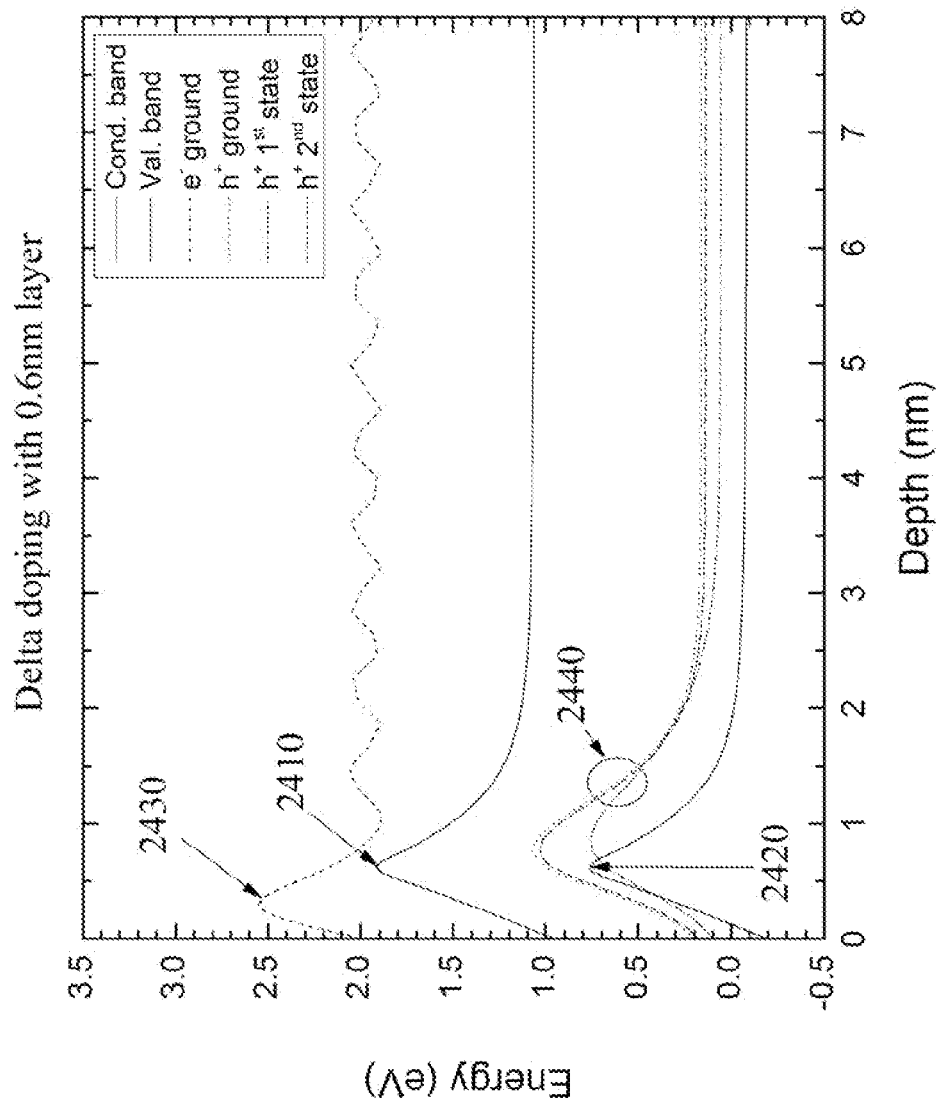
FIG. 24 is a diagram that illustrates a delta doped surface with a 0.6 nm surface layer, in which the quantization of charge carrier states is represented by plotting the conduction and valence band edge profiles (energy vs. distance from a Si—SiO$_2$ interface) and the quantum mechanical wave functions of near-surface electron and hole states (arbitrary units vs. distance from a Si—SiO$_2$ interface, offset by the energy of the state).

FIG. 24 is a diagram that illustrates a delta doped surface with a 0.6 nm surface layer, in which the quantization of charge carrier states is represented by plotting the conduction and valence band edge profiles (energy vs. distance from a Si—$SiO_2$ interface) and the quantum mechanical wave functions of near-surface electron and hole states (arbitrary units vs. distance from a Si—$SiO_2$ interface, offset by the energy of the state). The quantum mechanical behavior of electrons and holes are represented by the spatial extent of the wave functions. The dopant profile used in this calculation is an ideal delta-doping structure, in which dopant atoms are confined to a single monolayer in the silicon crystal, which is located 0.6 nm from the Si—SiO$_2$ interface. Curve 2410 represents the conduction band edge that forms the backside potential well for electrons, and curve 2420 represents the valence band edge that forms a quantum well for holes centered on the position of the peak dopant concentration in the delta-doped layer. With a delta-doped layer this close to the surface, there are no surface-confined electron states. Curve 2430 represents the ground state of surface-confined electrons; however, as shown by the non-zero probability amplitude for electrons to the right of the delta layer, electrons in this surface ground state are not actually confined to the surface. Thus there is a low probability that photogenerated electrons will be trapped at the surface, which corresponds to quantum exclusion. Hole states, collectively labeled 2440, are also shown on the plot to illustrate the location of charge carriers that contribute to electrical conductivity of the surface. Quantum confinement effects in this structure effectively eliminate surface trapping of electrons, resulting in a delta-doped detector with high quantum efficiency. At the same time, a delta-doped layer placed this close to the surface is subject to increased tunnel-assisted dark current. Thus the design of the delta-doped structure involves a tradeoff between quantum efficiency and dark current.

Figure 25:
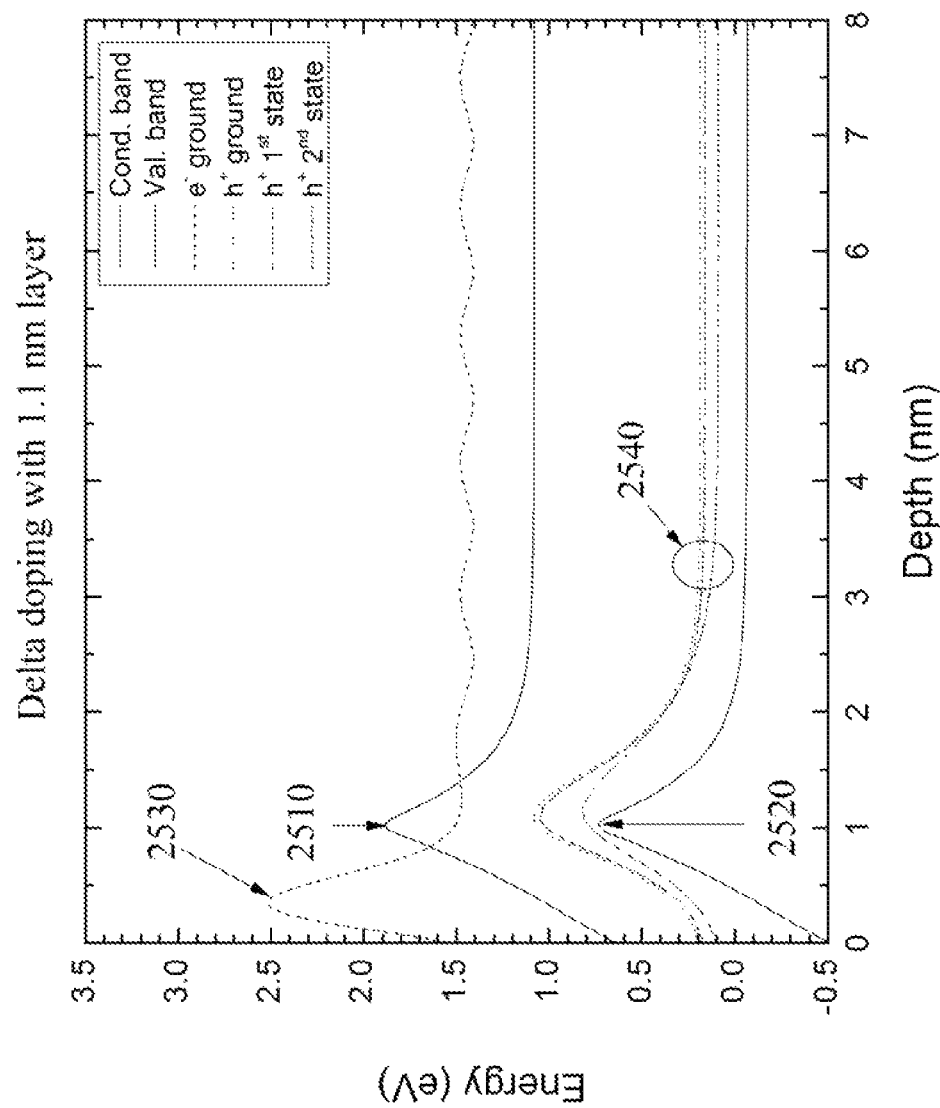
FIG. 25 is a diagram that illustrates a delta doped surface with a 1.1 nm surface layer, in which the quantization of charge carrier states is represented by plotting the conduction and valence band edge profiles (energy vs. distance from a Si—SiO$_2$ interface) and the quantum mechanical wave functions of near-surface electron and hole states (arbitrary units vs. distance from a Si—SiO$_2$ interface, offset by the energy of the state).

FIG. 25 is a graph that illustrates charge carrier profiles as a probability function in arbitrary units and energy vs. distance from a Si—SiO$_2$ interface. In FIG. 25, the dopant profile is essentially the same as in FIG. 24, except that the delta-doped layer is now 1.1 nm from the interface. The surface potential well is now ~1.1 1 nm wide, and the wider potential well is more effective at trapping electrons. At the same time, the delta layer provides a more effective tunnel barrier to isolate surface traps from the bulk and suppress dark current. Thus the choice of the thickness of the surface layer involves a tradeoff between quantum efficiency and surface dark current. The conduction and valence band edges are represented by curves 2510 and 2520. Electron states are shown by curves 2530. Hole states are represented by curves collectively labeled 2540.

Figure 26:
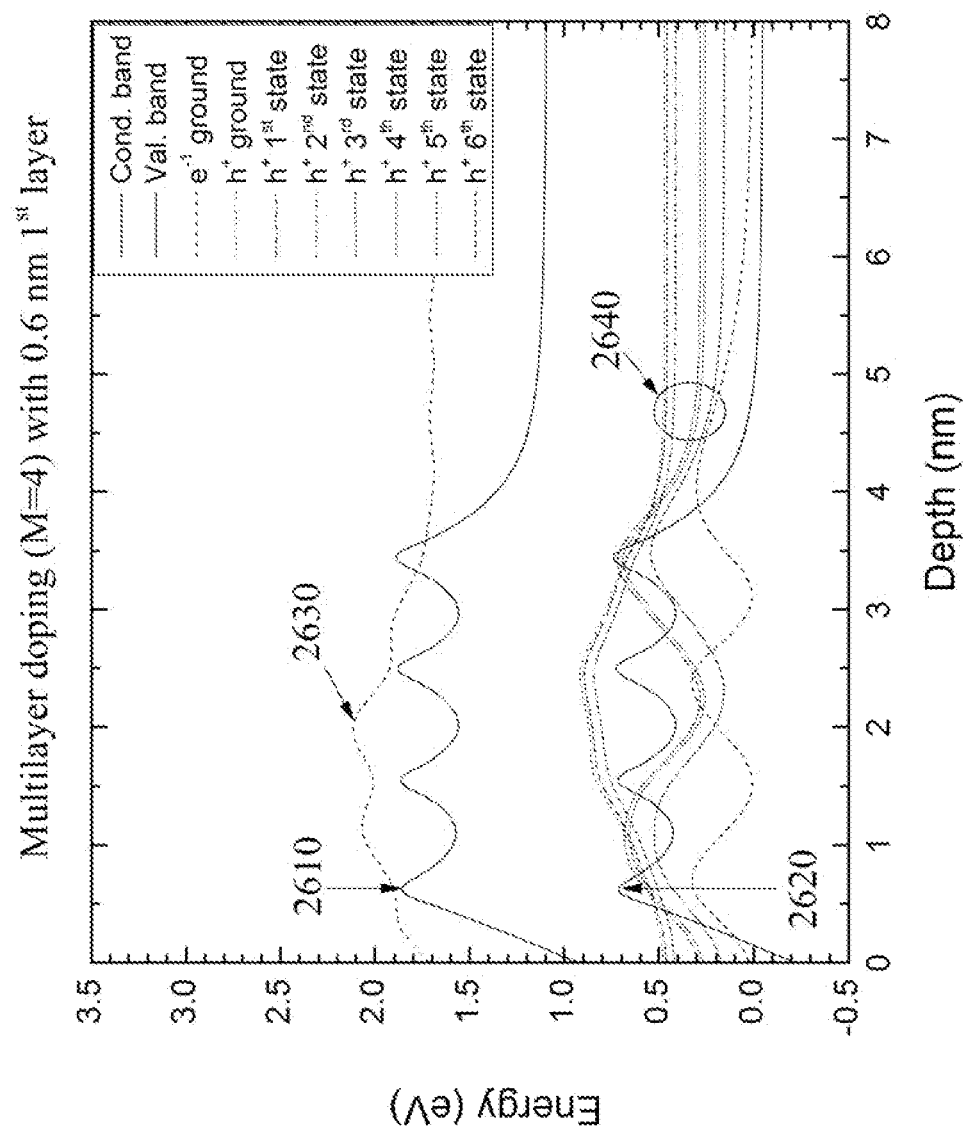
FIG. 26 is a diagram that illustrates a multilayer 2D doped surface (M=4) with a 0.6 nm surface layer, in which the quantization of charge carrier states is represented by plotting the conduction and valence band edge profiles (energy vs. distance from a Si—SiO$_2$ interface) and the quantum mechanical wave functions of near-surface electron and hole states (arbitrary units vs. distance from a Si—SiO$_2$ interface, offset by the energy of the state).

FIG. 26 is a diagram that illustrates a multilayer 2D doped surface (M=4) with a 0.6 nm surface layer, in which the quantization of charge carrier states is represented by plotting the conduction and valence band edge profiles (energy vs. distance from a Si—SiO$_2$ interface) and the quantum mechanical wave functions of near-surface electron and hole states (arbitrary units vs. distance from a Si—SiO$_2$ interface, offset by the energy of the state). The last doped layer is located within 0.6 nm of the surface. As in the single-layer structure of FIG. 24, the electron state 2630 is also nonlocalized (i.e., while there is a resonance at the surface, the electron state is not confined to the surface, so surface trapping is improbable); at the same time, compared to single-layer doping of FIG. 24, multilayer 2D doping creates many additional hole states (collectively labeled 2640 in the plot), corresponding to a significantly higher surface conductivity. In addition to improved surface conductivity, multilayer doping helps to reduce surface dark current by providing a wider tunnel barrier to isolate surface traps from the bulk silicon, while at the same time maintaining high quantum efficiency. Thus multilayer doping solves the problem identified in FIG. 25—with multiple doped layers, there is no longer a need to compromise detector performance with a tradeoff between quantum efficiency and dark current.

Figure 27:
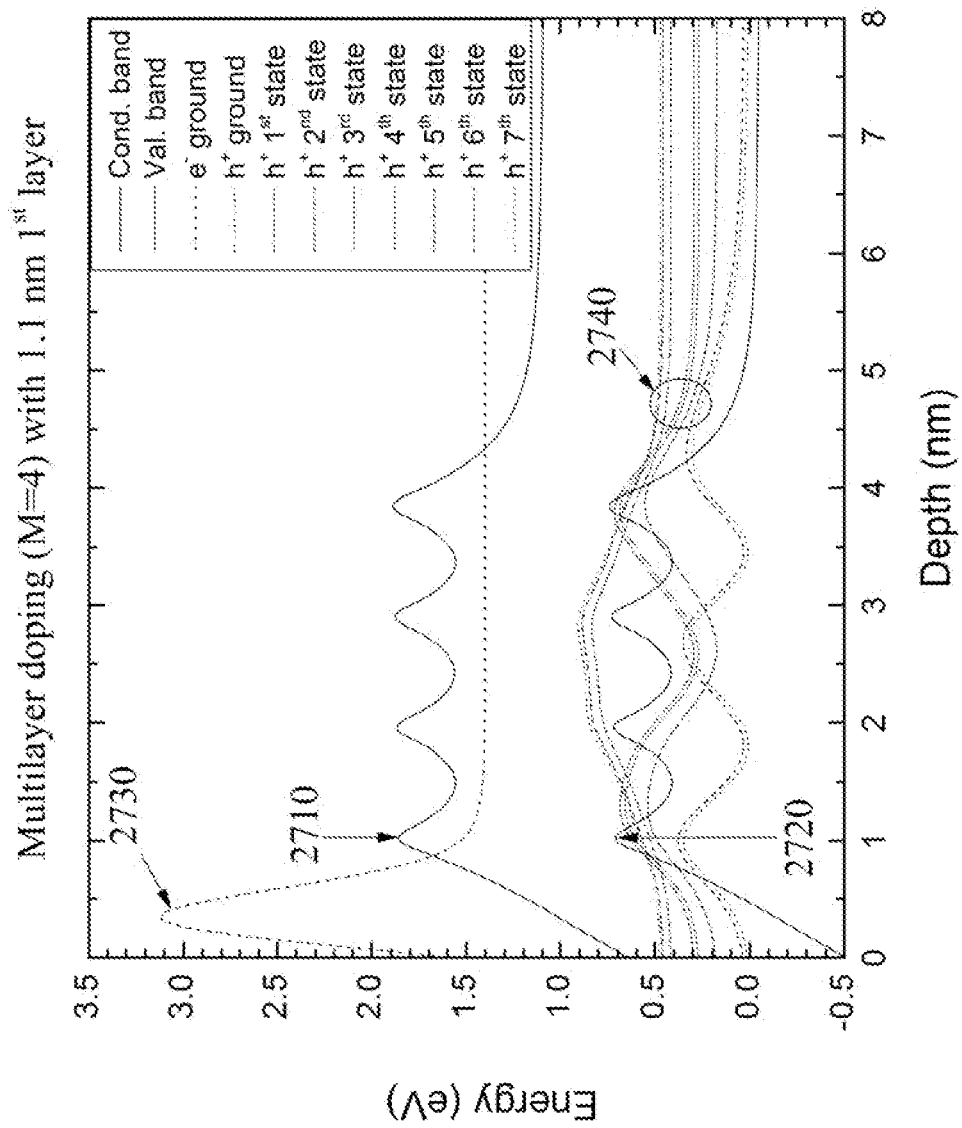
FIG. 27 is a diagram that illustrates a multilayer 2D doped surface (M=4) with a 1.1 nm surface layer, in which the quantization of charge carrier states is represented by plotting the conduction and valence band edge profiles (energy vs. distance from a Si—SiO$_2$ interface) and the quantum mechanical wave functions of near-surface electron and hole states (arbitrary units vs. distance from a Si—SiO$_2$ interface, offset by the energy of the state).

FIG. 27 is a diagram that illustrates a multilayer 2D doped surface (M=4) with a 1.1 nm surface layer, in which the quantization of charge carrier states is represented by plotting the conduction and valence band edge profiles (energy vs. distance from a Si—SiO$_2$ interface) and the quantum mechanical wave functions of near-surface electron and hole states (arbitrary units vs. distance from a Si—SiO$_2$ interface, offset by the energy of the state). FIG. 27 shows electron and hole states for multilayer doping with a four layer doping structure with the last layer located ~1.1 nm from the surface. As described in FIG. 26, there is no compelling reason to move the doped layers deeper into the silicon—in fact, it may result in a loss of efficiency—but it is nevertheless interesting to examine the physics of electron trapping at the interface in terms of the design parameters of multilayer doping. Comparison with FIG. 26 shows two consequences of the greater depth of the last dopant layer. First, as expected and previously described, the surface potential well is deeper and wider with consequently greater ability to trap electrons. The electron ground state 2730 is confined to the interface region, unlike curve 2630 in which the electron ground state is non-localized. Hole states 2740 are also shown. Second, careful study of FIG. 26 and FIG. 27 reveals that an additional hole state has also appeared. In other words, as the multilayers are moved farther from the surface, the density of free holes increases, and therefore the surface conductivity also increases. This effect, which is quite general for all multilayer-doped structures, is well known for near-surface delta-doping, and is a consequence of the interplay of interface traps and surface band structure. However, as we shall see, the conductivity of multilayer-doped surfaces are far less sensitive to interface traps than delta-doped surfaces, which means that with multilayer doping there is no longer a need for a tradeoff between quantum efficiency and surface conductivity.

FIG. 28 through FIG. 31 show the near-surface conduction band structures for four different surface dopant profiles, including ion implantation, MBE 3D doping, delta-doping, and multilayer 2D doping with four layers. Each of the surfaces is represented by conduction band edge profiles calculated assuming three different interface trap densities. Comparison of these profiles highlights the dependencies of the backside potential well width and depth on the interface trap density. Together these figures illustrate the stability of multilayer-doped surfaces against very high interface trap densities. These calculations provide an explanation for the experimentally observed stability of multilayer doped detectors exposed to deep ultraviolet lasers. Such exposure is well known to damage silicon detectors by increasing the density of interface traps.

Figure 28:
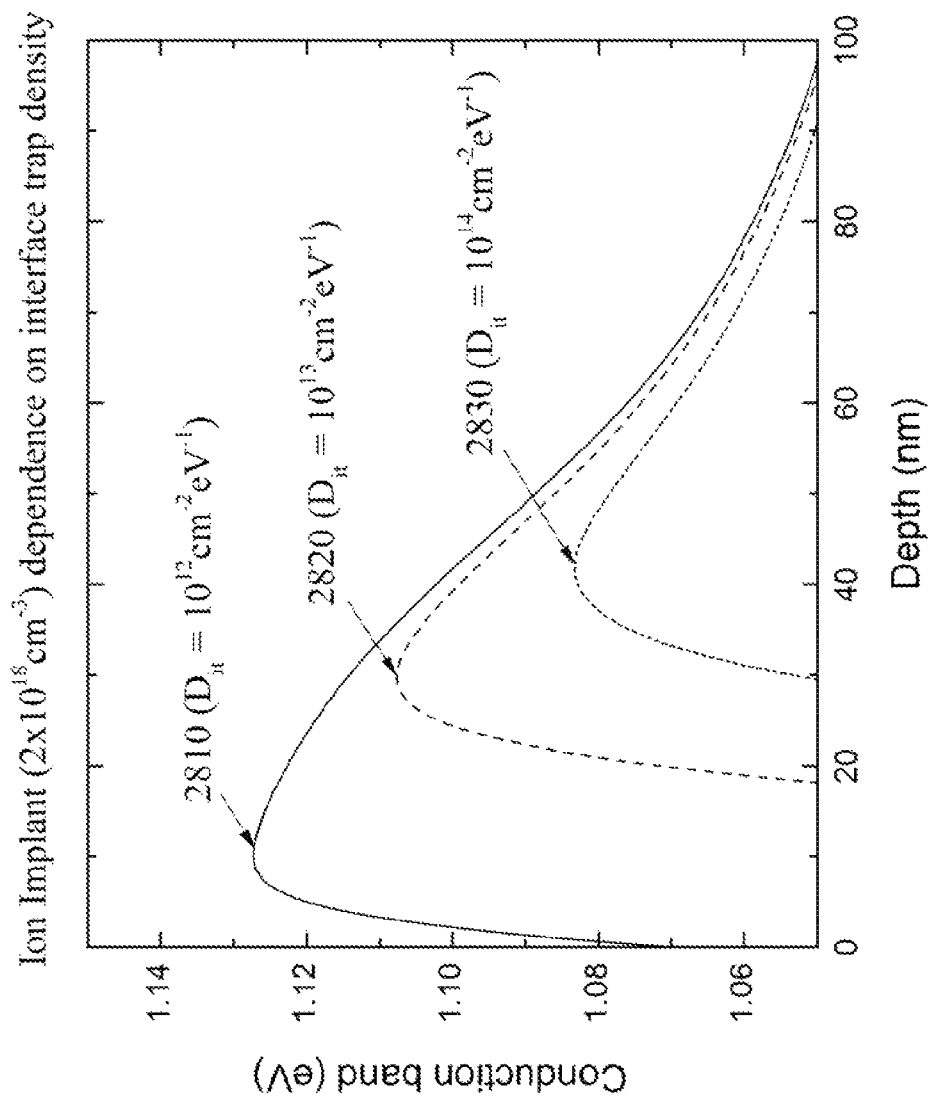
FIG. 28 is a diagram that illustrates an ion implanted surface, in which the effect of interface traps on surface passivation is represented by plotting the conduction band edge profiles (energy vs. depth from the Si—SiO$_2$ interface) for three different interface trap densities (Dit=$10^{12}$, $10^{13}$, and $10^{14}$ cm$^{-2}$ eV$^{-1}$).

FIG. 28 is a diagram that illustrates an ion implanted surface, in which the effect of interface traps on surface passivation is represented by plotting the conduction band edge profiles (energy vs. depth from the Si—SiO$_2$ interface) for three different interface trap densities. Curve 2810 corresponds to Dit=$10^{12}$ cm$^{-2}$ eV$^{-1}$, curve 2820 corresponds to $10^{13}$ cm$^{-2}$ eV$^{-1}$, and curve 2830 corresponds to $10^{14}$ cm$^{-2}$ eV$^{-1}$. In the ion implanted surface, the depth of surface potential well increases dramatically with increasing interface trap density, resulting in low, unstable quantum efficiency for heavily damaged surfaces.

Figure 29:
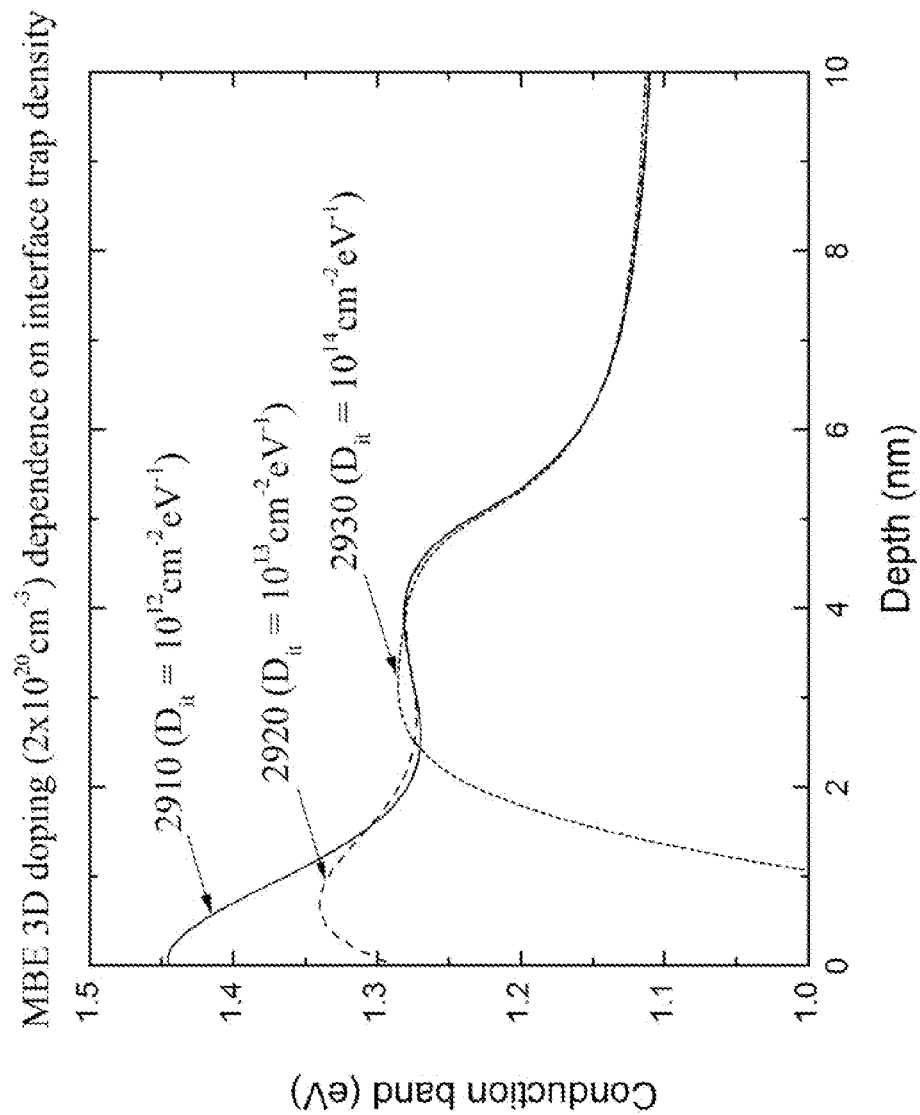
FIG. 29 is a diagram that illustrates an MBE 3D-doped surface, in which the effect of interface traps on surface passivation is represented by plotting the conduction band edge profiles (energy vs. depth from the Si—SiO$_2$ interface) for three different interface trap densities (Dit=$10^{12}$, $10^{13}$, and $10^{14}$ cm$^{-2}$ eV$^{-1}$).

FIG. 29 is a diagram that illustrates an MBE 3D-doped surface, in which the effect of interface traps on surface passivation is represented by plotting the conduction band edge profiles (energy vs. depth from the Si—SiO$_2$ interface) for three different interface trap densities. Curve 2910 corresponds to Dit=$10^{12}$ cm$^{-2}$ eV$^{-1}$, curve 2920 corresponds to $10^{13}$ cm$^{-2}$ eV$^{-1}$, and curve 2930 corresponds to $10^{14}$ cm$^{-2}$ eV$^{-1}$. Compared to the ion implanted surface of FIG. 28, the MBE 3D doped surface is far less affected by interface traps. However, heavily damaged MBE 3D surfaces form a backside potential well that is wide and deep enough to exhibit degradation and instabilities in detector quantum efficiency.

Figure 30:
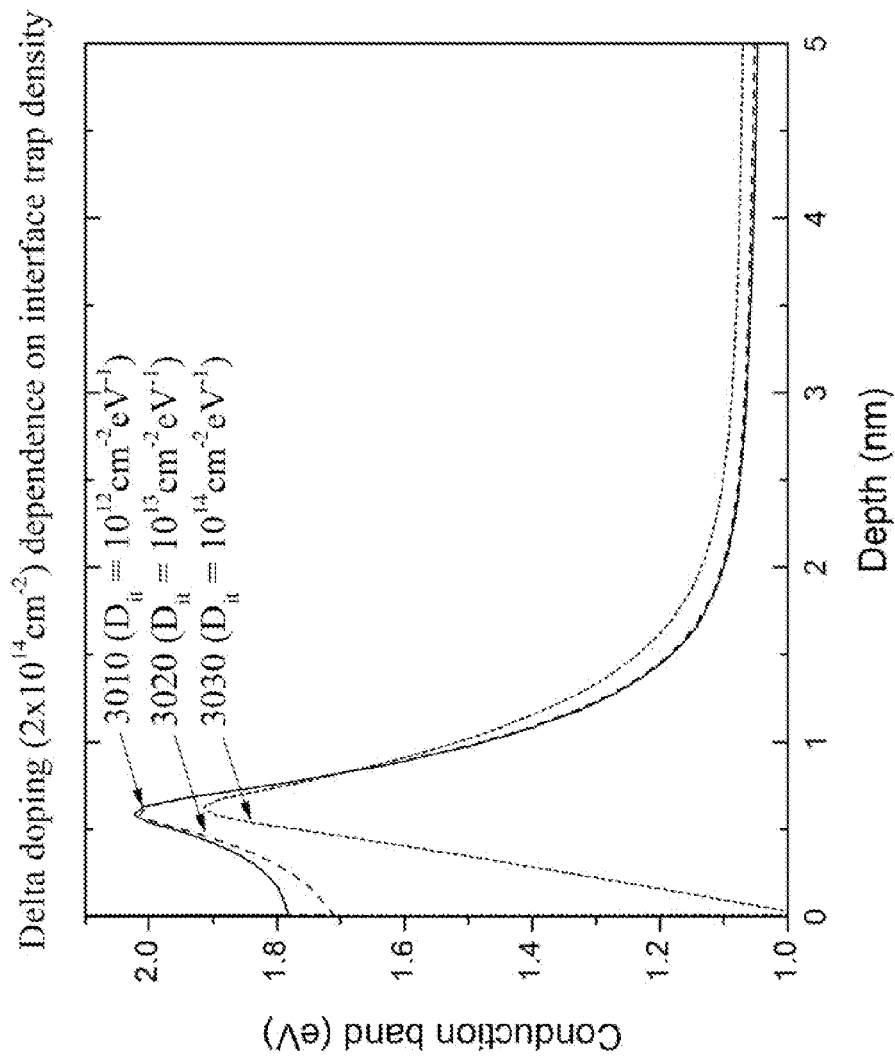
FIG. 30 is a diagram that illustrates a delta doped surface, in which the effect of interface traps on surface passivation is represented by plotting the conduction band edge profiles (energy vs. depth from the Si—SiO$_2$ interface) for three different interface trap densities (Dit=$10^{12}$, $10^{13}$, and $10^{14}$ cm$^{-2}$ eV$^{-1}$).

FIG. 30 is a diagram that illustrates a delta doped surface, in which the effect of interface traps on surface passivation is represented by plotting the conduction band edge profiles (energy vs. depth from the Si—SiO$_2$ interface) for three different interface trap densities. Curve 3010 corresponds to Dit=$10^{12}$ cm$^{-2}$ eV$^{-1}$, curve 3020 corresponds to $10^{13}$ cm$^{-2}$ eV$^{-1}$, and curve 3030 corresponds to $10^{14}$ cm$^{-2}$ eV$^{-1}$. Comparison of these curves with corresponding curves in FIG. 28 and FIG. 29 highlights the exceptional stability of delta-doped surfaces. However, delta-doping is subject to the design tradeoffs discussed above, and, as we shall see, delta doped surfaces are vulnerable to other damage mechanisms (e.g., UV-induced oxidation).

Figure 31:
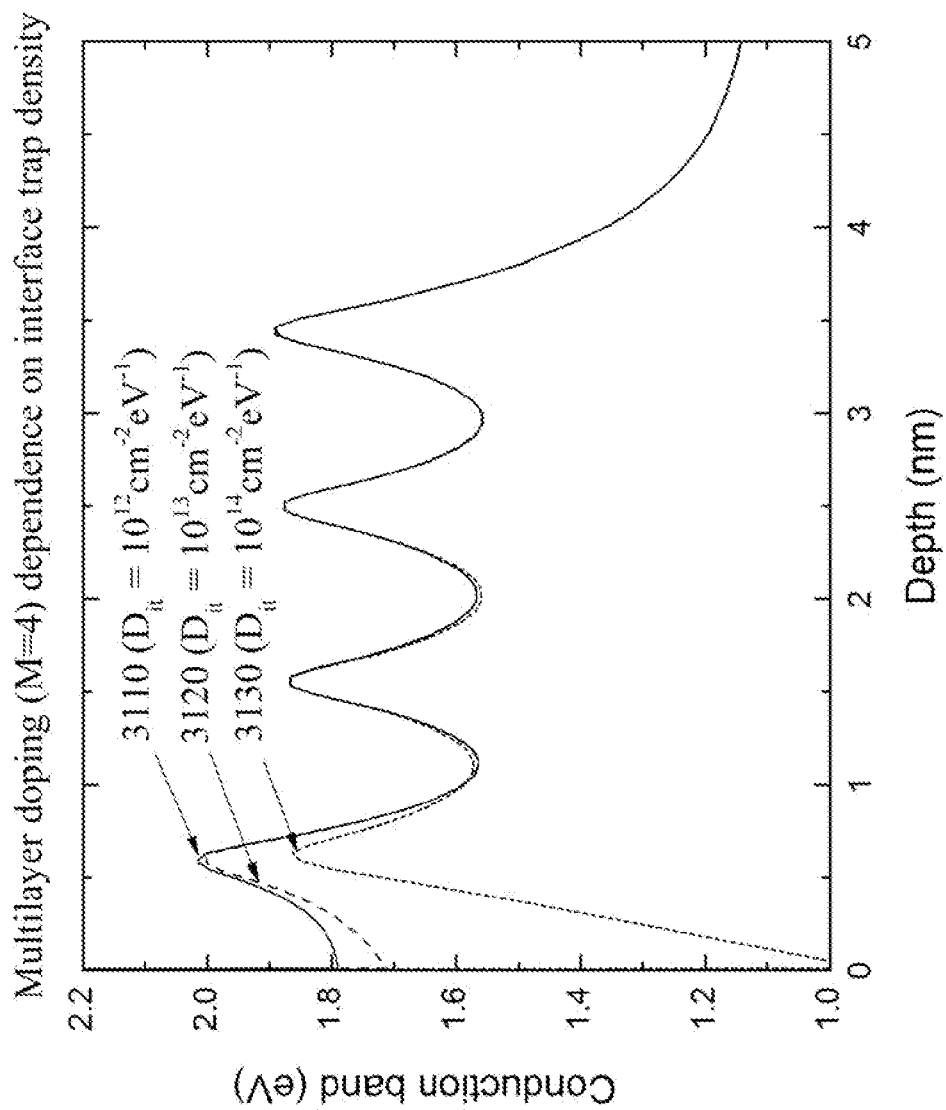
FIG. 31 is diagram that illustrates a multilayer 2D-doped surface (M=4), in which the effect of interface traps on surface passivation is represented by plotting the conduction band edge profiles (energy vs. depth from the Si—SiO$_2$ interface) for three different interface trap densities ($D_{it}$=$10^{12}$, $10^{13}$, and $10^{14}$ cm$^{-2}$ eV$^{-1}$).

FIG. 31 is diagram that illustrates a multilayer 2D-doped surface (M=4), in which the effect of interface traps on surface passivation is represented by plotting the conduction band edge profiles (energy vs. depth from the Si—SiO$_2$ interface) for three different interface trap densities. Curve 3110 corresponds to Dit=$10^{12}$ cm$^{-2}$ eV$^{-1}$, curve 3120 corresponds to $10^{13}$ cm$^{-2}$ eV$^{-1}$ and curve 3130 corresponds to $10^{14}$ cm$^{-2}$ eV$^{-1}$. The curves demonstrate that, as with the delta-doped surface of FIG. 30, multilayer 2D doped surfaces are highly stable against very high densities of interface states. The curves show that interface traps only affect the potential surrounding the layer closest to the surface, with the potential in the remaining layers and the bulk silicon remaining virtually unaffected by interface traps. Because the backside potential well (and hence the potential for electron trapping) is determined primarily by the thickness of the layer nearest the surface, the number and spacing of the remaining layers can be designed for independent optimization of surface dark current and surface conductivity.

Figure 32:
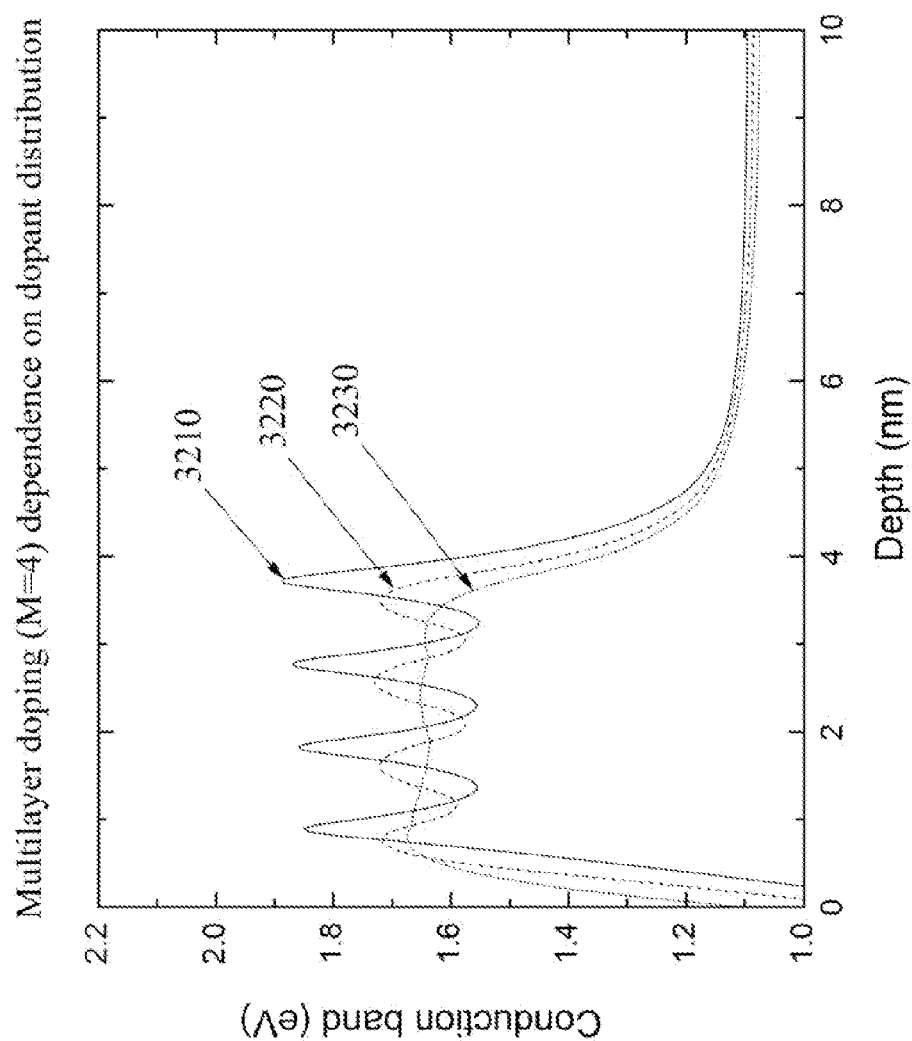
FIG. 32 is a diagram that illustrates multilayer 2D-doped surfaces (M=4), in which the dependence of surface passivation on intralayer dopant distribution is represented by plotting the conduction band edge profiles (energy vs. depth from the Si—SiO$_2$ interface) for three different intralayer dopant distributions.

In most of these calculations, dopants within the multilayer are assumed to comprise doped monolayers that are separated by undoped interlayers (see FIG. 21 and description). As described previously, multilayer doping is based on the growth of multiple delta-doped layers. The surface phase formed during the delta-doping process is stabilized by burying it under a layer of silicon. Therefore, from the perspective of materials and processes, the purpose of the interlayers is to stabilize the 2D phases. In the previous figures and calculations, the effects of dopant distribution on surface passivation have not been considered. In other words, we have to answer the question, what effect does the physical "width" of the delta doped layers have on passivation of surfaces by multilayer doping? FIG. 32 is a diagram that illustrates multilayer 2D-doped surfaces (M=4), in which the dependence of surface passivation on intralayer dopant distribution is represented by plotting the conduction band edge profiles (energy vs. depth from the Si—SiO$_2$ interface) for three different intralayer dopant distributions. Curve 3210 corresponds to the ideal case of monolayer 2D doping. Curve 3220 represents a similar surface, in which each of the four 2D doped layers has a width of 4 monolayers. Curve 3230 represents the extreme case in which the dopants are spread uniformly through each of the successive multilayers. Together these curves illustrate that multilayer 2D doping is insensitive to any intralayer redistribution of dopants. In other words, any conceivable departure of the multilayer 2D dopant profile from the ideal of monolayer 2D-doping has negligible effect on the salient characteristics of the surface that affect surface passivation. Thus the migration of dopants within the layer, occurring either during the growth process or afterward (e.g., possibly induced by heat or ultraviolet illumination), will have negligible effect on detectors passivated by multilayer doping. This further explains the stability of multilayer doping against intense ultraviolet laser illumination, and correlates the properties with physical parameters and dimensions of multilayer doping.

To reiterate, calculations represented in FIG. 32 show that it isn't critical that the interlayers are free of dopant, so long as the dopant remains electrically active. In particular, the intralayer dopant distribution is insignificant compared to the average density of electrically-active dopant atoms. What is important is achieving a high dopant concentration, and multilayer 2D-doping achieves the highest possible dopant concentrations. Methods for measuring dopant profiles, such as secondary ion mass spectrometry (SIMS), cannot resolve the dopant profiles within multilayer doped surfaces. Measurements of surface conductivity and Hall voltages confirm that the dopant is activated to a very high level in multilayer doped surfaces with two, three, and four doped layers.

Figure 33:
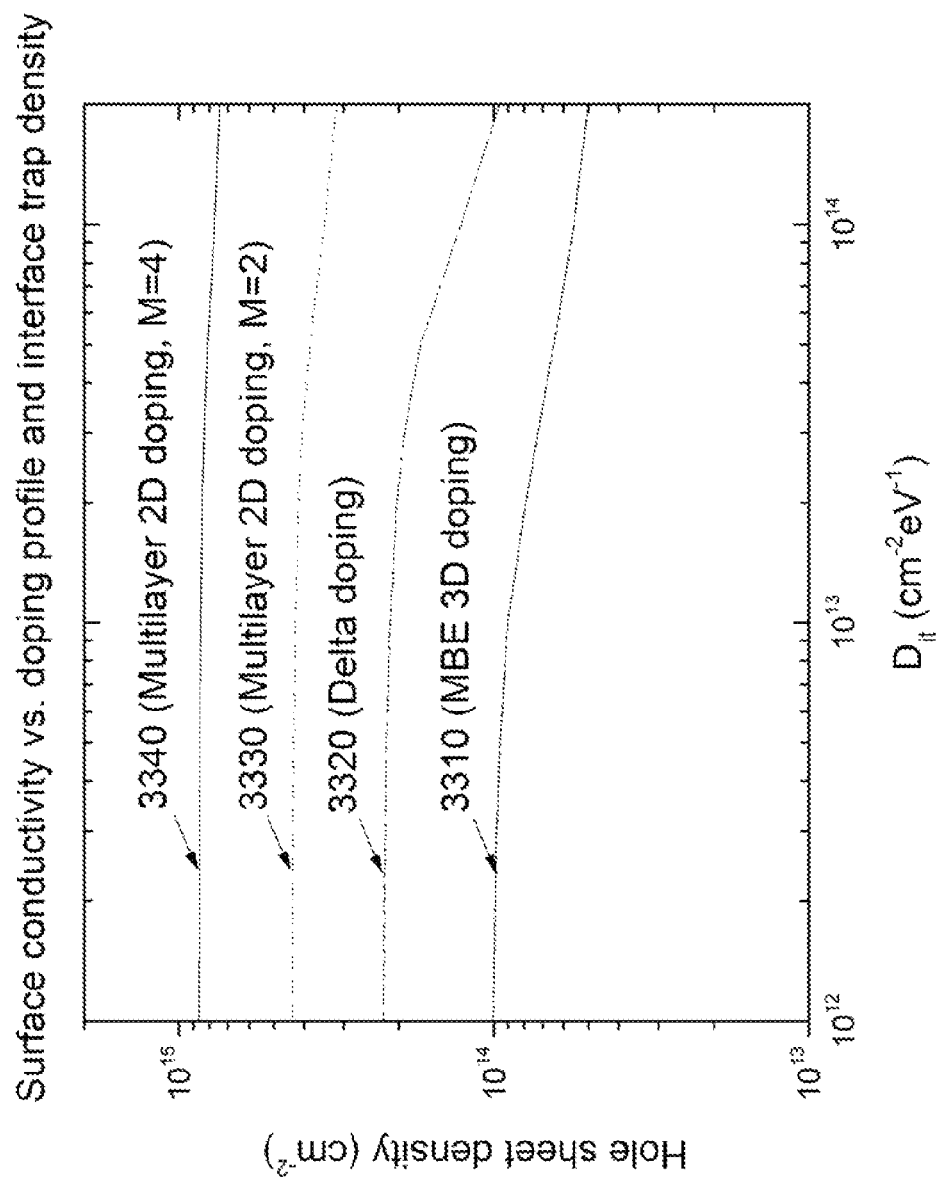
FIG. 33 is a diagram that illustrates four different surface dopant profiles (MBE 3D doping, delta doping, multilayer doping with two layers, and multilayer doping with four layers), in which the surface conductivities are represented as plots of hole sheet density (units cm$^{-2}$) vs. interface state density ($D_{it}$, with units of cm$^{-2}$ eV$^{-1}$).

FIG. 33 is a diagram that illustrates four different surface dopant profiles, in which the surface conductivities are represented as plots of hole sheet density (units cm$^{-2}$) vs. interface state density ($D_{it}$, with units of cm$^{-2}$ eV$^{-1}$). Curve 3310 represents the hole sheet density for MBE 3D doping. Curve 3320 represents the hole sheet density for delta doping. Curve 3330 represent the hole sheet density for multilayer doping with two layers. Curve 3340 represents the hole sheet density for multilayer doping with four layers. Together these curves illustrate two key points about multilayer 2D doping compared to other forms of surface doping. First, multilayer 2D doping achieves hole sheet densities (and hence surface conductivities) that are an order of magnitude higher than state-of-the-art methods of surface doping. Second, the conductivities of multilayer 2D doped surfaces are far less sensitive to interface traps than state-of-the-art methods of surface doping. Comparisons with other figures, as well as experimental results, indicates that the advantages of multilayer 2D doping in surface conductivity and stability are achieved without compromising other aspects of detector performance (e.g., quantum efficiency and dark current).

Figure 34:
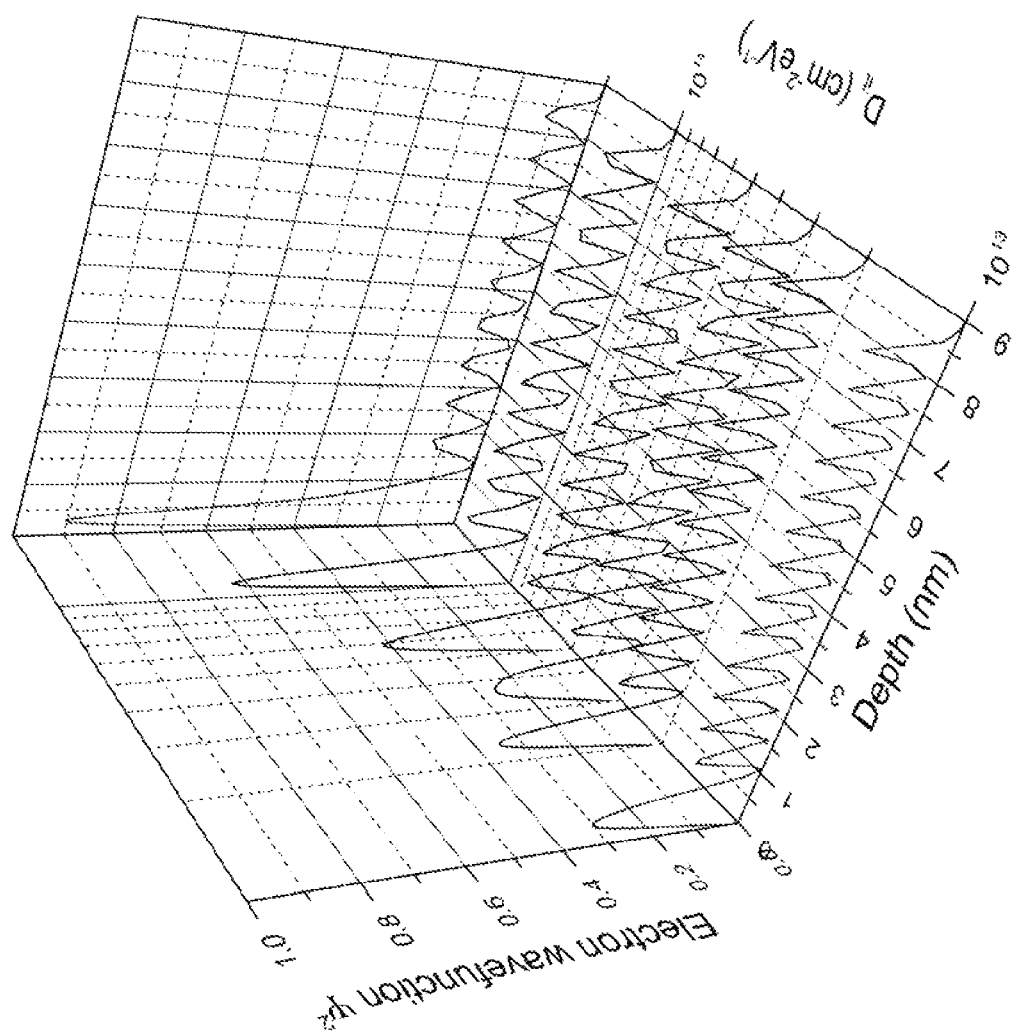
FIG. 34 is a diagram that illustrates a delta-doped surface, in which quantum exclusion is represented by plotting the electron ground state wave functions vs. depth from the Si—SiO$_2$ interface for a multiplicity of interface trap densities.

FIG. 34 is a diagram that illustrates a delta-doped surface, in which quantum exclusion is represented by plotting the electron ground state wave functions vs. depth from the Si—SiO$_2$ interface for a multiplicity of interface trap densities. For these calculations, the delta layer was located 0.6 nm from the surface. Even at the highest interface trap densities, the "surface-trapped" electron ground state penetrates the delta-doped layer. Whereas this underscores the low probability of trapping electrons that is necessary for high quantum efficiency, the penetration of the delta-layer also indicates that thermal generation of electron-hole pairs at the surface can lead to increased surface dark current. With only a single 2D-doped layer as a surface barrier, the need to control the surface dark current places a limit on the proximity of the delta-doped layer to the interface. Thus there is a tradeoff between quantum efficiency and surface dark current for delta-doped layers. This tradeoff has been observed experimentally.

Figure 35:
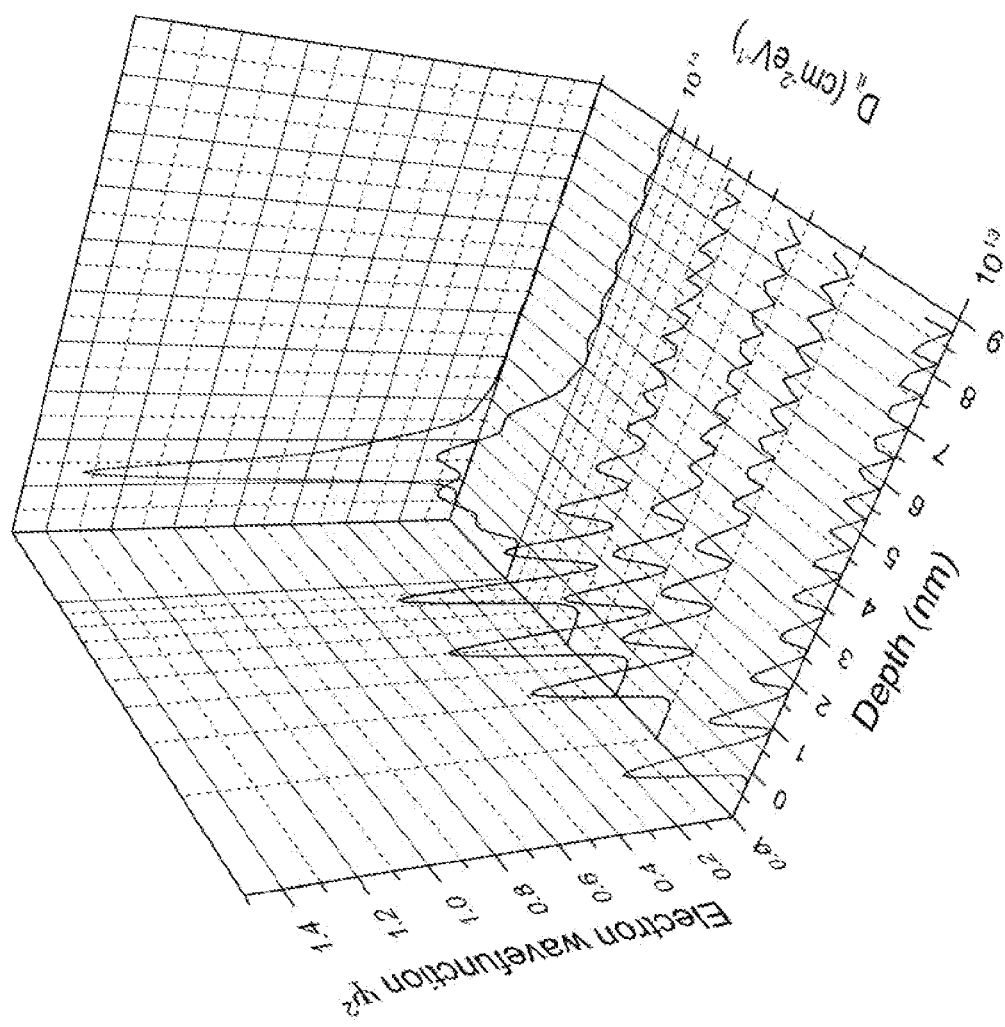
FIG. 35 is a diagram that illustrates a multilayer 2D doped surface (M=4), in which quantum exclusion is represented by plotting the electron ground state wave functions vs. depth from the Si—SiO$_2$ interface for a multiplicity of interface trap densities.

FIG. 35 is a diagram that illustrates a multilayer 2D doped surface (M=4), in which quantum exclusion is represented by plotting the electron ground state wave functions vs. depth from the Si—SiO$_2$ interface for a multiplicity of interface trap densities. For these calculations, the layer closest to the surface has a width of 0.6 nm, allowing for direct comparison with FIG. 34. Compared with delta doping, multilayer 2D doping forms a much wider potential barrier to suppress surface-generated dark current. This is manifested in the plot by the electron wave functions at the highest interface trap density, which is strongly confined to the surface. For multilayer doping, induced surface states only appear when interface trap densities of $2 \times 10^{14}$ cm$^{-2}$ eV$^{-1}$ are assumed (i.e., higher than trap densities physically realized in highly damaged surfaces), so quantum efficiency isn't affected; however, the same result also indicates that defect-related interface traps are electronically isolated from the silicon bulk, thus suppressing thermally-generated surface dark current. Thus multilayer doping avoids the tradeoff between quantum efficiency and dark current.

Figure 36:
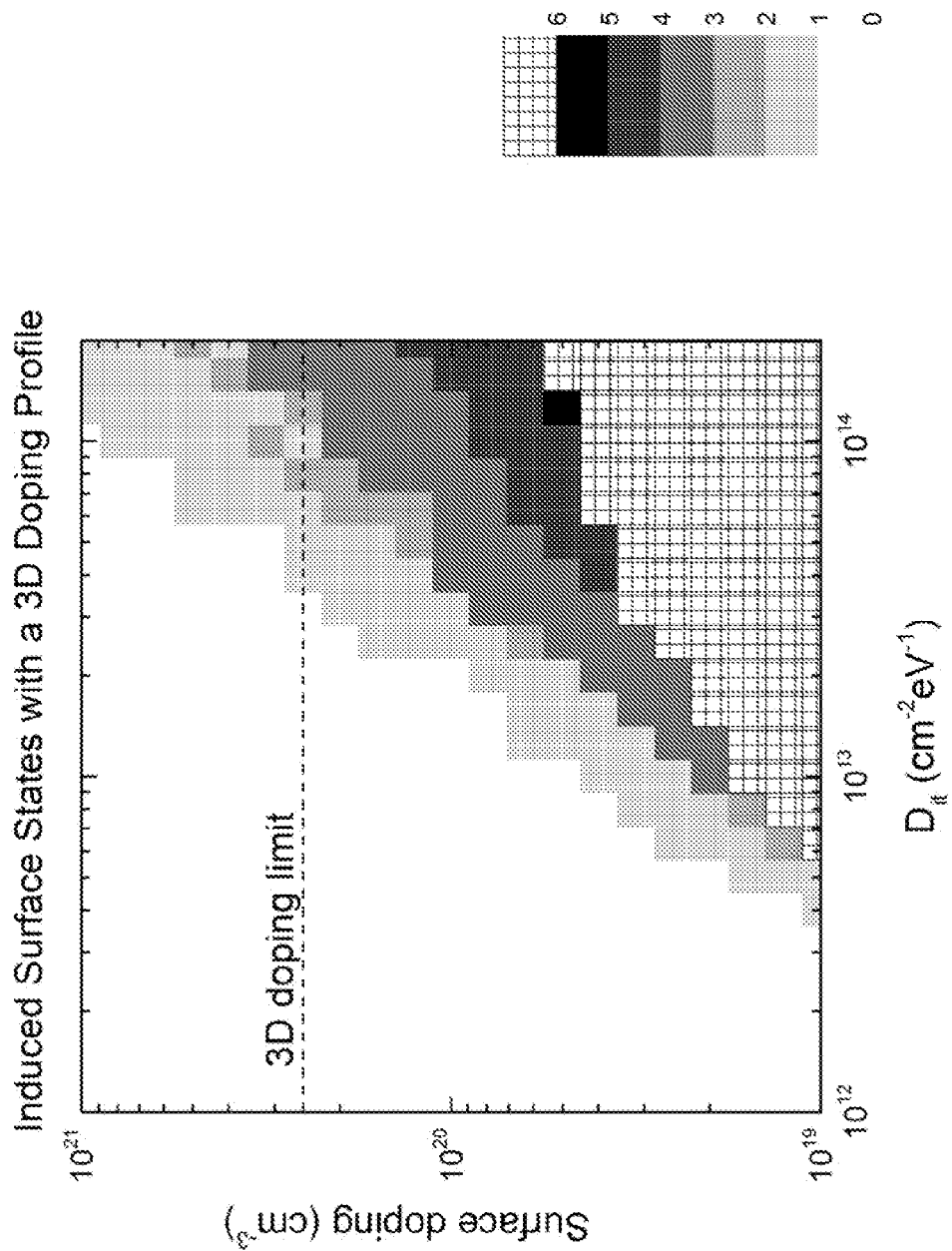
FIG. 36 is a diagram that illustrates surface states in 3D doping by showing the relationship between the number of surface states induced by interface trapped charge (grayscale map) vs. the 3D dopant concentration (vertical axis) and the density of interface traps (horizontal axis).

FIG. 36 is a diagram that illustrates surface states in 3D surface doping by showing the relationship between the number of surface states induced by interface trapped charge (grayscale map) vs. the 3D dopant concentration (vertical axis) and the density of interface traps (horizontal axis). In this context, a surface state is an electron state that is confined to the near-surface region by the backside potential well. Because the depth and width of the backside potential well are functions of the density of interface traps (horizontal axis) and the surface dopant density (vertical axis), a grayscale map of the number of induced surface states shows the highest density of induced surface states at low dopant concentrations and high interface trap densities (i.e., the lower right region of the plot). For 3D doping, the hashed region in the lower right corresponds to a failure of surface passivation, which happens when the surface doping is too low to compensate the interface trapped charge. In contrast, the density of surface trapped states falls to zero in the upper left region of the plot. In this graph, horizontal lines mark a specific 3D dopant distribution, so that along the horizontal line the grayscale map shows the variation of surface trap density as a function of the density of interface traps. A dotted line has been place on the plot to show the 3D doping limit, beyond which material quality (and device performance) deteriorates. The location of this limit indicates that it is not possible to eliminate surface trapping of electrons using 3D doping methods without exceeding the limit beyond which material quality and device performance deteriorate.

Figure 37:
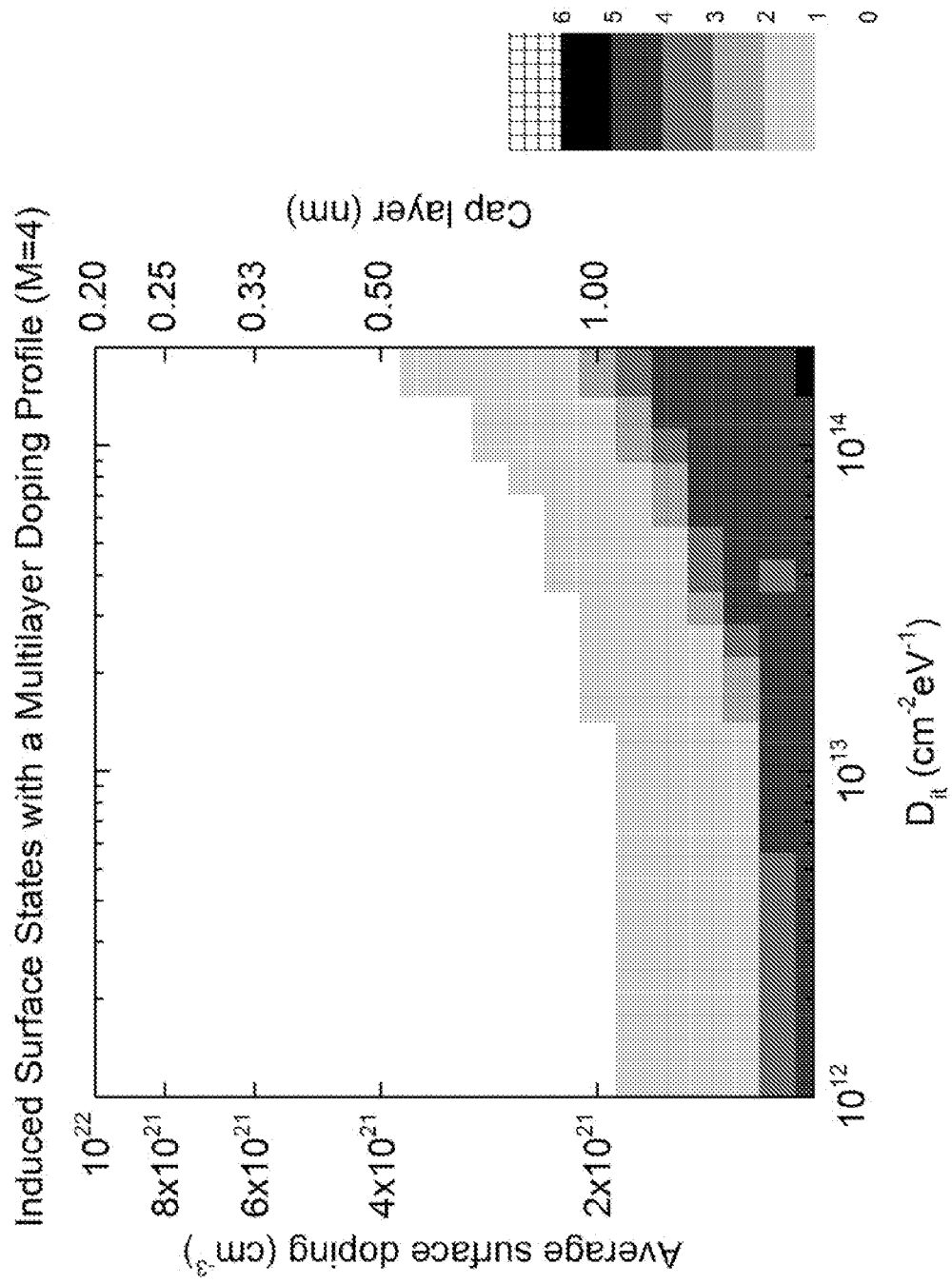
FIG. 37 is a diagram that illustrates surface states in multilayer 2D doping by showing the relationship between the number of surface states induced by interface trapped charge (grayscale map) vs. the cap layer thickness (vertical axis, scale on right), the average surface doping (vertical axis, scale on left), and the density of interface traps (horizontal axis).

FIG. 37 is a diagram that illustrates surface states in multilayer 2D doping by showing the relationship between the number of surface states induced by interface trapped charge (grayscale map) vs. the cap layer thickness (vertical axis, scale on right) and the density of interface traps (horizontal axis). As in FIG. 36, a surface state is an electron state that is confined to the near-surface region by the backside potential well, and the density of induced surface states is shown in the figure as a grayscale map. In order to provide a direct comparison to FIG. 36, the cap layer thickness in multilayer dopant profiles has been converted to an average surface doping, which is shown as the vertical axis scale on the left side of the plot. Thus there is a one-to-one correspondence on the vertical axis between the cap layer thickness (labels on right) and average surface doping (labels on left). For purposes of comparison, the calculations in this plot assumed monolayer doping, which increases the number of induced surface states relative to wider intralayer dopant distributions. As in FIG. 36, the grayscale map of the number of induced surface states shows the highest density of induced surface states at low surface doping concentrations and high interface trap densities (i.e., the lower right region of the plot). In contrast to the 3D doping profiles represented in FIG. 36, the multilayer 2D doping profiles represented in FIG. 37 exhibit a large region in the upper portion of the figure where the density of induced surface states goes to zero over the entire range of interface trap densities on the graph. This is the region of quantum exclusion, where multilayer 2D doping effectively excludes surface trapping of electrons due to quantum confinement effects in ultrathin backside potential wells irrespective of the density of interface traps. Comparison of FIG. 37 with FIG. 36 shows that quantum exclusion cannot be achieved by 3D doping profiles with dopant densities that are below the 3D doping limit, beyond which material quality deteriorates. In particular, calculations indicate that quantum exclusion is achieved in multilayer 2D doping when the cap layer thickness is less than approximately 1 nm. This result is supported experimentally by measurements of ultraviolet quantum efficiency in multilayer doped detectors.

Damage from Electromagnetic Radiation

It is well known in the art that photons are more damaging at higher energies. As a result of the energy-dependence of degradation mechanisms, increasing the photon energy results in damage occurring at lower integrated fluxes. The reason for this is straightforward—different damage mechanisms have different energy thresholds, so that as the photon energy increases, there are more mechanisms for producing damage. One interesting case study in a real-world environment involved the EIT instrument on the SOHO mission, which used CCDs to study several bands in the extreme ultraviolet, which comprises the 10-100 eV energy range. In 1996, scientists studying images from the Extreme UV Imaging Telescope (EIT) discovered burn-in patterns in the CCDs, including a dark grid-shaped pattern caused by long term EUV exposure through a nickel grid proximate to the surface. The damage observed on EIT is typical of silicon detectors exposed to FUV, EUV, and x-ray radiation, in which accumulated damage to the Si—SiO$_2$ interface leads to charging and instabilities of the detector surface. See Defise, J. M., Moses, D., Clette, F., "In-Orbit performance of the EIT instrument on-board SOHO and intercalibration with the EIT CalRoc," Proc. SPIE 3442, Missions to the Sun II, page 126, Nov. 2, 1998.

Damage Mechanisms of Silicon Surfaces Exposed to UV Radiation

At relatively low intensities, UV radiation can damage the Si—SiO$_2$ interface by hot carrier degradation of the oxide and consequent formation of interface traps (Arp05 and Shaw05). Trap formation is cumulative, and potentially irreversible, which is one reason why surface and interface passivation technologies that rely on initially low defect densities, such as thermally grown oxides and hydrogen passivation, may not remain stable under UV illumination.

At higher intensities achievable with pulsed laser sources, a single laser pulse may carry enough energy to cause extremely rapid melting and recrystallization of the surface under nonequilibrium conditions (Lukeš 92, Černý 93 and Scheidt 06). At still higher intensities, laser ablation occurs, and the surface literally boils and explodes, leaving behind a crater (Lu 08).

Nonequilibrium melting/recrystallization of the silicon surface occurs upon exposure to excimer laser pulses when the intensity integrated over a single pulse exceeds a threshold of ~0.4 J/cm$^2$ (Lukeš 92 and Černý 93, measured using time-resolved surface reflectivity). Scheidt et al. (2006) measured a very similar damage threshold using a nonlinear optical technique that is sensitive to interface trap density. According to Scheidt et al., the damage threshold is based on peak intensity, so even if the average intensity over the beam is lower than the threshold, they still observe damage at the center of the beam. The damage threshold corresponds to melting/recrystallization induced by single-pulse exposures; however, multiple subthreshold pulses are also observed to create interfacial traps, with a cumulative effect on the Si—SiO$_2$ interface. Assuming that the local temperature required to melt the surface is the same as the bulk silicon melting temperature, then subthreshold exposures may cause high enough local temperatures to break bonds in the oxide. Silicon-hydrogen bonds can be broken at temperatures in the vicinity of 400-450 C, and $SiO_2$ decomposition at the silicon surface occurs at temperatures≥800 C. Because the decomposition of $SiO_2$ at the interface involves a chemical reaction with silicon at the interface, chemical stability of the interface is also a potential concern.

Relevance to Multilayer 2D Doping

With respect to multilayer 2D doping, there are (at least) three potential damage mechanisms to consider: UV laser-induced modifications of the Si—$SiO_2$ interface, including liberation of hydrogen atoms from interfaces and oxides (Scheidt06); UV-induced oxidation of the interface (Orlowski 88)); and laser-induced surface melting/recrystallization (Lukeš 92, Černý 93).

Hot Carrier Degradation

Hot carrier degradation is well known in the art as a mechanism for damage to integrated circuits. Hot carrier degradation is one of the essential damage mechanisms for detectors exposed to energetic photons and particles. The damage arises from electrons and holes that are generated close to the surface with sufficient excess energy (i.e., energy higher than thermally generated carriers) that they can cross the Si—$SiO_2$ interface and interact with the oxide. These hot carriers catalyze chemical changes to the interfacial region, breaking chemical bonds and creating new interface traps. In particular, the Si—$SiO_2$ interface is populated with a high density of hydrogen atoms, which play an essential role in passivating silicon dangling bonds and oxygen vacancies. Hot carriers catalyze the release of hydrogen, which results in the dangling bonds and/or oxygen vacancies becoming electrically active as interface traps. No method of surface doping can prevent this type of degradation, including multilayer 2D doping. However, multilayer 2D doping uniquely makes the detector performance immune from radiation-induced changes in the interface trap density. In addition to its application to detectors, multilayer 2D doping can be used to make silicon solar cells that are effectively immune from damage caused by exposure to UV light. In terrestrial applications, the UV spectrum is limited to wavelengths longer than about 320 nm by absorption in the atmosphere. In space, solar cells are exposed to deep and far ultraviolet light, which is far more damaging. Multilayer 2D doping can thus prevent UV-induced hot carrier degradation of silicon solar cells on satellites and space missions, where this type of degradation is more severe and there is little or no opportunity to replace damaged solar panels.

One of the unique properties of multilayer 2D doped surfaces is their relatively immunity to interface traps. Unlike other surface passivation technologies, multilayer doped detectors exhibit excellent stability when only a native oxide is present on the surface; moreover, the sharply-peaked electronic potential at the delta-layer serves as a tunnel barrier to suppress the injection of surface-generated dark current into the bulk silicon comprising the minority carrier collection volume of the detector. Consequently, for low illumination intensities, UV-induced trap formation is not expected to be a significant threat to the stability of the multilayer 2D doped surface. This is in sharp contrast with chemisorption charging, which is vulnerable to permanent band-flattening due to accumulation of interface and oxide trapped charge, enhanced surface-generated dark current due to trap formation at the Si—$SiO_2$ interface, and hot-carrier induced degradation of chemisorbed charge.

Under high photon fluxes, dynamic charging of the oxide may take place, as the surface is flooded with hot electrons and hot holes; in particular, different lifetimes of electron and hole traps in the oxide contribute to dynamic charging effects. These dynamic effects depend on materials and coating methods, including possible enhancement in thicker coatings due to the larger volumes involved. High quality, low defect oxides do not ensure long-term stability, as UV-induced damage is known to cause the formation of traps. Therefore the stability of passivation layers and antireflection coatings must be tested and optimized as a function of thickness for each material used. Because of the high, localized density of dopants in multilayer 2D doping, the multilayer 2D doped surface is buffered against dynamic charging of oxide and interface traps. Nevertheless, using the atomic scale control of the surface that is achievable with multilayer 2D doping, both the stability and the interfacial band offsets are amenable to engineered improvements by the design of the multilayer 2D doped layer structure, and by the incorporation of nanometer-scale interlayers at the interface as described below.

UV-Induced Chemical Reactions at the Interface

In our prior work on delta-doped, n-channel CCDs and CMOS imaging arrays, the delta-doped surface comprises a sheet of dopant atoms typically located only 1-2 nm below the Si—$SiO_2$ interface. At these length scales and for high-intensity pulsed laser illumination, UV-induced chemical reactions are a potential concern, depending on the laser intensity and the ambient environment. UV laser irradiation is known to cause oxidation of the silicon surface, especially at photon energies sufficient to cause photodissociation of oxygen (Orlowski 88). Orlowski et al. compared irradiation at 193 nm and 248 nm, and showed that photodissociation of oxygen at the shorter wavelengths dramatically increases the oxidation rate. The highest laser intensities in this study reached the melting/recrystallization threshold, providing an interesting comparison of these results with those of Lukeš et al. and Scheidt et al.

In addition to UV-induced oxidation, the exposure of silicon surfaces to UV radiation is known to liberate atomic hydrogen. Atomic hydrogen is known to be capable of diffusing through silicon, and is also known to deactivate dopants near the surface by chemically binding to dopant atoms embedded in the silicon lattice.

Chemical stability of multilayer 2D doped surfaces can be improved by growth or deposition of a chemical passivation layer. For example, a 2 nm layer of $Al_2O_3$ grown by atomic layer deposition provides improved chemical passivation of a multilayer 2D doped surface compared to the same surface without said $Al_2O_3$ layer.

Relative Immunity from Interface Traps

Immunity of multilayer doped devices from interface traps is manifest in two important aspects of this invention. First, multilayer doped devices are uniquely insensitive to high intensity DUV laser irradiation. It is believed that multilayer doping will also be demonstrated to provide protection from other forms of ionizing radiation as well (e.g., far ultraviolet, extreme ultraviolet, x-rays, and particles), although only durability against DUV lasers has been tested so far. Second, immunity from interface trap density creates a great deal of freedom in designing and depositing AR coatings. The method for AR coating should not disrupt the surface (and so damage the doping profile itself), but beyond that it isn't important to have a low interface trap density. It is believed that this property will prove to be important. As of the present time, no other fabrication technique has been successful in developing stable AR-coated devices in this spectral range.

A new result is that not only the quantum efficiency but also the dark current was unaffected by DUV laser illumination. Multilayer doping, unlike delta-doping, creates a barrier against tunnel-assisted dark current so it is expected that, all things being equal, multilayer doping will enable reduced surface dark current compared to delta-doping. Because of this enhanced tunnel barrier, multilayer doping allows the first delta-layer to be closer to the surface, for two reasons. First, if any part of the delta-doped layer nearest the surface is lost to oxidation, the next layer remains as a "backup". Second, a single delta-doped layer is vulnerable to increased surface dark current due to tunneling if the delta layer is too close to the surface. Multilayer doping doesn't have this limitation because the added layers provide a wide enough barrier to prevent tunnel-assisted dark current.

Multilayer doping provides much higher electrical conductivity than delta-doping, which is important in imaging devices to prevent noise and "ground bounce." Multilayer doping has been applied to fully-depleted photodiodes to be used for particle detection. The enhanced surface conductivity provided by multilayer doping is important for these devices. Surface conductivity is important for many silicon devices, including especially large-format devices in which the distance from the center of the imaging array to the edges of the device can be several centimeters.

Multilayer doped detectors achieve nearly 100% internal quantum efficiency, as does delta-doping, which suggests that multilayer doping does not result in increased recombination despite the increase in overall thickness of the doped region near the surface. A possible explanation for this is based on a quantum transport argument, wherein hot electrons have many more states available for transition to lower energy bulk states than to surface traps; because quantum (or ballistic) transport takes place on sub-picosecond timescales, minority carriers do not interact with the surface for a sufficient length of time to suffer measurable losses due to recombination.

Calculations of the surface band structure provide an explanation of the experimental result showing highly stable efficiency and dark current of multilayer doped devices exposed to high intensity, pulsed laser radiation in the deep and far ultraviolet. The explanation is that the calculated surface band structure of a multilayer-doped surface is extremely stable over a very wide range of interface trap densities. The calculations show band structures and other properties as a function of interface trap density. The failures of ion-implanted and chemisorption-charged devices to survive DUV laser illumination can be understood in terms of DUV-induced changes to the interface trap density, although in the case of chemisorption-charging there may be additional damage mechanisms.

Surface Passivation by Quantum Exclusion Using Multiple Layers

Three aspects of multilayer doping combine to achieve effective surface passivation. First, the doped layer closest to the surface has the greatest effect on reducing surface recombination. Dopants in this layer interact with interface traps to form a surface dipole layer, thus creating a potential well for electrons. It is advantageous that the amount of dopant in this layer be as high as possible, and located as close as possible to the interface, in order that trapping be eliminated due to quantum confinement effects. As shown in FIG. 32, if the dopant atoms were to "spread out" within the doped layers, in effect making the delta-functions broader (which may possibly happen during the growth process), it does not have a large effect on device performance, so long as the dopants remain electrically active, i.e., that they aren't lost as active dopants due to clustering, surface segregation, or oxidation. FIG. 37 shows that multilayer doping achieves quantum confinement over a large range of multilayer doping parameters. It appears that the near-surface dopant concentration averaged over the volume between the oxide and the first doped layer is an important parameter. A second aspect of multilayer doping necessary to achieve effective surface passivation is providing an effective tunnel barrier to isolate surface traps from the detector. This is achieved by incorporating multiple doped layers, which provides control over both the height and the width of the tunnel barrier. A third aspect of multilayer doping necessary to achieve effective surface passivation is providing high surface conductivity. This is also achieved by incorporating multiple doped layers. High surface conductivity is important to eliminate transient effects (e.g., caused by the arrival of a laser pulse on one part of the surface), as the excess holes must be transported through the surface layer in order to avoid transient changes in quantum efficiency or noise at the detector output (e.g., ground bounce).

Experimental Demonstration of DUV Immunity

Lifetime tests of multilayer doped CMOS imaging arrays were conducted using direct exposure to pulsed excimer lasers at two different wavelengths, 263 nm and 193 nm.

Figure 38:
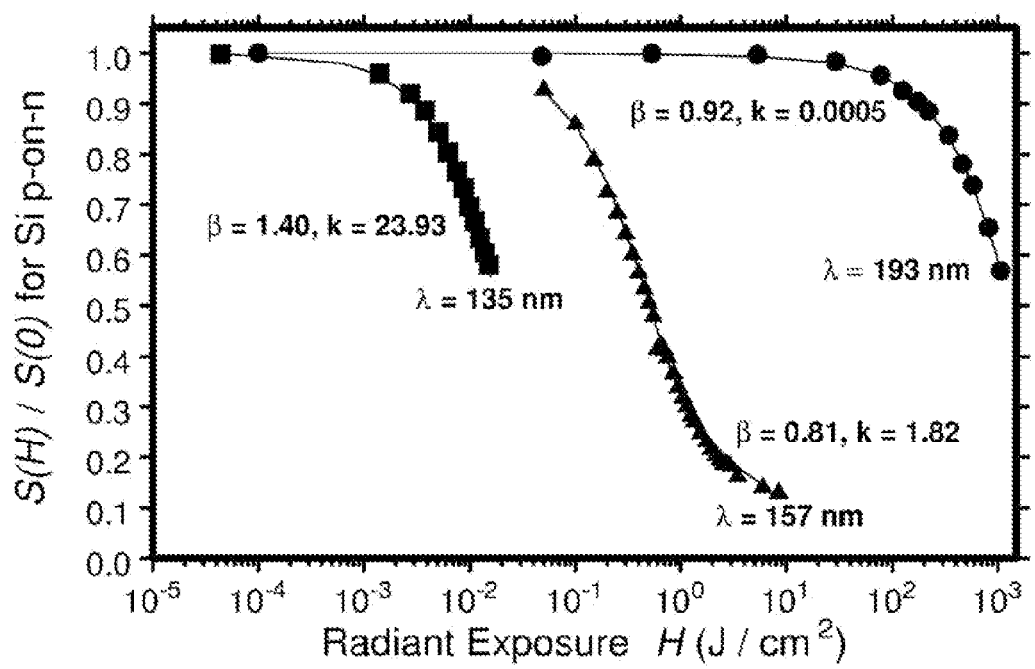
FIG. 38 is a graph from a prior art report on the degradation of silicon p-on-n devices subjected to increasing doses of UV radiation at the wavelengths of 135 nm, 157 nm and 193 nm.

FIG. 38 is a graph from a prior art report on the degradation of silicon p-on-n devices subjected to increasing doses of UV radiation at the wavelengths of 135 nm, 157 nm and 193 nm (U. Arp et al., Journal of Electron Spectroscopy and Related Phenomena, 144-147 (2005) pp. 1039-1042, available online 25 Feb. 2005).

Figure 39:
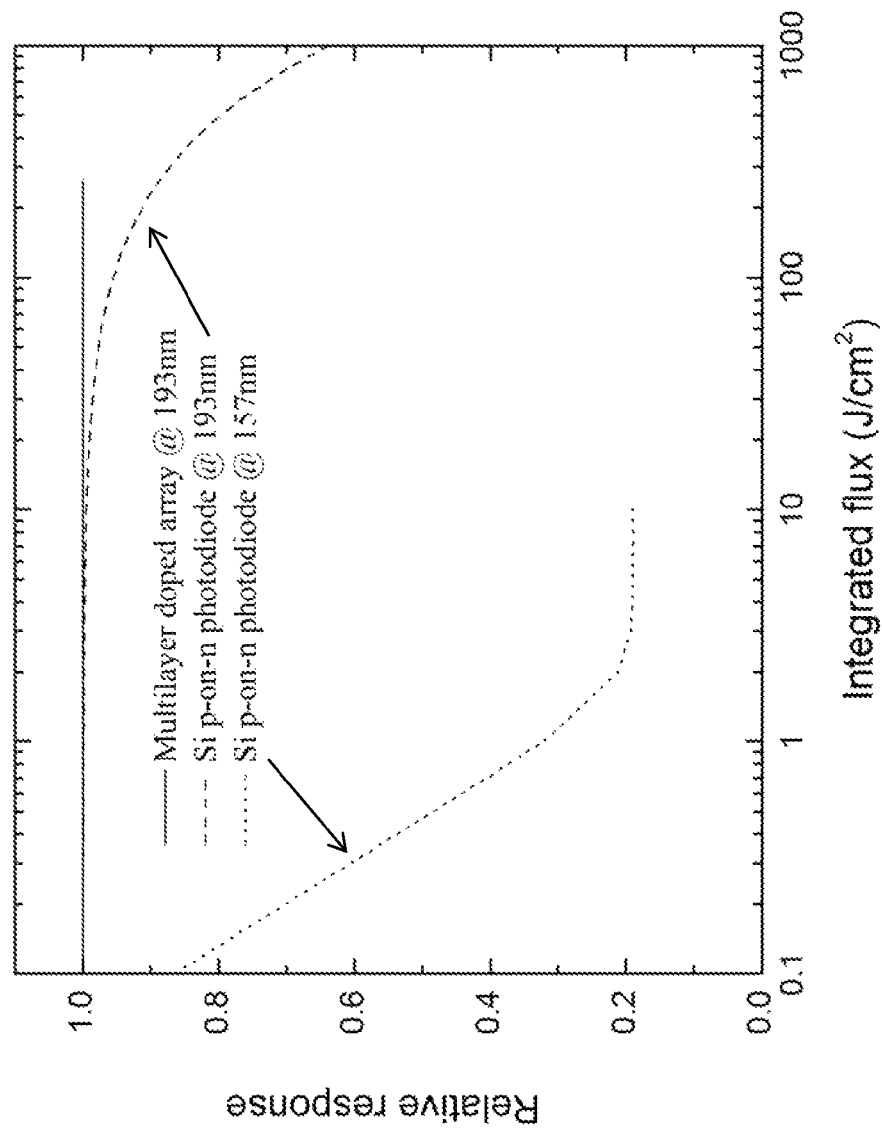
FIG. 39 is a graph showing the degradation of a silicon p-on-n device and the degradation immunity of a multilayer-doped silicon device when subjected to 193 nm UV illumination up to 260 J/cm$^2$.

FIG. 39 is a graph showing the degradation of a silicon p-on-n device and the degradation immunity of a multilayer-doped silicon device when subjected to 193 nm UV illumination up to 260 $J/cm^2$, which represents the integrated dose as of this writing, and does not represent the limits of this technology because no damage has been observed in measurements of a multilayer-doped device with two doped layers and a native silicon oxide surface (i.e., without an AR coating or chemical passivation layer).

At 263 nm, absorption in the oxide is negligible, and damage occurs primarily through hot carrier degradation of the interface. Multilayer doped devices with two doped layers exhibited no measurable degradation after exposure to 263 nm laser radiation at the maximum tested integrated flux, 3.1 $kJ/cm^2$. The devices were AR-coated, so that the measured absolute quantum efficiency at 263 nm was 64%. No other existing device was able to achieve anything close to this stability. Other detectors processed using state-of-the-art surface passivation technologies failed at significantly lower integrated fluxes.

At 193 nm, a fraction of the photons are absorbed in the oxide, potentially producing damage by directly breaking bonds in the oxide, in addition to damage caused indirectly by exposure of the interface to hot carriers generated by absorption in the silicon detector. At this point in the lifetime tests, the maximum integrated flux at 193 nm was 160 $J/cm^2$. Multilayer doped devices with an AR coating exhibited minimal degradation (~3-5% reduction in QE, no measurable change in dark current). Multilayer doped devices without an AR coating exhibited no measurable degradation up to the maximum tested exposure. The difference between coated and uncoated devices may have been degradation of the AR coating, caused by the absorption of 193 nm photons in the coating itself.

It is believed that multilayer 2D doped devices will also show improved stability (or reduced degradation) when subjected to increasing doses of UV radiation at the wavelengths of 135 nm, 157 nm, and other wavelengths.

THEORETICAL DISCUSSION

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A silicon device, comprising:
   a silicon wafer bounded by a first surface and a second surface opposite said first surface, said silicon wafer having a device fabricated on one of said first surface and said second surface;
   said silicon wafer having a doping profile situated adjacent at least one of said first surface and said second surface, said doping profile having at least two doped layers, each of said at least two doped layers having a thickness of less than 4 nm, each of said at least two doped layers having an electrically active dopant sheet density at least $10^{14}$ cm$^{-2}$;
   said silicon wafer having at least one of said first surface and said second surface electronically passivated irrespective of a density of defects present on said respective one of first surface and said second surface.

2. The silicon device of claim 1, wherein said electronically passivated surface is configured to exhibit less degradation as a result of exposure to electromagnetic radiation having a wavelength shorter than visible electromagnetic radiation than is exhibited by an equivalent device provided in a wafer lacking said doping profile having at least two doped layers as a result of exposure to the same electromagnetic radiation.

3. The silicon device of claim 2, wherein said electromagnetic radiation having a wavelength shorter than visible electromagnetic radiation has a wavelength of 263 nm.

4. The silicon device of claim 2, wherein said electromagnetic radiation having a wavelength shorter than visible electromagnetic radiation has a wavelength of less than 263 nm.

5. The silicon device of claim 2, wherein said electromagnetic radiation having a wavelength shorter than visible electromagnetic radiation has a wavelength of 193 nm.

6. The silicon device of claim 2, wherein said electromagnetic radiation having a wavelength shorter than visible electromagnetic radiation has a wavelength of less than 193 nm.

7. The silicon device of claim 1, wherein at least one of said at least two doped layers has a thickness of less than 1 nm.

8. The silicon device of claim 1, wherein said at least two doped layers comprise four doped layers.

9. The silicon device of claim 8, wherein successive ones of said four doped layers have equal thicknesses.

10. The silicon device of claim 8, wherein successive ones of said four doped layers have unequal thicknesses.

11. The silicon device of claim 1, wherein a dopant gradient of at least one decade per nm exists between one of said at least two doped layers and an adjacent layer of silicon.

12. The silicon device of claim 1, wherein said at least two doped layers are configured to have higher surface conductivity than an equivalent device provided in a wafer lacking said doping profile having at least two doped layers.

13. The silicon device of claim 1, further comprising a chemical passivation layer situated on said surface having said doping profile adjacent thereto, said chemical passivation layer configured to prevent degradation of at least one of the at least two doped layers of said doping profile.

14. The silicon device of claim 13, wherein said chemical passivation layer comprises an $Al_2O_3$ layer.

15. The silicon device of claim 1, further comprising an antireflection coating.

* * * * *